United States Patent
Eppolito

(10) Patent No.: US 10,951,188 B2
(45) Date of Patent: *Mar. 16, 2021

(54) OPTIMIZED VOLUME ADJUSTMENT

(71) Applicant: Apple Inc., Cupertino, CA (US)

(72) Inventor: Aaron M. Eppolito, Santa Cruz, CA (US)

(73) Assignee: Apple Inc., Cupertino, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/442,107

(22) Filed: Jun. 14, 2019

(65) Prior Publication Data

US 2019/0363689 A1    Nov. 28, 2019

Related U.S. Application Data

(60) Continuation of application No. 15/231,603, filed on Aug. 8, 2016, now Pat. No. 10,367,465, which is a division of application No. 13/226,244, filed on Sep. 6, 2011, now Pat. No. 9,423,944.

(51) Int. Cl.
| | |
|---|---|
| *G06F 3/0484* | (2013.01) |
| *H03G 3/02* | (2006.01) |
| *G06F 3/01* | (2006.01) |
| *H04R 29/00* | (2006.01) |

(52) U.S. Cl.
CPC ............. *H03G 3/02* (2013.01); *G06F 3/01* (2013.01); *G06F 3/04847* (2013.01); *H04R 29/008* (2013.01); *H04R 2430/01* (2013.01)

(58) Field of Classification Search
CPC combination set(s) only.
See application file for complete search history.

(56) References Cited

U.S. PATENT DOCUMENTS

| | | | |
|---|---|---|---|
| 5,204,969 A | 4/1993 | Capps et al. | |
| 5,524,060 A * | 6/1996 | Silfvast | H03G 3/00 381/104 |
| 6,154,601 A | 11/2000 | Yaegashi et al. | |
| 6,320,577 B1 | 11/2001 | Alexander | |
| 6,502,045 B1 | 12/2002 | Biagiotti | |
| 7,319,764 B1 | 1/2008 | Reid et al. | |
| 7,330,769 B2 | 2/2008 | Comair et al. | |

(Continued)

OTHER PUBLICATIONS

Video Edit Magic 4.47, Published by DeskShare, 2012. Internet Wayback Archive. 2 pages.

*Primary Examiner* — Hien L Duong
(74) *Attorney, Agent, or Firm* — Invoke

(57) ABSTRACT

A method for adjusting the sound volume of media clips using volume adjuster lines is provided. The volume adjuster lines are individually set for each clip based on the intrinsic, or absolute, volume values of the clip. In some embodiments, the volume adjuster lines are set for each clip based on the peak value or a calculated loudness equivalent of the clip. A user can move the volume adjuster line to set the absolute sound level of a clip. The volume adjuster lines can be hidden in some embodiments. In these embodiments, dragging on any portion of a clip is treated as dragging on the volume adjuster line. Some embodiments provide a deformable volume adjuster line, or curve. In these embodiments, a single audio clip can have several different volume adjuster lines for different sections of the clip where the volume adjuster line for each section is individually adjustable.

20 Claims, 41 Drawing Sheets

(56) References Cited

U.S. PATENT DOCUMENTS

| | | |
|---|---|---|
| 7,428,488 B2 | 9/2008 | Saito |
| 7,610,553 B1 | 10/2009 | Jacklin et al. |
| 7,653,350 B2 | 1/2010 | Camp, Jr. |
| 7,725,828 B1 | 5/2010 | Johnson |
| 7,742,746 B2 | 6/2010 | Xiang et al. |
| 7,756,281 B2 | 7/2010 | Goldstein et al. |
| 7,805,685 B2 | 9/2010 | Cannistraro et al. |
| 7,825,322 B1 | 11/2010 | Classen et al. |
| 8,006,195 B1* | 8/2011 | Woodings ............ G06F 3/0481 715/777 |
| 8,085,941 B2 | 12/2011 | Taenzer |
| 8,225,207 B1 | 7/2012 | Ramirez |
| 8,229,125 B2 | 7/2012 | Short |
| 8,332,757 B1 | 12/2012 | Davey et al. |
| 8,352,052 B1 | 1/2013 | Green et al. |
| 8,392,004 B2 | 3/2013 | Matsuda et al. |
| 8,494,182 B2 | 7/2013 | Spielbauer |
| 8,548,614 B2 | 10/2013 | Kirkeby et al. |
| 8,576,231 B2* | 11/2013 | Woodings ............ G06T 11/206 345/440 |
| 8,787,596 B2 | 7/2014 | Craig et al. |
| 8,965,774 B2* | 2/2015 | Eppolito ............... H03G 7/002 704/500 |
| 9,159,325 B2* | 10/2015 | Green ................... G10L 19/00 |
| 2002/0109710 A1 | 8/2002 | Holtz et al. |
| 2002/0154173 A1 | 10/2002 | Etgen et al. |
| 2003/0035555 A1 | 2/2003 | King et al. |
| 2003/0045956 A1 | 3/2003 | Comair et al. |
| 2003/0059066 A1* | 3/2003 | Kohyama ............ G11B 27/038 381/119 |
| 2004/0136548 A1 | 7/2004 | Miller |
| 2004/0146170 A1* | 7/2004 | Zint ....................... H03G 5/04 381/103 |
| 2004/0199395 A1 | 10/2004 | Schulz |
| 2005/0211075 A1 | 9/2005 | Desai et al. |
| 2006/0126865 A1 | 6/2006 | Blamey et al. |
| 2006/0168521 A1 | 7/2006 | Shimizu et al. |
| 2007/0058822 A1 | 3/2007 | Ozawa |
| 2007/0195975 A1 | 8/2007 | Cotton et al. |
| 2008/0039964 A1 | 2/2008 | Charoenruengkit et al. |
| 2008/0041220 A1 | 2/2008 | Foust et al. |
| 2008/0044155 A1 | 2/2008 | Kuspa |
| 2008/0080721 A1 | 4/2008 | Reid et al. |
| 2008/0095385 A1 | 4/2008 | Tourwe |
| 2009/0097748 A1 | 4/2009 | Lee et al. |
| 2010/0266142 A1 | 10/2010 | Huijnen et al. |
| 2010/0281367 A1 | 11/2010 | Langmacher et al. |
| 2011/0258547 A1 | 10/2011 | Symons et al. |
| 2012/0054611 A1 | 3/2012 | Perrodin et al. |
| 2012/0170769 A1 | 7/2012 | McGrath |
| 2013/0061143 A1 | 3/2013 | Eppolito |
| 2013/0061144 A1* | 3/2013 | Eppolito |
| 2013/0159852 A1 | 6/2013 | Classen et al. |
| 2015/0207481 A1 | 7/2015 | Duwenhorst et al. |
| 2016/0352296 A1 | 12/2016 | Eppolito |

* cited by examiner

OPTIMIZED VOLUME ADJUSTMENT

INCORPORATION BY REFERENCE; DISCLAIMER

Each of the following applications are hereby incorporated by reference: application Ser. No. 15/231,603 filed on Aug. 8, 2016; application Ser. No. 13/226,244 filed on Sep. 6, 2011. The Applicant hereby rescinds any disclaimer of claim scope in the parent application(s) or the prosecution history thereof and advises the USPTO that the claims in this application may be broader than any claim in the parent application(s).

BACKGROUND

Currently, many media editing applications for creating media presentations exist that composite several pieces of media content such as video, audio, animation, still image, etc. Such applications give graphical designers, media artists, and other users the ability to edit, combine, transition, overlay, and piece together different media content in a variety of manners to create a resulting composite presentation. Examples of media editing applications include Final Cut Pro● and iMovie●, both sold by Apple● Inc.

The media editing applications include a graphical user interface ("GUI") that provides different tools for creating and manipulating media content. These tools include different controls for changing the volume of audio for different media contents. One way of changing the audio volume is to display a waveform that plots the audio levels as a function of time and provide a control to change the relative level of the audio. Some GUIs display a volume bar on the audio waveform and allow the user to change the volume by dragging the volume bar up or down by a relative value. For instance, by moving the volume bar from −7 decibels (dB) to −5 dB the volume of the audio is increased by 2 dB.

This method of changing the volume has several shortcomings. For instance, even after the maximum allowed adjustment, the volume of a quiet clip might not become loud enough. On the other hand, a clip with a loud peak might be clipped off if the volume is raised by a relative value that makes the peak go beyond the maximum allowed level. In addition, in a non-linear volume scale, changes to the volume bar and the resulting changes to the corresponding waveform do not move in locked step.

Additionally, when portions of an audio clip have different loudness, using a single volume bar to adjust the volume of the audio clip does not allow fine tuning of the volume in different portions of the clip. Similarly, when an audio clip or a portion of an audio clip is displayed with low volume, visually identifying different points such as maximum points and minimum points (or the peaks and valleys) of the clip and aligning them to each other or to a specific time on a displayed timeline is difficult.

BRIEF SUMMARY

Some embodiments provide a method for adjusting the sound volume of media clips. In some of these embodiments, volume adjuster graphs are provided to adjust the media clips volumes. Each volume adjuster graph includes one or more segments. The segments are either straight (e.g., horizontal, vertical, or diagonal lines) curved (e.g., curved lines). The volume adjuster graphs are individually set for each clip based on the intrinsic (or absolute) volume values of the clip. In some embodiments, the volume adjuster graphs are set for each clip based on the peak value, RMS value, or loudness value of the clip. A user can drag a segment of a volume adjuster graph and move the segment to set the absolute sound level of a clip. The volume adjuster graphs can be hidden in some embodiments. In these embodiments, dragging on any portion of a clip is treated as dragging on the corresponding segment of the volume adjuster graph.

Using the absolute values to adjust the volume has several advantages. For instance, a quiet clip can be adjusted to the maximum allowed level by dragging the volume adjuster graph to set the peak of the clip to the maximum allowed level. Also, a loud clip can be adjusted without clipping a portion of the clip by setting the volume adjuster graph to automatically stop at the maximum allowed absolute value. Accordingly, maximum advantage is taken from the available adjustment range based on the loudness of each clip.

Furthermore, using the absolute values to adjust the volume makes the volume adjuster graph and the audio waveform to move in locked steps. Another advantage of using the absolute values is each clip can have its own volume adjuster as opposed to using a relative volume adjuster that is generally the same for all clips even when the clips have different loudness values. Also, using an absolute level adjuster allows the user to match the loudness of two clips simply by setting their values to the same amount.

Some embodiments provide a deformable volume adjuster graph with multiple segments for each clip. In these embodiments, a single audio clip can have different volume adjuster segments for different portions of the clip. When one or more portions of the clip are selected, the selected and non-selected portions of the clip are analyzed and different volume adjuster segments are provided for each portion of the clip. For instance, in an embodiment where volume adjuster graphs are set based on the peak value of the clip, each particular portion of the clip is assigned a separate volume adjuster segment based on the peak volume value for the particular portion. The deformable volume adjuster graphs allow for better adjustment of volume, especially when different portions of the clip have different volume levels.

Some embodiments display reference waveforms to facilitate visual identification of different points such as maximum points and minimum points (or peaks and valleys) of an audio clip. The reference waveform includes points that correspond to points on the original audio waveform, except that some or all points on the reference waveform are accentuated to easily identify the positions of the corresponding points on the audio waveform. The reference waveform in some embodiments is superimposed over a corresponding audio waveform. In other embodiments, the reference waveform is displayed in another position (e.g., above or below the audio waveform) or is displayed in lieu of the audio waveform.

The reference waveforms are especially useful when an audio waveform (or at least a portion of the clip) has low volume which makes the visual identification of the maximums and minimums of the waveform difficult. Displaying the reference waveform which accentuates the peaks and valleys of the original waveform facilitates the identification of these maximums and minimums. In addition, the reference waveform makes it easier to align a point on the audio waveform to a certain time instance or to align them with other waveforms or other media clips. For instance, the user identifies the desired point on the reference waveform and drags the identified point along with the corresponding point on the original clip to a target time value.

The preceding Summary is intended to serve as a brief introduction to some embodiments of the invention. It is not meant to be an introduction or overview of all inventive subject matter disclosed in this document. The Detailed Description that follows and the Drawings that are referred to in the Detailed Description will further describe the embodiments described in the Summary as well as other embodiments. Accordingly, to understand all the embodiments described by this document, a full review of the Summary, Detailed Description and the Drawings is needed. Moreover, the claimed subject matters are not to be limited by the illustrative details in the Summary, Detailed Description and the Drawings, but rather are to be defined by the appended claims, because the claimed subject matters can be embodied in other specific forms without departing from the spirit of the subject matters.

BRIEF DESCRIPTION OF THE DRAWINGS

The novel features of the invention are set forth in the appended claims. However, for purpose of explanation, several embodiments of the invention are set forth in the following figures.

DETAILED DESCRIPTION

Figure 1A:
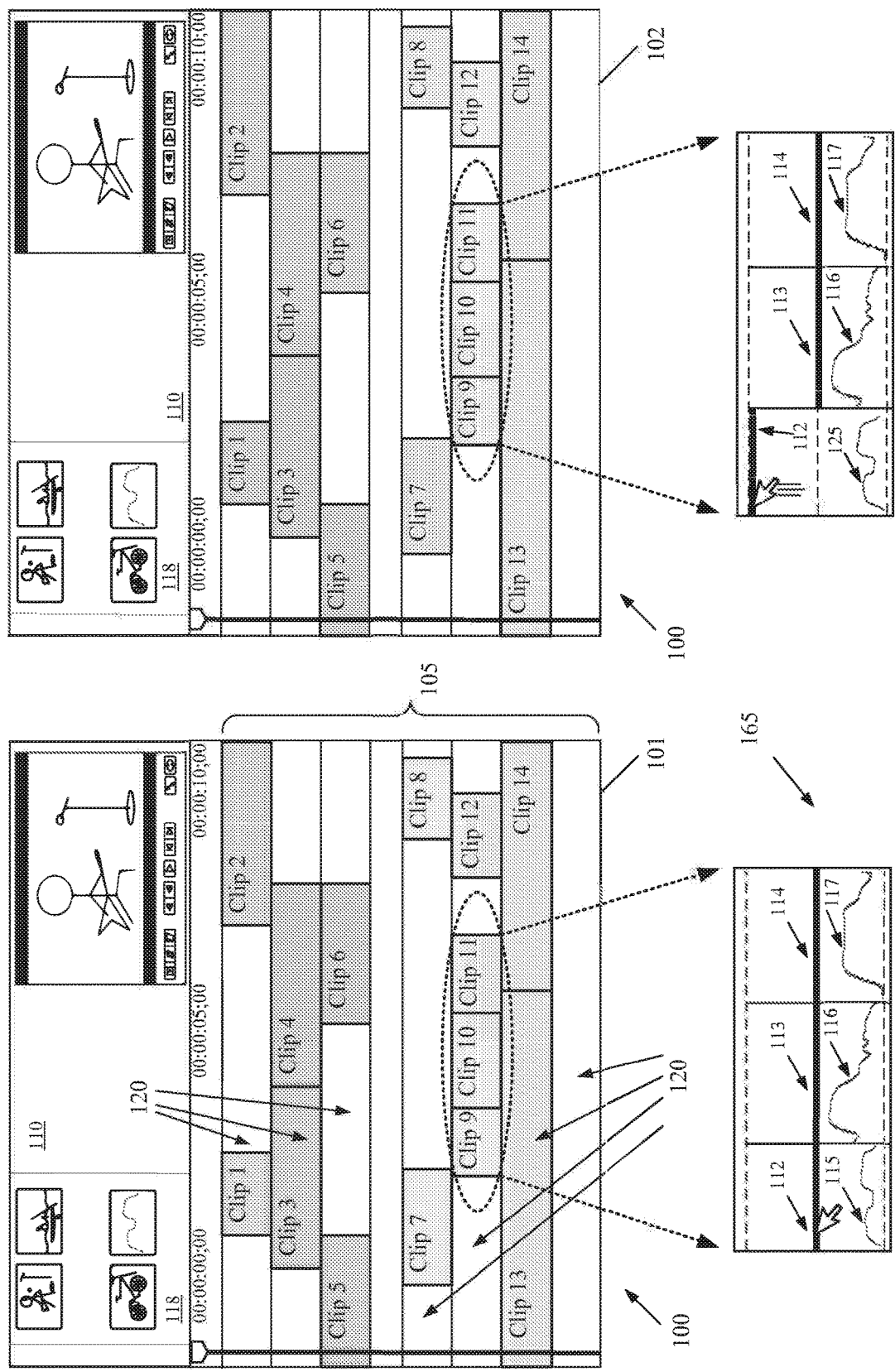
FIGS. 1A and 1B conceptually illustrate a graphical user interface ("GUI") of a media editing application that utilizes a prior art relative volume adjustment scale.

In the following detailed description of the invention, numerous details, examples, and embodiments of the invention are set forth and described. However, it will be clear and apparent to one skilled in the art that the invention is not limited to the embodiments set forth and that the invention may be practiced without some of the specific details and examples discussed.

Some embodiments provide a method for adjusting the sound volume of media clips. In some of these embodiments, volume adjuster graphs are provided to adjust the media clips volumes. Each volume adjuster graph includes one or more segments. The segments are either straight (e.g., horizontal, vertical, or diagonal lines) or curved (e.g., curved lines). The volume adjuster graphs are individually set for each clip based on the intrinsic (or absolute) volume values of the clip. In some embodiments, the volume adjuster graphs are set for each clip based on the peak value, RMS value, or loudness value of the clip. A user can drag a segment of a volume adjuster graph and move the segment to set the absolute sound level of a clip. The volume adjuster graphs can be hidden in some embodiments. In these embodiments, dragging on any portion of a clip is treated as dragging on the corresponding segment of the volume adjuster graph.

Using the absolute values to adjust the volume has several advantages. For instance, a quiet clip can be adjusted to the maximum allowed level by dragging the volume adjuster graph to set the peak of the clip to the maximum allowed level. Also, a loud clip can be adjusted without clipping a portion of the clip by setting the volume adjuster graph to automatically stop at the maximum allowed absolute value. Accordingly, maximum advantage is taken from the available adjustment range based on the loudness of each clip.

Furthermore, using the absolute values to adjust the volume makes the volume adjuster graph and the audio waveform to move in locked steps. Another advantage of using the absolute values is each clip can have its own volume adjuster as opposed to using a relative volume adjuster that is generally the same for all clips even when the clips have different loudness values. Also, using an absolute level adjuster allows the user to match the loudness of two clips simply by setting their values to the same amount.

Some embodiments provide a deformable volume adjuster graph with multiple segments for each clip. In these embodiments, a single audio clip can have different volume adjuster segments for different portions of the clip. When one or more portions of the clip are selected, the selected and non-selected portions of the clip are analyzed and different volume adjuster segments are provided for each portion of the clip. For instance, in an embodiment where volume adjuster graphs are set based on the peak value of the clip, each particular portion of the clip is assigned a separate volume adjuster segment based on the peak volume value for the particular portion. The deformable volume adjuster graphs allow for better adjustment of volume, especially when different portions of the clip have different volume levels.

Some embodiments display reference waveforms to facilitate visual identification of different points such as maximum points and minimum points (or peaks and valleys) of an audio clip. The reference waveform includes points that correspond to points on the original audio waveform, except that some or all points on the reference waveform are accentuated to easily identify the positions of the corresponding points on the audio waveform. The reference waveform in some embodiments is superimposed over a corresponding audio waveform. In other embodiments, the reference waveform is displayed in another position (e.g., above or below the audio waveform) or is displayed in lieu of the audio waveform.

The reference waveforms are especially useful when an audio waveform (or at least a portion of the clip) has low volume which makes the visual identification of the maximums and minimums of the waveform difficult. Displaying the reference waveform which accentuates the peaks and valleys of the original waveform facilitates the identification of these maximums and minimums. In addition, the reference waveform makes it easier to align a point on the audio waveform to a certain time instance or to align them with other waveforms or other media clips. For instance, the user identifies the desired point on the reference waveform and drags the identified point along with the corresponding point on the original clip to a target time value.

Several more detailed embodiments of the invention are described in sections below. Section I provides an overview of the invention. Next, Section II describes providing optimized volume adjustments in some embodiments. Section III describes displaying reference waveforms to facilitate visual identification of different points of audio clips in some embodiments. Next, Section IV describes the software architecture of some embodiments. Section V describes a graphical user interface (GUI) of some embodiments. Finally, a description of an electronic system with which some embodiments of the invention are implemented is provided in Section VI.

I. Overview

A. Issues with a Relative Volume Adjustment Scale for Changing Volume

Figure 1B:
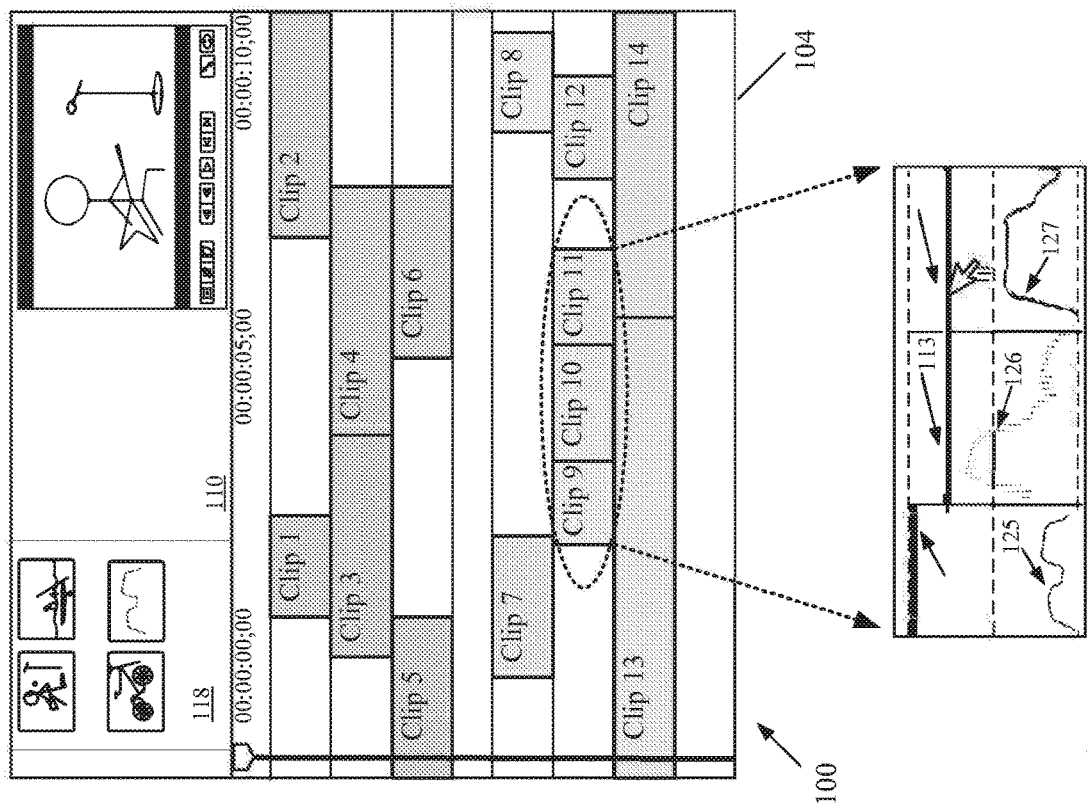
Figure 1B:
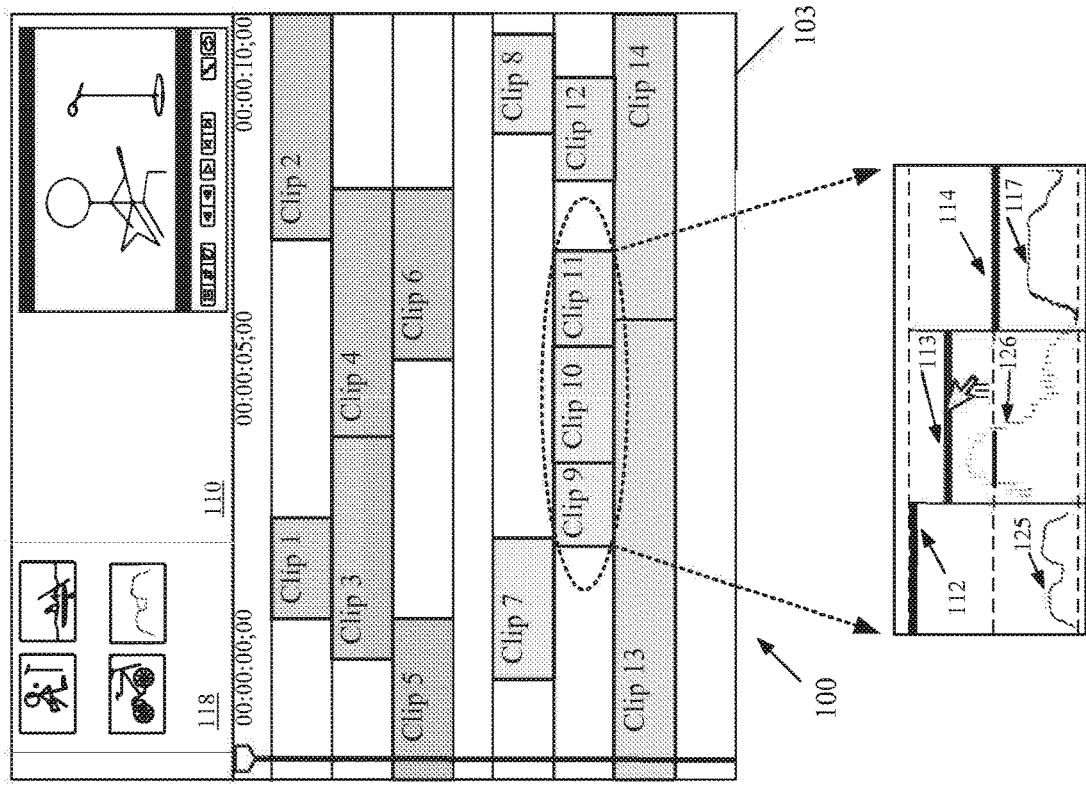

FIGS. 1A and 1B illustrate a graphical user interface ("GUI") 100 of a media editing application that utilizes a prior art relative volume adjustment scale. The relative volume adjustment scale is used to increase or decrease volume by amounts set with the volume adjuster or adjustment bar. For instance, setting the relative volume bar to −10 dB decreases the clip's arbitrary volume level by 10 dB rather than setting the average volume of the clip to −10 dB. The GUI 100 is shown at four stages 101-104. The GUI 100 includes a track display area 105, a video preview area 110, and a clip selection area 118. The track display area 105 includes a set of tracks 120 for displaying one or more video clips (e.g., Clips 1-6) and one or more audio clips (e.g., Clips 7-14). Each clip is provided with a volume bar. For instance, as shown in the expanded view 165, volume bars 112, 113, and 114 are provided for Clips 9, 10, and 11 respectively.

In the first stage 101, the track display area 105 includes original waveforms 115, 116, and 117 for Clips 9-12. In the first stage 101, the gain for each of the clips is set at zero decibels (dB). Therefore, the original volume of each of the clips has not been adjusted. In the second stage 102, the track display area 105 includes adjusted waveform 125. In the third stage 103, the track display area 105 includes adjusted waveform 126. In the fourth stage 104, the track display area 105 includes adjusted waveform 127. There are several shortcomings in adjusting the volume by using a relative adjustment scale. For instance, even after the maximum allowed adjustment, the volume of a quiet clip (such as clip 115) might not become loud enough while a clip with a loud peak (such as clip 116) might be clipped off if the volume is raised beyond a certain level. In addition, changes to the volume bar and the resulting changes to the corresponding waveforms are not aligned. Specially, in a nonlinear volume scale, the changes to the volume bar and the resulting changes to the corresponding waveform are not in locked step.

Figure 2:
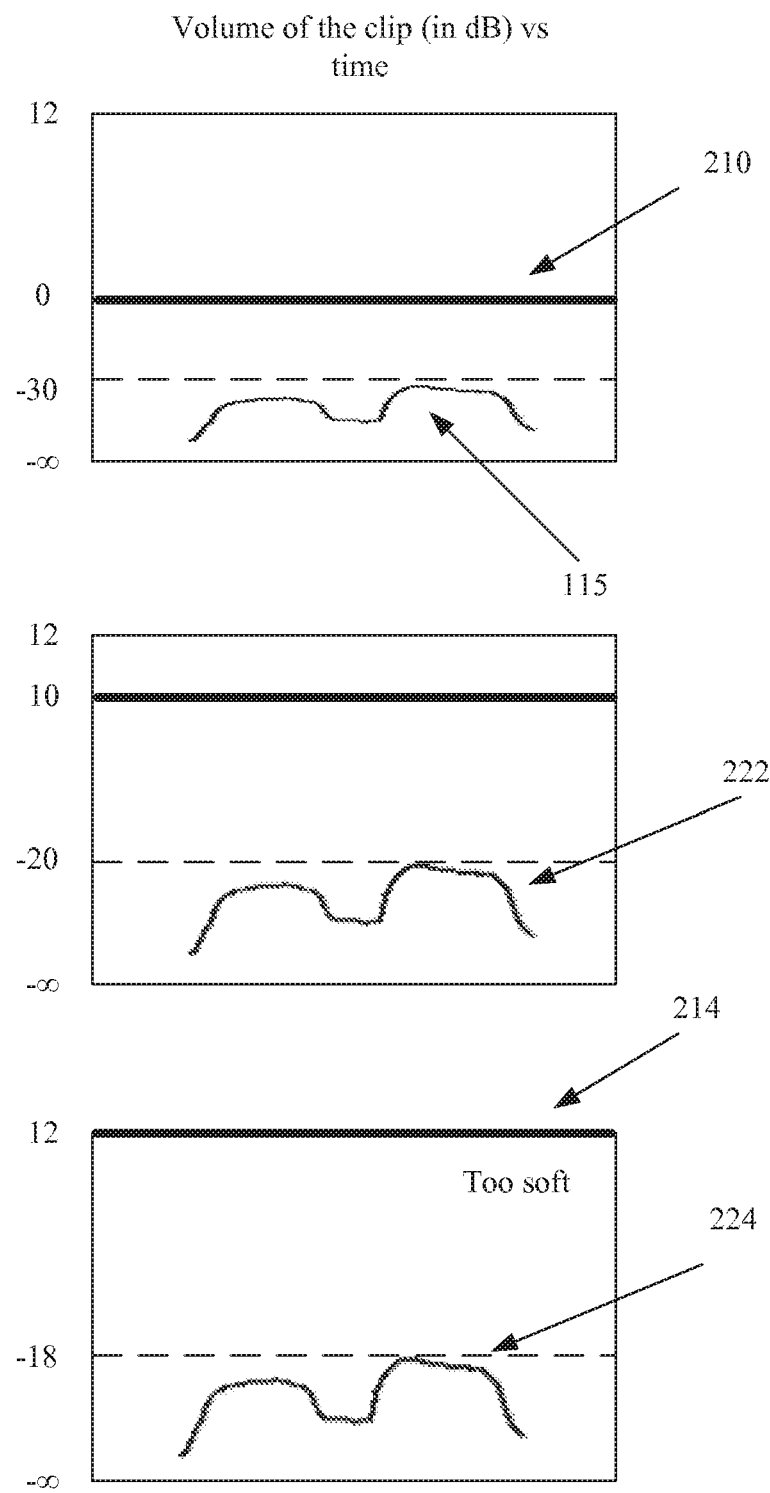
FIG. 2 conceptually illustrates three prior art examples of the effects of changing the volume level by a relative amount for a quiet waveform.

Details of these shortcomings are described by reference to FIGS. 2-4 below. In these figures, it is assumed that the intrinsic sound level cannot exceed 0 dB. Also, the maximum gain adjustment is assumed to be 12 dB. FIG. 2 conceptually illustrates three prior art examples of the effects of setting the volume level to a relative amount for waveform 115 when the peak of the original waveform 115 is at −30 dB. Each example shows the selected gain (shown as the volume bar 210) and the resulting waveforms 115, 222, and 224. The peak of each waveform is shown with a dashed line. Waveform 115 represents a clip with a low original volume of −30 dB.

In this example it is assumed that the volume of a clip cannot exceed 0 dB. However, since changes to the volume bar are relative, the maximum value for the relative increase for the volume bar is shown to be 12 dB. Since the changes are relative, setting the volume bar at 8 dB, does not set any particular point on the clip to 8 dB. Instead, the volume for every point on the clip is increased by 8 dB.

As shown, when the gain level is at 0 dB (as indicated by the volume bar 210), the peak of the resulting waveform 115 is at −30 dB. When the relative gain level is increased to 10 dB, the peak of the resulting waveform 222 is increased by 10 dB and is set at −20 dB. Also, when the relative gain level is increased to 12 dB, the peak of the resulting waveform 224 is increased by 12 dB and is set at −18 dB.

Since GUI 100 uses a relative volume scale, adjusting the volume bar 210 up or down applies a positive or negative gain to the original volume level of the clip (and therefore increases or decreases the height of the associated waveform). As a result, for waveform 115 that has a very low original volume, setting the gain to the maximum possible 12 dB level still results in a peak volume level of only −18 dB. Accordingly, a prior art system with an arbitrary maximum volume adjustment does not raise a quiet clip loud enough, even when the volume adjustment is maximized.

Figure 3:
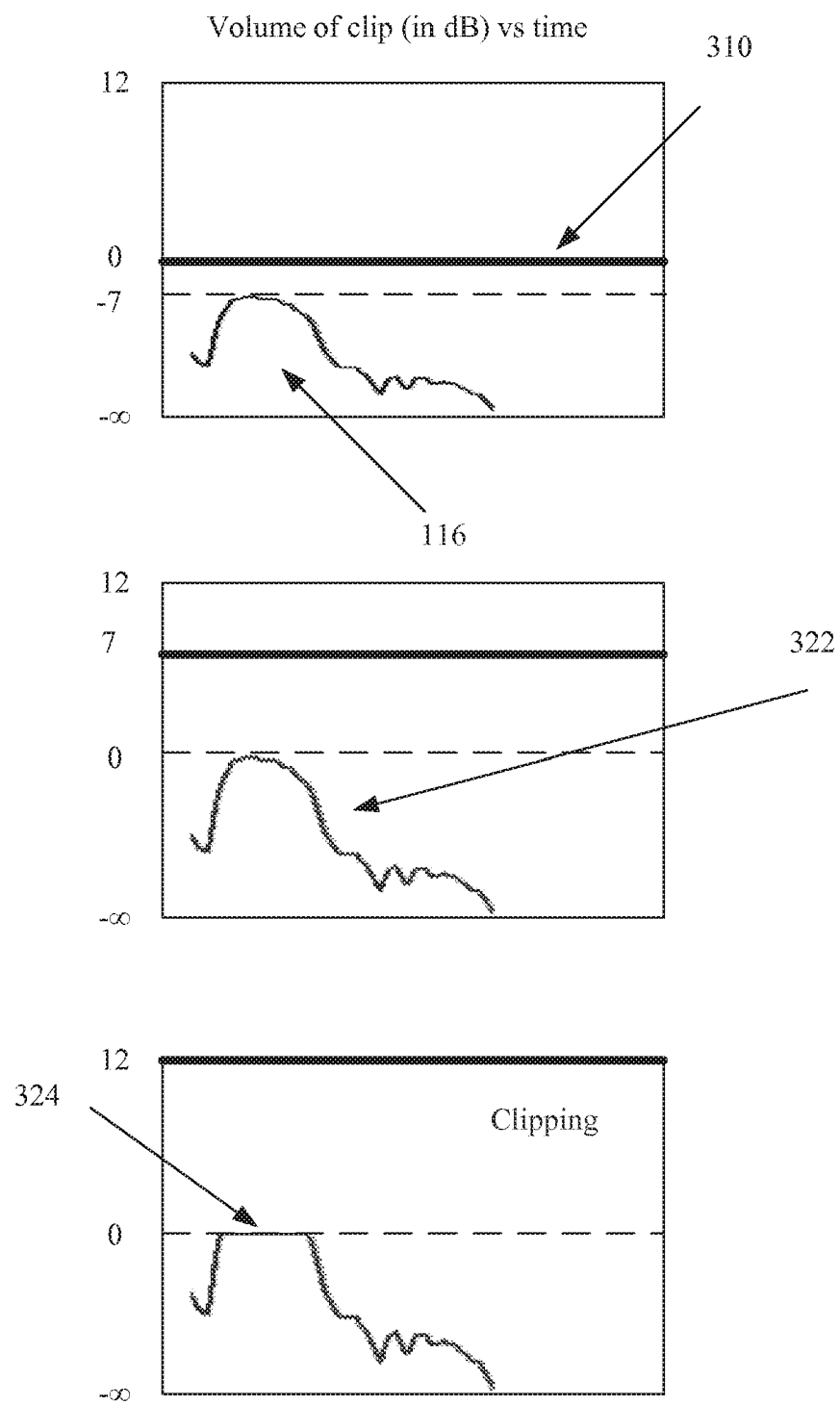
FIG. 3 conceptually illustrates three prior art examples of the effects of changing the volume level by a relative value for a waveform with a loud peak.
Figure 4:
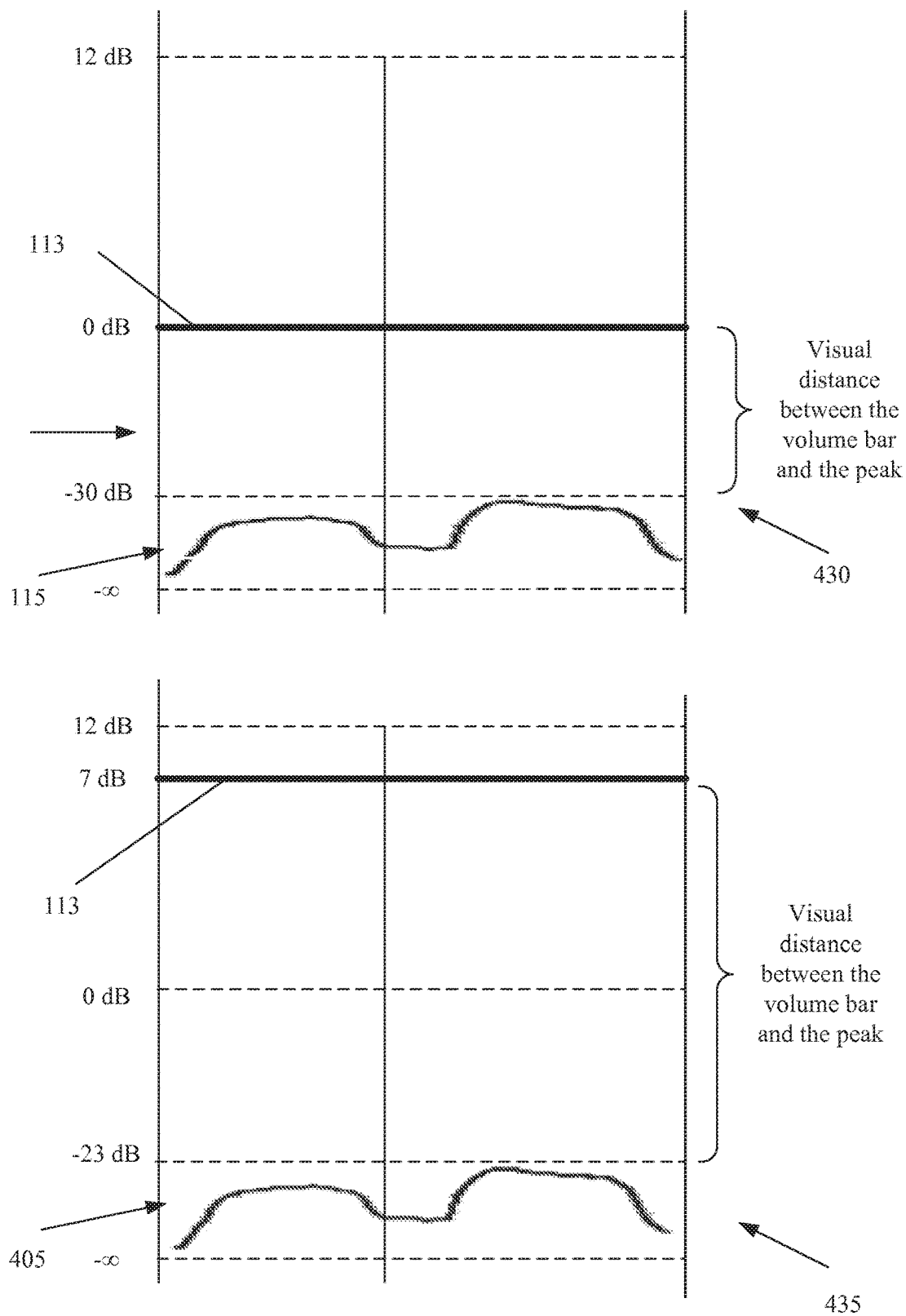
FIG. 4 illustrates changing the volume of an audio clips by using a relative volume adjustment according to prior art.

FIG. 3 conceptually illustrates three prior art examples of the effects of setting the volume level to a relative amount for waveform 116 when the peak of the original waveform 116 is at −7 dB. Each example shows the selected gain (shown as the volume bar 310) and the resulting waveforms 116, 322, and 324. Waveform 116 represents a clip with a relatively high original volume where the difference between the original peak volume (i.e., −7 dB) and the maximum possible peak volume (i.e., 0 dB) is less that the maximum possible gain adjustment of 12 dB. As shown, when the gain level is set at −7 dB, the resulting waveform peak volume 116 is also at −7 dB. When the gain level is set at 7 dB, the peak of the resulting waveform 322 is at maximum possible level of 0 dB. However, when the gain level is set at 12 dB, the resulting waveform 324 that would have been at 5 dB is clipped at 0 dB.

Since GUI 100 uses a relative volume scale, changing the gain for waveform 116 from 0 dB to 12 dB results in the unwanted clipping of the resulting waveform 324 at maximum 0 dB. Accordingly, a prior art system with an arbitrary maximum volume adjustment might clip a waveform when the gain level is raised beyond a level that brings the maximum volume level to 0 dB.

Another problem with relative volume adjustment is that the changes to the volume bar and the resulting changes to the corresponding waveform are not aligned. FIG. 4 illustrates changing the volumes of an audio clips by using a relative volume adjustment according to prior art. The waveforms are shown in two stages 430 and 435. As shown, in the first stage 430, the original peak volume of audio clip 115 is at −30 dB and the volume bar 113 is originally at 0 dB level. The difference between the peak value and the volume bar is 30 dB.

In the second stage 435, when the volume bar 113 is moved to 7 dB, the volume of the resulting waveform 405 is increased by 7 dB and the peak of the waveform is set at −23 dB. The distance between the peak value and the volume bar is still 3 dB. However, the displayed visual distance between the volume bar and the peak is more in the second stage 435 than in the first stage 430 due to the non-liner scale used to display the waveform. Accordingly, the volume bar and the waveform are not visually moving in locked steps.

B. Absolute Volume Adjustment Scale for Changing Volume

Figure 5:
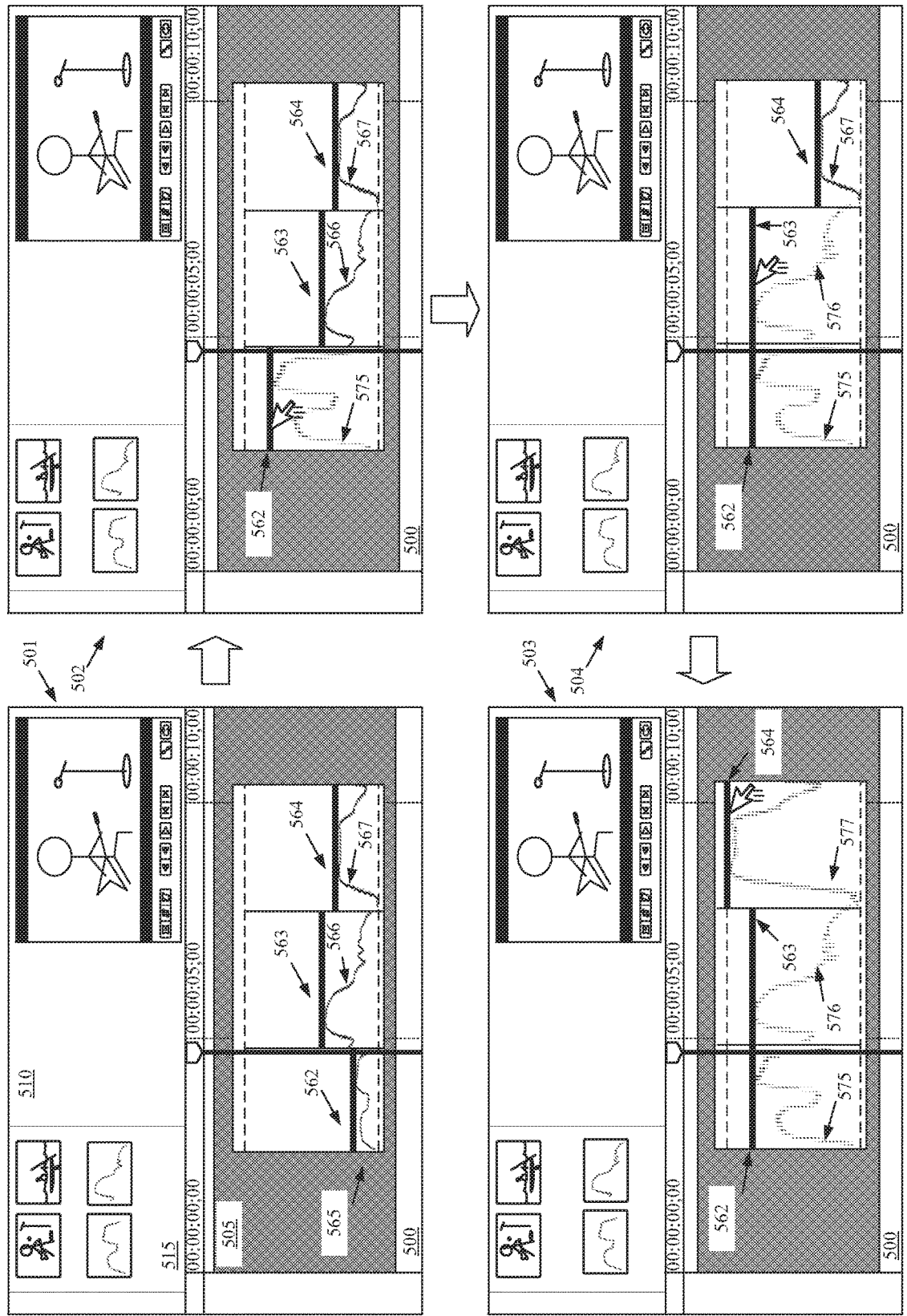
FIG. 5 conceptually illustrates a graphical user interface for changing audio volumes in a media editing application of some embodiments of the invention.

FIG. 5 conceptually illustrates a graphical user interface ("GUI") 500 of a media editing application in some embodiments of the invention. As shown, GUI 500 includes a waveform display area 505, a video preview area 510, and a clip selection area 515. Waveform display area 505 displays waveforms that represent the audio portions of media clips. Although, several overlapping and non-overlapping waveforms can be displayed in the waveform display area 505, overlapping waveforms are not shown for simplicity. A more detailed description of the GUI of some embodiments is described in Section IV, below. The waveforms represent the sound levels of the clip as a function of time. In some embodiments, one or more of the represented media clips has a video portion as well. In other embodiments, none of the media clips represented have a video portion.

GUI 500 is shown at four stages 501-504. Stage 501 represents the state of GUI 500 when three clips have been loaded and the volume of the clips has not been adjusted. Stages 502-504 represent the state of the GUI when the volumes of various clips have been adjusted. The video preview area 510 displays previews of the video portions of media clips (for those media clips that have a video portion). The clip selection area 515 displays icons representing clips that can be selected for display of the sound portion of the clips in the waveform display area. Volume adjuster graphs 562, 563, and 564 provide adjustable gain levels for the waveforms 565, 566, and 567, respectively. The volume adjuster graphs in FIG. 5 are shown as horizontal lines for simplicity. However, as described in more detail in Section II below, the volume adjuster graphs in some embodiments include one or more segments and each segment can have a different geometric shape such as a straight line or a curved line.

In the first stage 501, the waveform display area 505 includes original waveforms 565, 566, and 567. In the second stage 502, the waveform display area 505 includes adjusted waveform 575. In the third stage 503, the waveform display area 505 includes adjusted waveform 576. In the fourth stage 504, the waveform display area 505 includes adjusted waveform 577.

As described in more detail in Section II below, the volume adjuster graphs adjust the absolute value of the volumes. In other words, setting the volume adjuster graph at a specific target volume value sets a corresponding point (e.g., the peak) of the waveform at the specified target volume value. As opposed to volume adjusters in FIGS. 1A and 1B which add a certain gain to volume levels, the volume adjusters 562-564 in FIG. 5 set the intrinsic (or absolute) values of the volumes to a selected volume level. Volume adjuster graphs 562-564 provide the advantage of making a quiet clip volume to be as loud as the maximum volume level, avoiding clipping of a loud clip, and maintaining, the alignment of the clips after changing their volumes.

C. Deformable Volume Graphs

Figure 6:
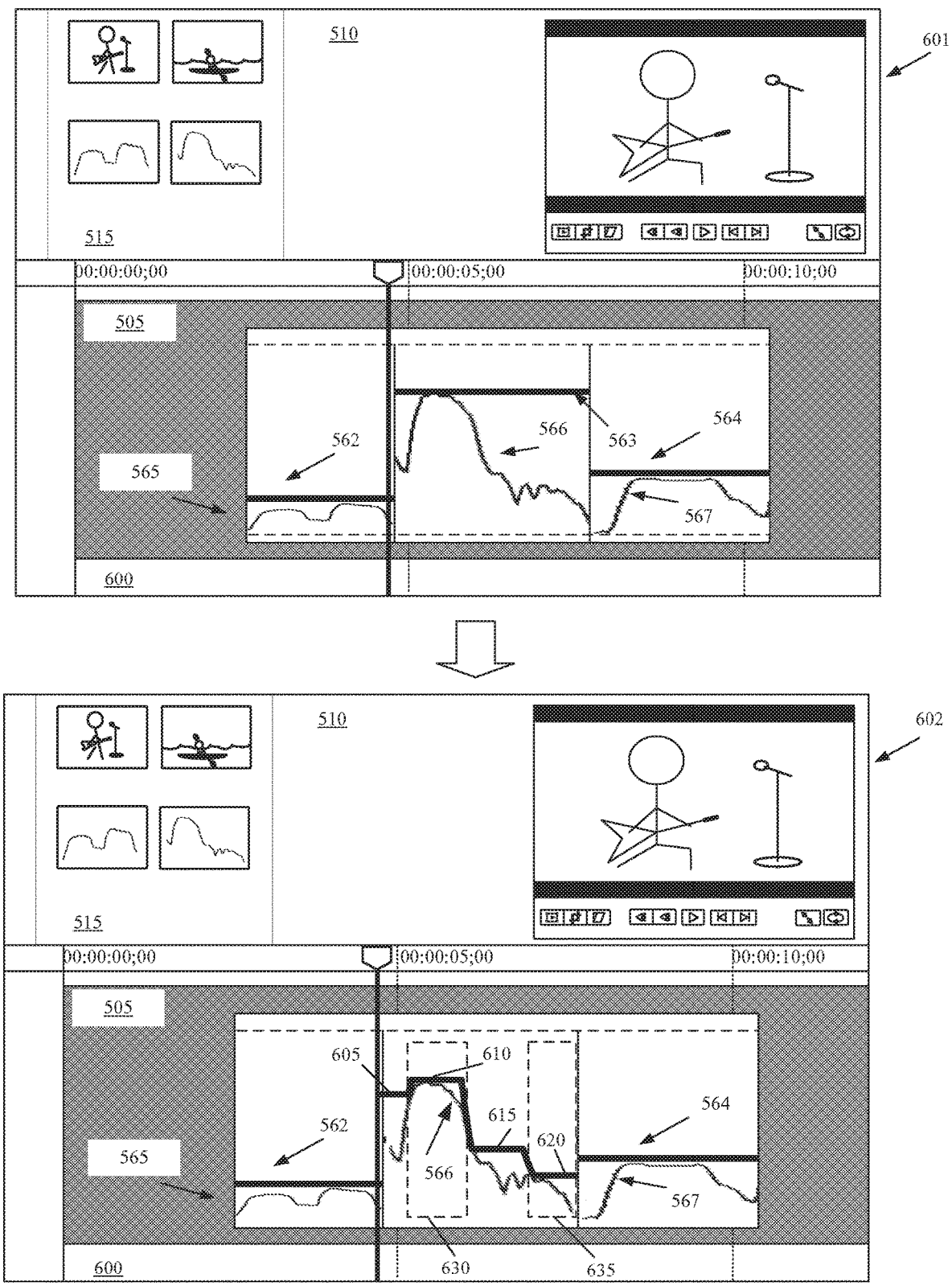
FIG. 6 conceptually illustrates a graphical user interface of a media editing application for providing deformable volume adjuster lines in some embodiments of the invention.

FIG. 6 conceptually illustrates a graphical user interface 600 of a media editing application for providing deformable volume adjuster graphs in some embodiments of the invention. GUI 600 is shown in two stages 601 and 602. As shown in the first stage 601, the three audio clips each has a volume graph 562-564, respectively. In this example, the volume graphs are set at the maximum peak of each audio waveform 565-567.

As shown in the second stage 602, a user has selected two portions of waveform 566. The selected portions are showed by dashed rectangles 630 and 635. As shown, after selecting different portions of waveform 566, each particular portion is displayed with a different volume graph set at the local peak of the particular portion that controls the volume of the portion. The deformable volume graphs provide the advantage of allowing better adjustment of volume without breaking a clip into separate clips. Deformable volume graphs are especially useful when different portions of the clip have different volume levels. As described further below, in some embodiments, deformable volume graphs are automatically generated over a clip (e.g., as a running average).

D. Reference Waveforms

Figure 7:
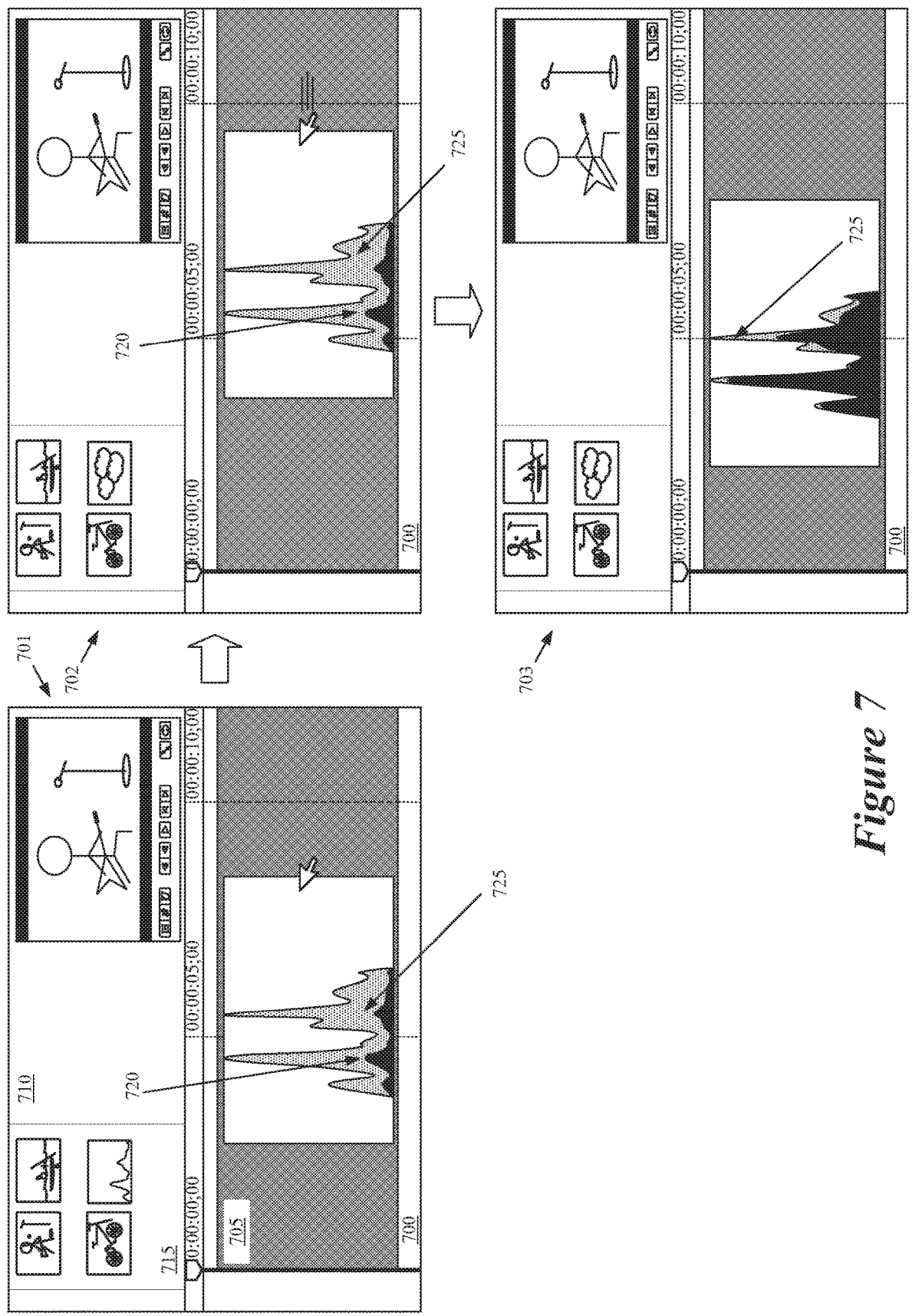
FIG. 7 conceptually illustrates a graphical user interface for displaying reference waveforms in a media editing application of some embodiments of the invention.

FIG. 7 conceptually illustrates a graphical user interface 700 of a media editing application for displaying reference waveforms in some embodiments of the invention. As shown, GUI 700 includes a waveform display area 705, a video preview area 710, and a clip selection area 715. An audio waveform 720 is displayed (shown in dark highlight) in the waveform display area 705. The waveform includes a maximum peak volume and several local maximums or minimums (or peaks and valleys). The maximums and minimums are points on the displayed waveform with a zero slope. Since the local maximums and minimums are less than the maximum peak, the local peaks are more difficult to identify on the displayed waveform 720. In addition, for a low volume clip, it is difficult to align a point of the audio clip to a certain time instance or to align them with other waveforms (not shown) on the waveform display area 705.

GUI 700 is shown in three stages 701-703. As shown in the first stage 701, a reference waveform 725 (shown in gray highlight) is superimposed over the audio waveform 720 (shown in dark highlight) in the waveform display area 705. The reference waveform 725 includes points such as maximum points that correspond to maximum points in the waveform 720, except that some or all of the local maximum points and minimum points in the reference waveform are accentuated to identify the positions of local maximum points and local minimums points of the audio waveform 720.

In the second stage 702, a directional input (such as dragging) is received from the user which results the reference waveform 725 along with the waveform 720 to move in the waveform display area. As described in more detail in Section III below, displaying the reference waveform also facilitates aligning points of the audio waveform to a specific time or with other waveforms or other media clips. Also, as shown in the third stage 703, changing the volume of the audio clip results in the reference waveform keeping its general contour in some embodiments.

II. Optimized Volume Adjustment

A. Setting Volume Adjuster Graphs Based on Intrinsic Audio Volume Values

Some embodiments provide volume adjuster graphs to adjust the media clips volumes. Each volume adjuster graph includes one or more segments (or sections) and each segment can have a different geometric shape such as a straight line (e.g., horizontal, vertical, or diagonal lines) or a curved line. The terms volume adjuster, volume adjuster graph, volume adjuster curve, volume graph, and volume curve are used interchangeably in this specification and refer to geometric shapes used to adjust volume of audio clips.

Figure 8:
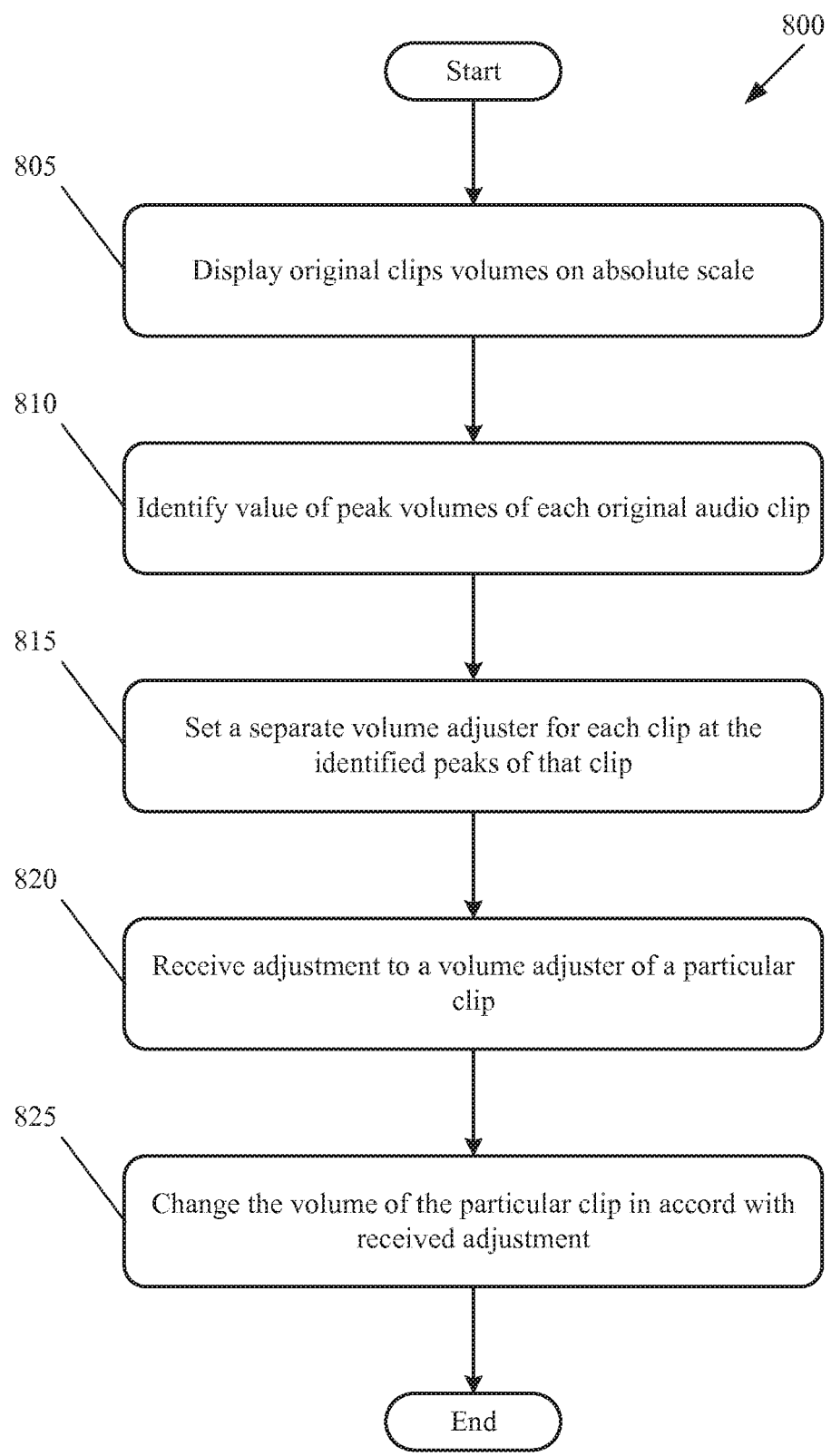
FIG. 8 conceptually illustrates a process for changing the audio volume of one or more multimedia clips in some embodiments.
Figure 9:
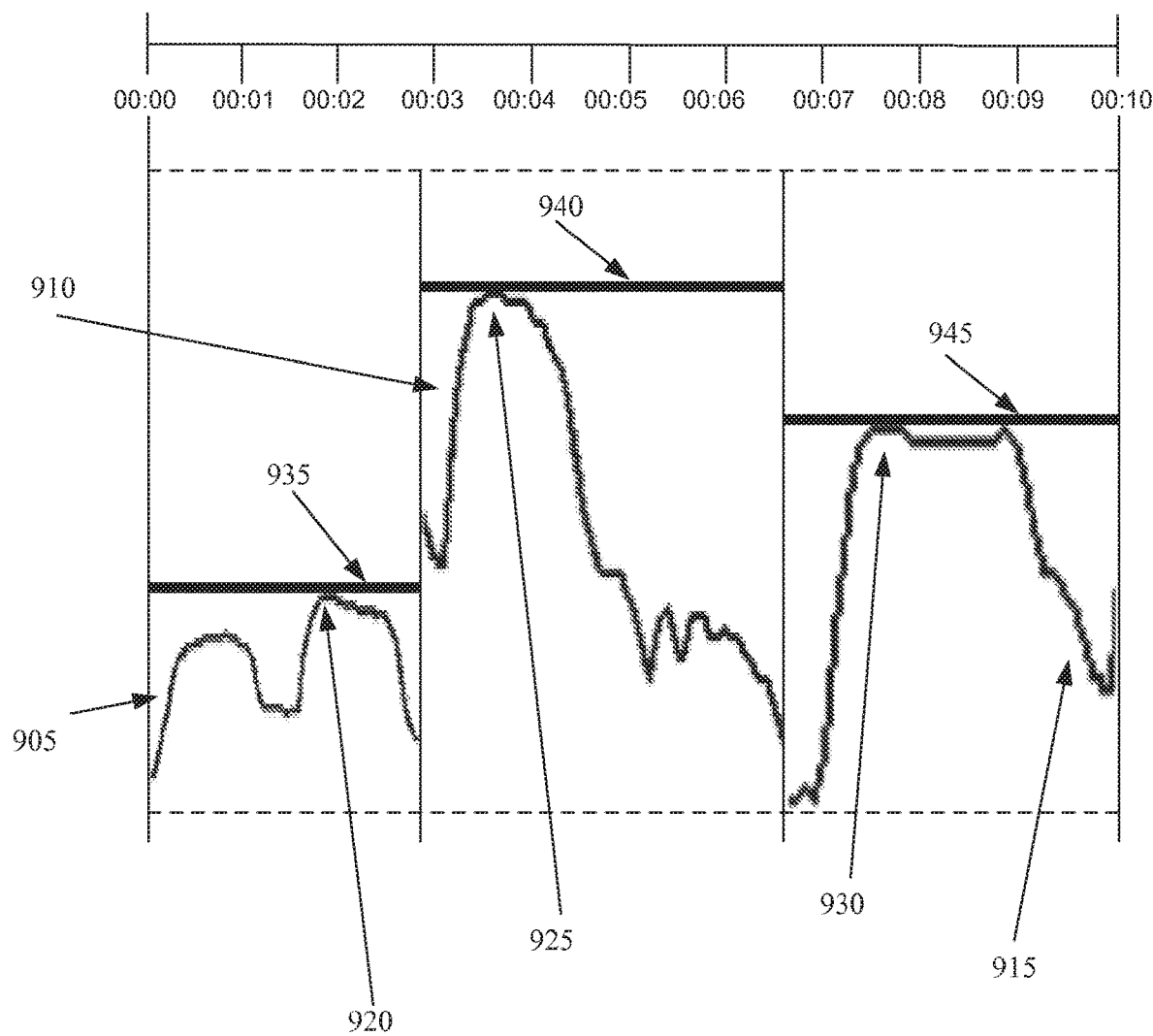
FIG. 9 conceptually illustrates three audio waveforms displayed in the waveform display area of a GUI in some embodiments.

FIG. 8 conceptually illustrates a process 800 for changing the audio volume of one or more multimedia clips in some embodiments of the invention. Different operations of process 800 are shown by reference to FIGS. 9-11. Process 800 is used in some embodiments to set volume adjuster graphs 562-564 in GUI 500 shown in FIG. 5. As shown in FIG. 8, process 800 displays each audio waveform by plotting volumes of the original audio clips as a function of time on absolute scale. FIG. 9 conceptually illustrates three audio waveforms 905-915 displayed in waveform display area 505 of GUI 500 in some embodiments of the invention. Each of the audio waveforms 905-915 is shown as a set of intrinsic (or absolute) volume levels (e.g., in decibels) plotted a function of time.

Next, process 800 identifies (at 810) the peak value (e.g., in decibels) of each waveform. FIG. 9 illustrates the peaks 920-930 of waveforms 905-915 respectively. As described further below by reference to FIG. 12, other embodiments set the level far the volume adjuster at locations other than the peak of the waveform (e.g., at the RMS level of the waveform).

Process 800 then sets (at 815) a separate volume adjuster for each clip at the identified peaks of the audio waveform. In some embodiments, the volume adjuster graph is superimposed over the corresponding audio waveform. FIG. 9 illustrates volume adjuster graphs 935-945 for waveforms 905-915 respectively. As shown, each volume adjuster graph is set at the peak (or maximum) of the corresponding waveform and individually controls the particular waveform. As shown, each volume adjuster graph is superimposed over the corresponding waveform.

Process 800 then receives (at 820) adjustments to the volume adjuster graph of a particular clip (e.g., in the form of a directional input to move the volume adjuster graph). The process changes (at 825) the volume of the clip based on the received adjustments. While changing the volume of the clip, the process maintains the position of the volume adjuster graph at the peak of the waveform. In other words, the peak of the waveform and the volume adjuster graph move together.

Figure 10:
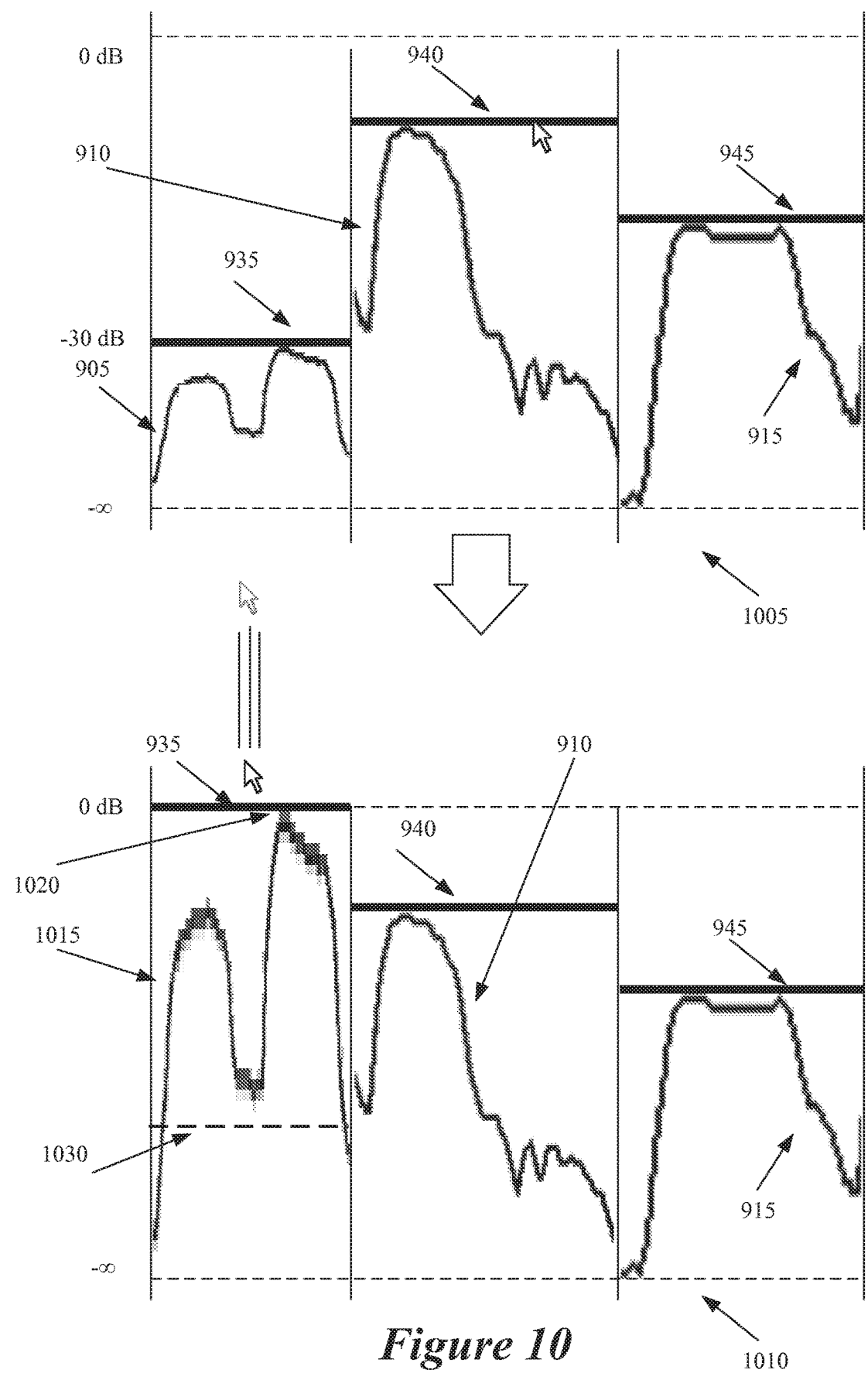
FIG. 10 conceptually illustrates changing the volume of a quiet clip in some embodiments.

FIG. 10 conceptually illustrates changing the volume of a quiet clip in some embodiments of the invention. The figure shows the three waveforms of FIG. 9 in two stages 1005 and 1010. The first stage 1005 shows the original waveforms 905-915 and their corresponding volume adjuster graphs 935-945. As shown, the peak value of waveform 905 is at −30 dB which is similar to the peak of waveform 115 shown in FIG. 2.

In the second stage 1010, a user drags up the volume adjuster graph 935 to set the absolute value of the peak of the waveform 905 to the maximum possible 0 dB. As shown, the resulting waveform 1015 has a peak value 1020 of 0 dB. In contrast to waveform 224 in FIG. 2 which was resulted from setting the volume control 214 to maximum, the quiet clip 905 is adjusted to have a peak 1020 at the maximum possible of 0 dB level. Accordingly, setting the volume adjustment scale to absolute values solves the issue of a quiet waveform still being quiet after the maximum possible adjustment in a relative adjustment scale.

Figure 11:
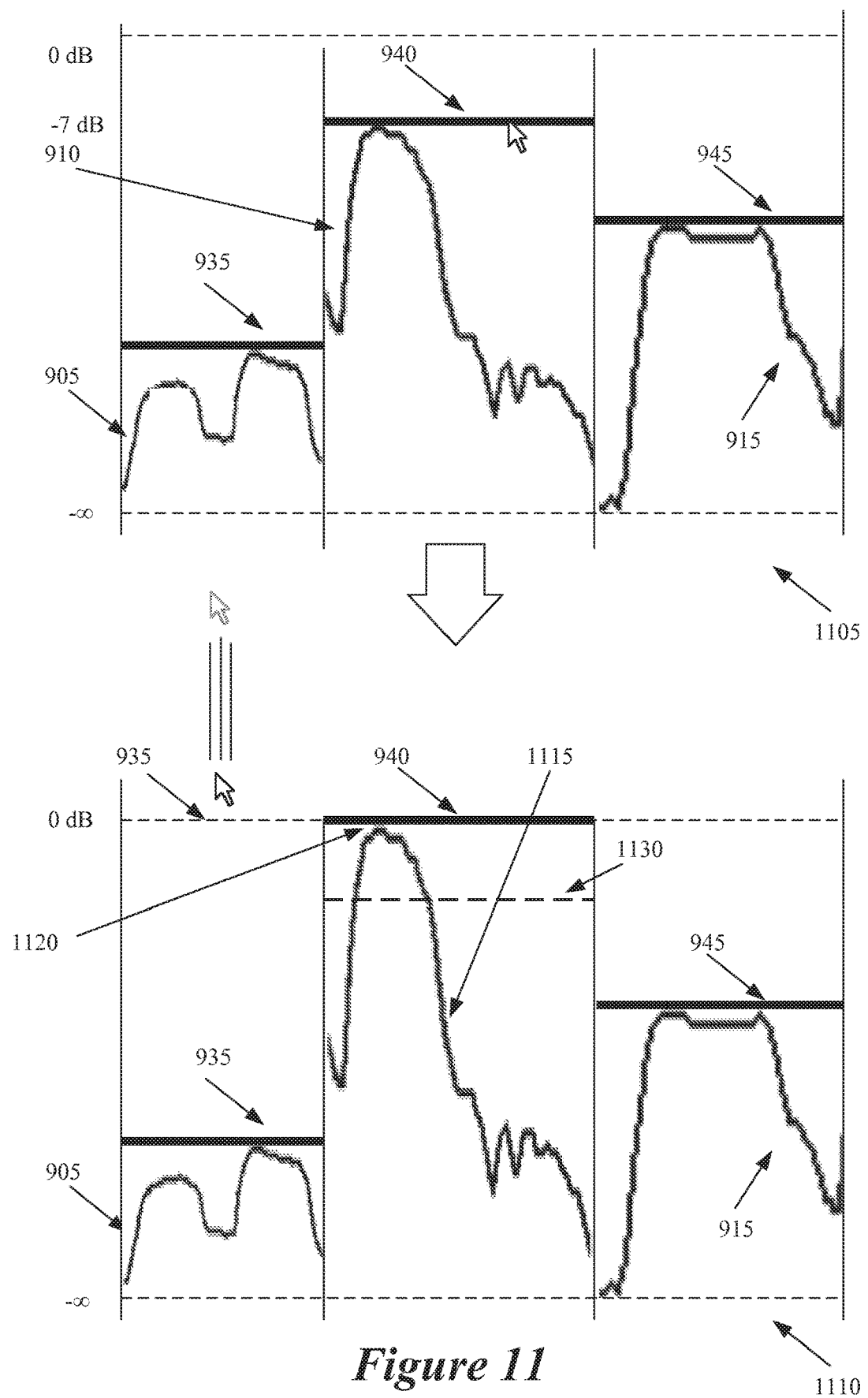
FIG. 11 conceptually illustrates changing the volume of a loud clip in some embodiments.

FIG. 11 conceptually illustrates changing the volume of a loud clip in some embodiments of the invention. The figure shows the three waveforms of FIG. 9 in two stages 1105 and 1110. As shown in the first stage 1105, the peak value of waveform 910 is at −7 dB which is similar to the peak of waveform 116 shown in FIG. 3.

In the second stage 1110, a user drags up the volume adjuster graph 940 to set the maximum peak of the waveform 910 to the maximum possible 0 dB. As shown, the resulting waveform 1115 has a peak value 1120 of 0 dB. In contrast to waveform 324 in FIG. 3 which was clipped as a result of setting the volume control 314 to maximum, the loud clip 910 in FIG. 11 is adjusted to have a peak 1120 at the maximum possible of 0 dB level without being clipped. Accordingly, setting the volume adjustment scale to absolute values solves the issue of a loud waveform being clipped after the volume adjuster is set to maximum in a relative adjustment scale.

In addition, as shown in FIGS. 10 and 11, the volume adjuster graphs and the corresponding waveforms are aligned and the distance between the volume adjuster graph and the corresponding waveform (e.g., the distance between the peak of the waveforms and the volume adjuster graph) remain the same. In other words, the volume adjuster graph and the corresponding waveform move in locked steps. This is in contrast with the volume bars and corresponding waveforms in FIGS. 2-4 that would change alignment between the waveform and the volume bar after each change to the volume bar.

Also, as shown in FIGS. 10 and 11, some embodiments display an additional reference graph 1030 and 1130 to show the original unmodified volume adjuster graph. In these embodiments, the reference graphs are displayed with different line patterning (e.g., solid, dashed, dotted, or stippled patterning), different line thickness, or different color as the volume adjuster graphs.

One of ordinary skill in the art will recognize that process 800 is a conceptual representation of the operations used for adjusting audio volume. The specific operations of process 800 may not be performed in the exact order shown and described. For instance, displaying of the original clip in some embodiments is done after operations 810 and 815. Also, operations 820 and 825 can be repeated many times to change the volume adjuster graphs in response to different user inputs. In these embodiments, after performing operation 825, process 800 proceeds to 820 and awaits the next user command. Furthermore, the specific operations of process 800 may not be performed in one continuous series of operations and different specific operations may be performed in different embodiments. Also, the process could be implemented using several sub-processes, or as part of a larger macro process.

Figure 12:
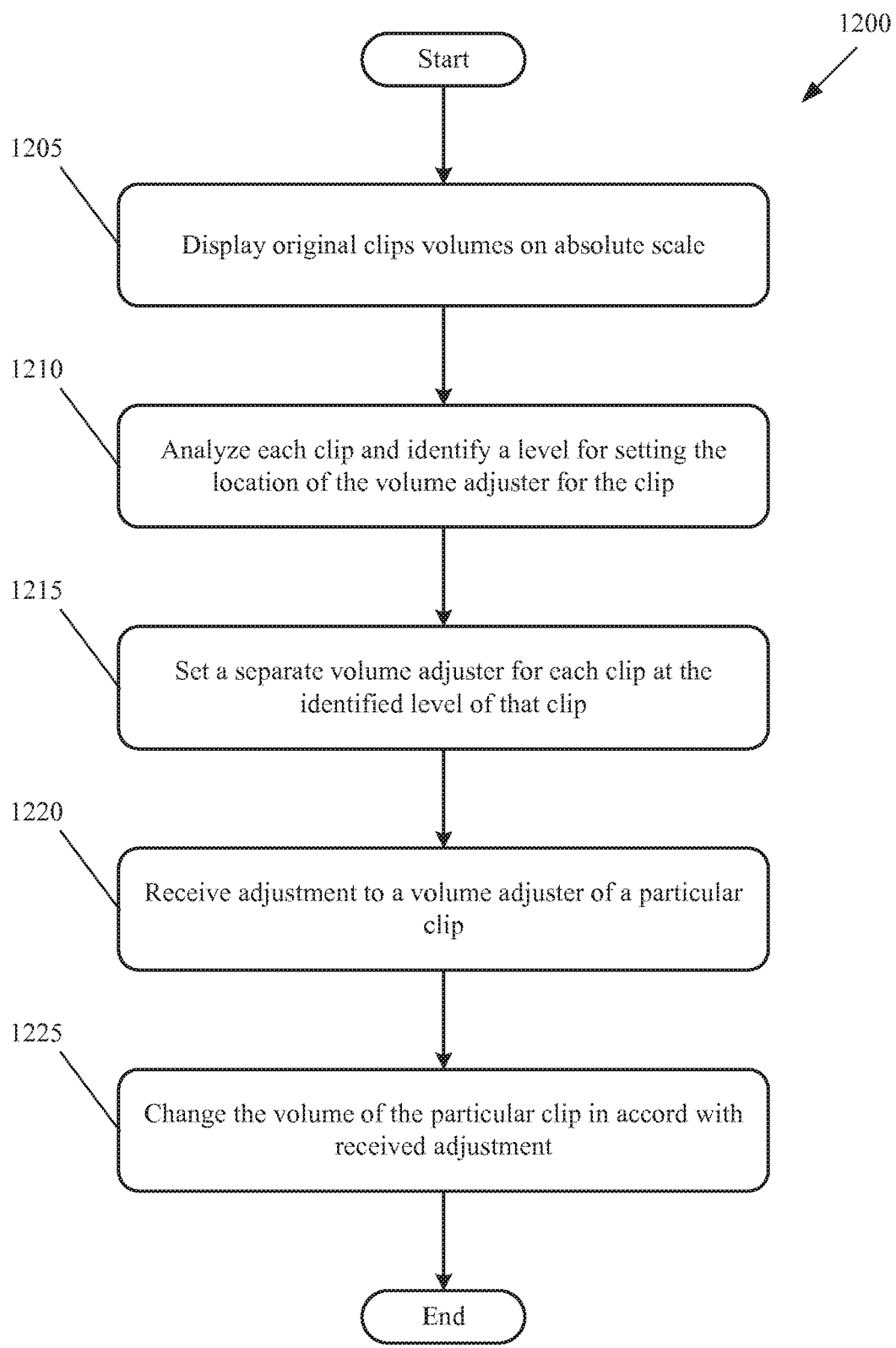
FIG. 12 conceptually illustrates a process 0 for changing the audio volume of one or more multimedia clips in some embodiments.

B. Setting the Volume Adjuster Graph at a Level Different than the Waveform Peak Some embodiments set the volume adjuster graphs at positions other than the peak of each waveform. FIG. 12 conceptually illustrates a process 1200 for changing the audio volume of one or more multimedia clips in some embodiments of the invention. Different operations of process 1200 are shown by reference to FIGS. 13-15. As shown in FIG. 12, process 1200 displays each audio waveform by plotting volumes of the original audio clips as a function of time on absolute scale.

Next, process 1200 analyzes each clip and identifies (at 1210) a volume level for setting the location of the volume adjuster graph for the clip. For instance, in some embodiments, process 1200 determines the mean square root (RMS) of each waveform, in some other embodiments, the process determines average loudness of each waveform. Different embodiments use different techniques to determine (or calculate) loudness equivalent of a clip. For instance, in some embodiments, the process determines a level for volume adjuster graph after subjecting the waveform to a loudness filter to determine the loudness of the clip. Yet in other embodiments, the loudness equivalent is calculated using a mathematical formula. Process 1200 then sets (at 1215) a separate volume adjuster graph for each clip at the identified levels of the clip. In some embodiments, the volume adjuster graph is superimposed over the corresponding audio waveform of the clip.

Figure 13:
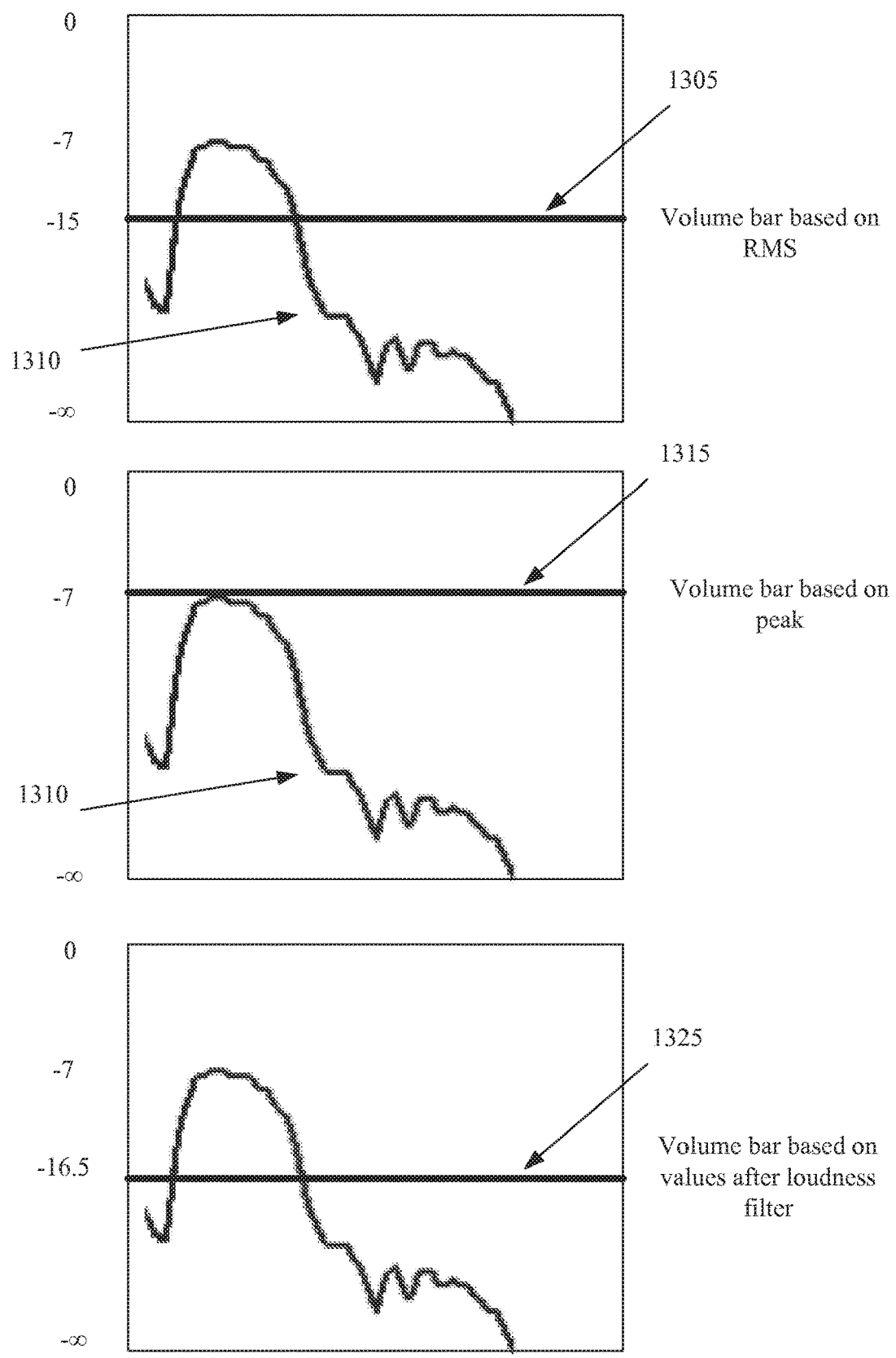
FIG. 13 conceptually illustrates several possible positions for setting the volume adjuster lines in some embodiments.

FIG. 13 conceptually illustrates several possible positions for setting the volume adjuster graphs in some embodiments of the invention. Volume adjuster graph 1305 is set at a position determined based on the RMS of the waveform 1310. As shown, the peak of the waveform 1310 is at −7 dB. In this example, the RMS is calculated to be −15 dB. The volume adjuster graph 1305 is set at the RMS level. In contrast, volume adjuster graph 1315 is placed at the peak of the waveform 1310 which is similar to the embodiments described by reference to FIGS. 9 and 10, above. As shown in FIG. 13, the peak of the waveform is at −7 dB and the volume adjuster graph 1315 is placed at the peak. FIG. 13 also illustrates Volume adjuster graph 1325. This volume adjuster graph is set at a position based on the loudness of the clip. In some embodiments, loudness is determined by using a loudness filter.

Referring back to FIG. 12, process 1200 then receives (at 1220) adjustments to the volume adjuster of a particular clip. The process changes (at 1225) the volume of the clip based on the received adjustments. The process then exits. While changing the volume of the clip, as long as the peak of the waveform has not reached the maximum, process 1200 maintains the position of the volume adjuster graph on the waveform (e.g., at the RMS position). In other words, the RMS of the waveform and the volume adjuster graph move together. When the peak of the waveform reaches the maximum, some embodiments prevent the volume adjuster graph to increase any further while other embodiments clip a portion of the waveform.

Figure 14:
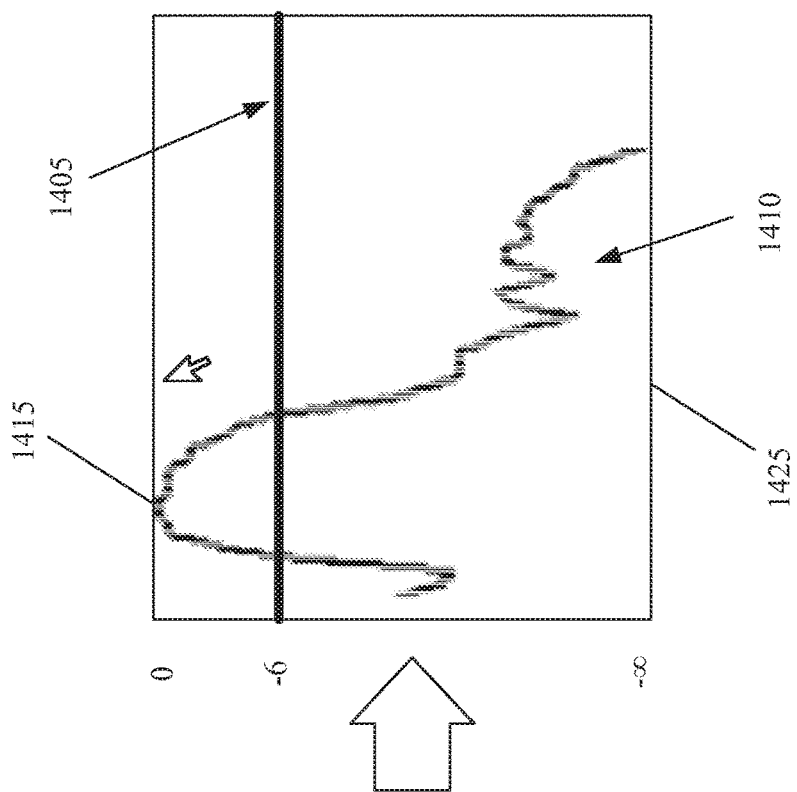
FIG. 14 conceptually illustrates a volume adjuster line which is placed at the RMS level (or any other level below the peak) of a waveform in some embodiments.
Figure 14:
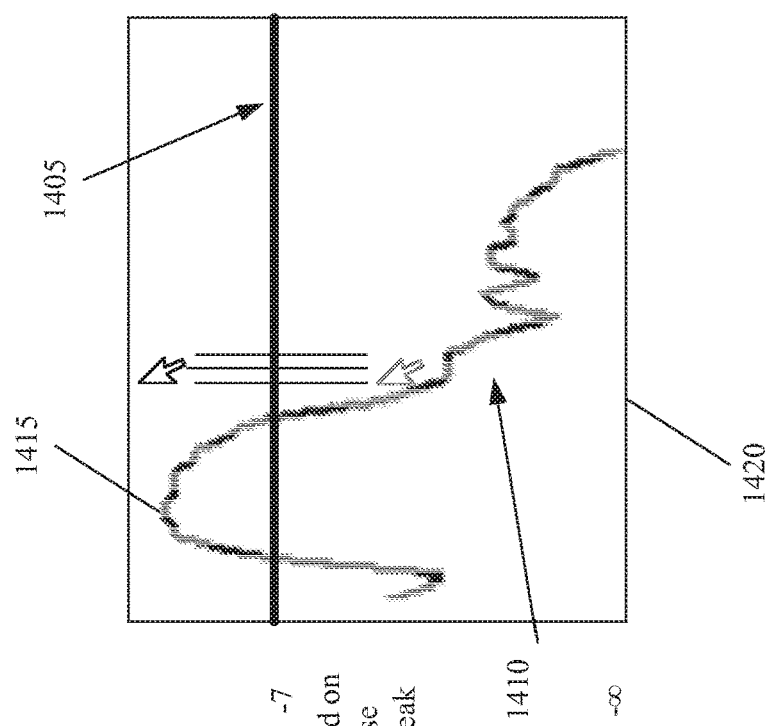

FIG. 14 conceptually illustrates a volume adjuster graph 1405 which is placed at the RMS level (or any other level below the peak) of a waveform 1410 in some embodiments of the invention. Volume adjustment is shown in two stages 1420 and 1425. As shown in the first stage 1420, as long as the peak 1415 of the waveform 1410 has not reached the maximum value of 0 dB, the volume adjuster graph (and the waveform) can move up. However, as shown in stage two 1425, when the peak 1415 of the waveform 1410 reaches the maximum allowed volume at 0 dB, the volume adjuster graph is automatically prevented from moving up any further.

Figure 15:
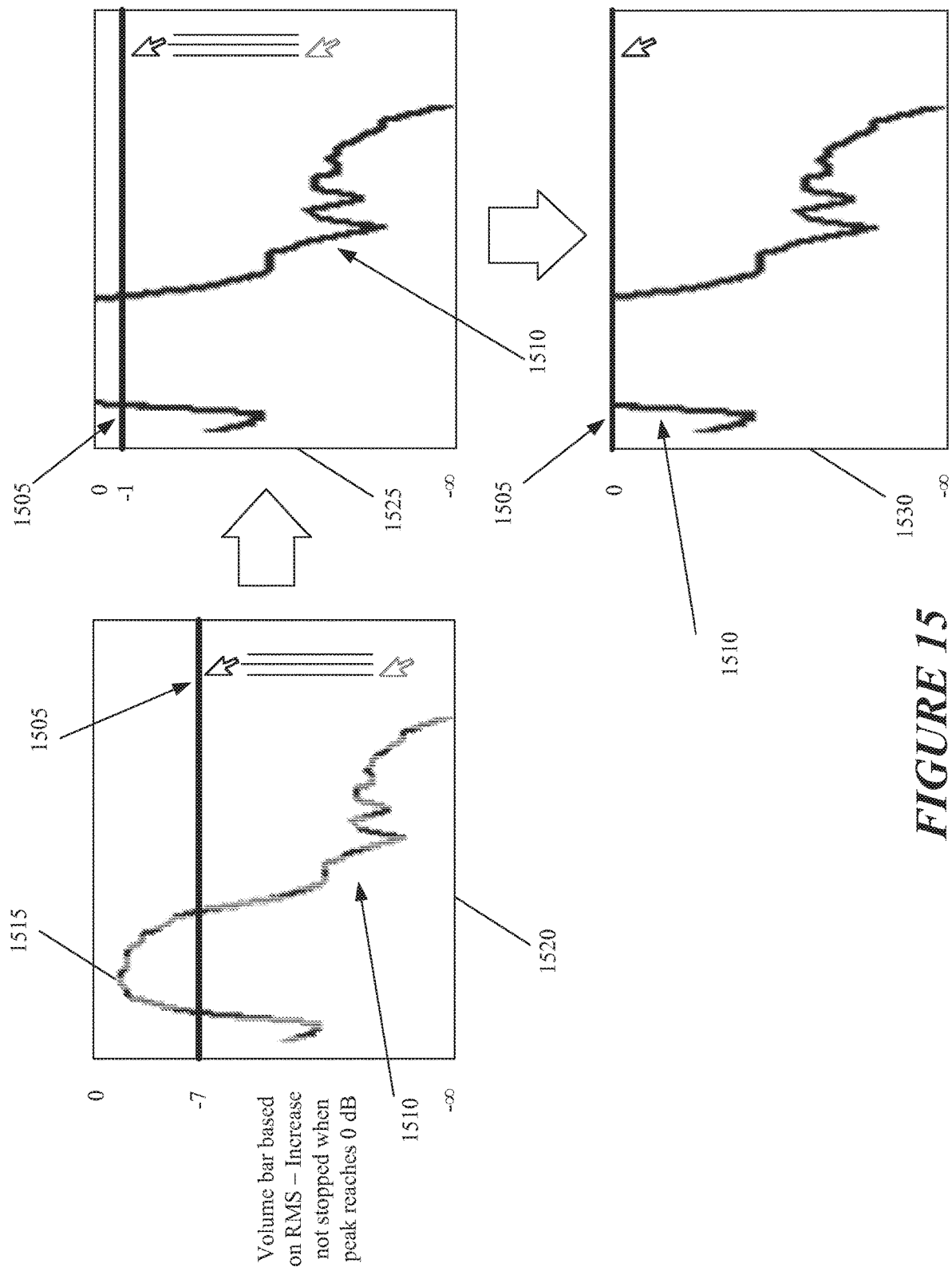
FIG. 15 conceptually illustrates a volume adjuster line which is placed at the RMS level (or any other level below the peak) of a waveform in some embodiments.

FIG. 15 conceptually illustrates a volume adjuster graph 1505 which is placed at the RMS level (or any other level below the peak) of a waveform 1510 in some embodiments. Volume adjustment is shown in three stages 1520-1530. As shown in the first stage 1520, as long as the peak 1515 of the waveform 1510 has not reached the maximum value of 0 dB, the volume adjuster graph and the waveform move up without the waveform being clipped. However, as shown in stage two 1525, when the peak of the waveform 1510 reaches the maximum allowed volume at 0 dB, the volume adjuster graph can continue moving up and the portions of the clip that reach 0 dB are clipped away. As shown in stage three 1530, the volume adjuster graph stops when it reaches the maximum limit and the portion of the clip with higher volumes than the level of the volume adjuster graph are clipped away.

One of ordinary skill in the art will recognize that process 1200 is a conceptual representation of the operations used for adjusting audio volume. The specific operations of process 1200 may not be performed in the exact order shown and described. For instance, displaying of the original clip in some embodiments is done after operations 1210 and 1215. Also, operations 1220 and 1225 can be repeated many times to change the volume adjuster graphs in response to different user inputs. In these embodiments, after performing operation 1225, process 1200 proceeds to 1220 and awaits the next user command. Furthermore, the specific operations of process 1200 may not be performed in one continuous series of operations and different specific operations may be performed in different embodiments. Also, the process could be implemented using several sub-processes, or as part of a larger macro process.

C. Shape of Volume Adjuster Graph

In FIGS. 5-6, 9-11, 13-15 as well some other figures described below, the volume adjuster graph or its segments are shown as straight lines for simplicity. However, in some embodiments, the volume adjuster graph or any of the segments of the graph can be straight lines (e.g., horizontal, vertical, diagonal line) or curved lines. In these embodiments, a section of the audio waveform is examined to determine the particular intrinsic volume level (e.g., peak, RMS, average volume, calculated loudness equivalent, etc.) at which the volume adjuster graph is to be set. The volume adjuster graph segment corresponding to each section of the audio waveform is then set based on the determined value for that section of the audio waveform.

For instance, if the intrinsic value at which the volume adjuster graph is set is the peak volume, then the peak for each section of the audio waveform is determined and each volume adjuster graph segment is set to the peak value of the corresponding section of the audio waveform. Accordingly, when the examined section of the audio waveform is the whole audio waveform, the peak of the examined section is the peak of the audio waveform and the volume adjuster graph is a straight line set at the peak of the audio waveform. On the other hand, when the section of the audio is a single sample of the audio waveform, the volume adjuster graph is the same curve as the audio waveform itself. When the examined section of the audio waveform is anywhere between an individual sample and the whole audio waveform, the volume adjuster graph is a running average of the intrinsic value (in this example, the peak) of different sections of the audio waveform. The volume adjuster graph is, therefore, a curve comprised of curved and/or straight lines that is fit according to the values determined for the particular intrinsic value for each section of the audio waveform.

D. Pre-Normalization

Figure 16:
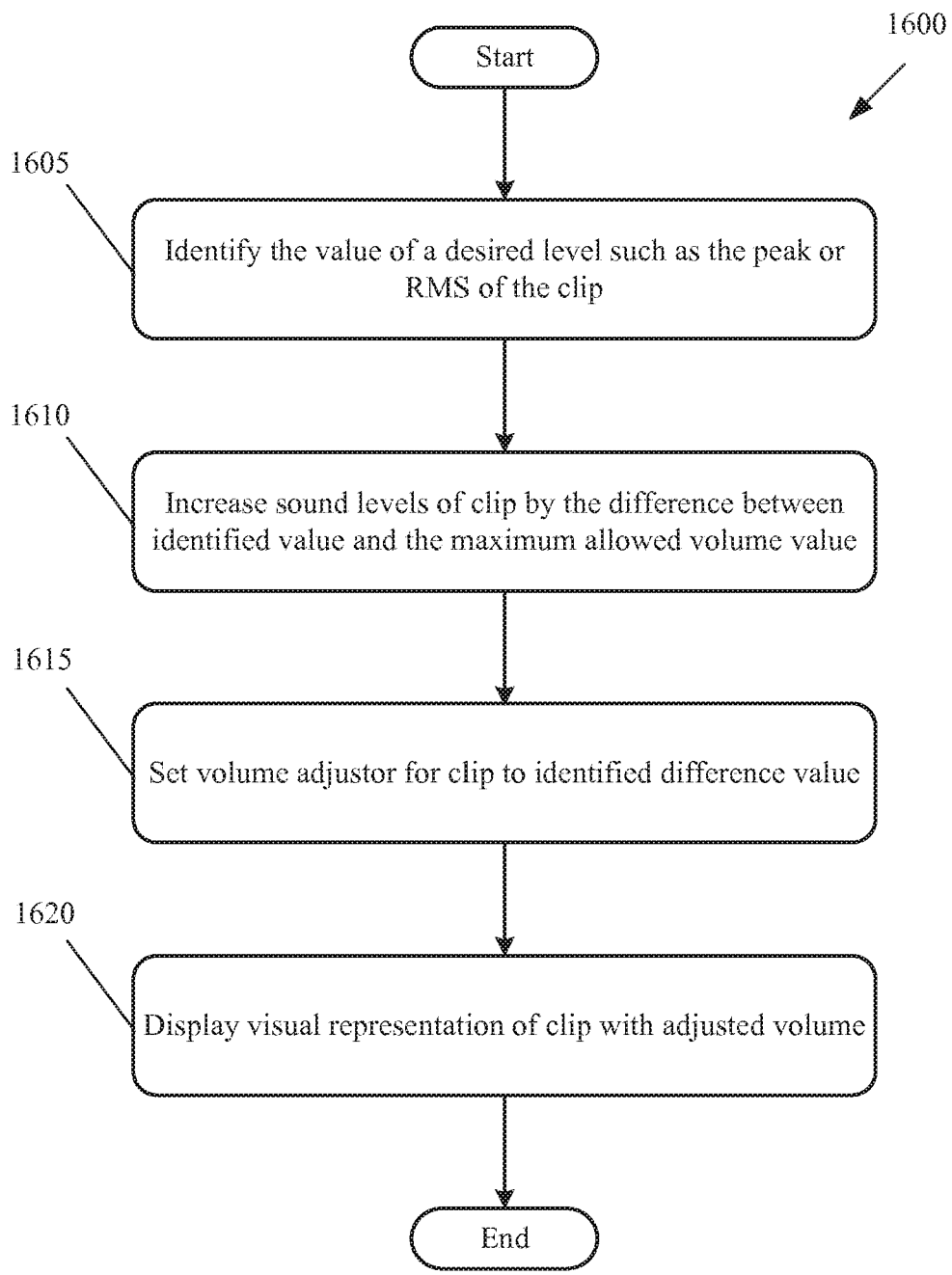
FIG. 16 conceptually illustrates a process for changing the audio volume of a multimedia clip in some embodiments.
Figure 17:
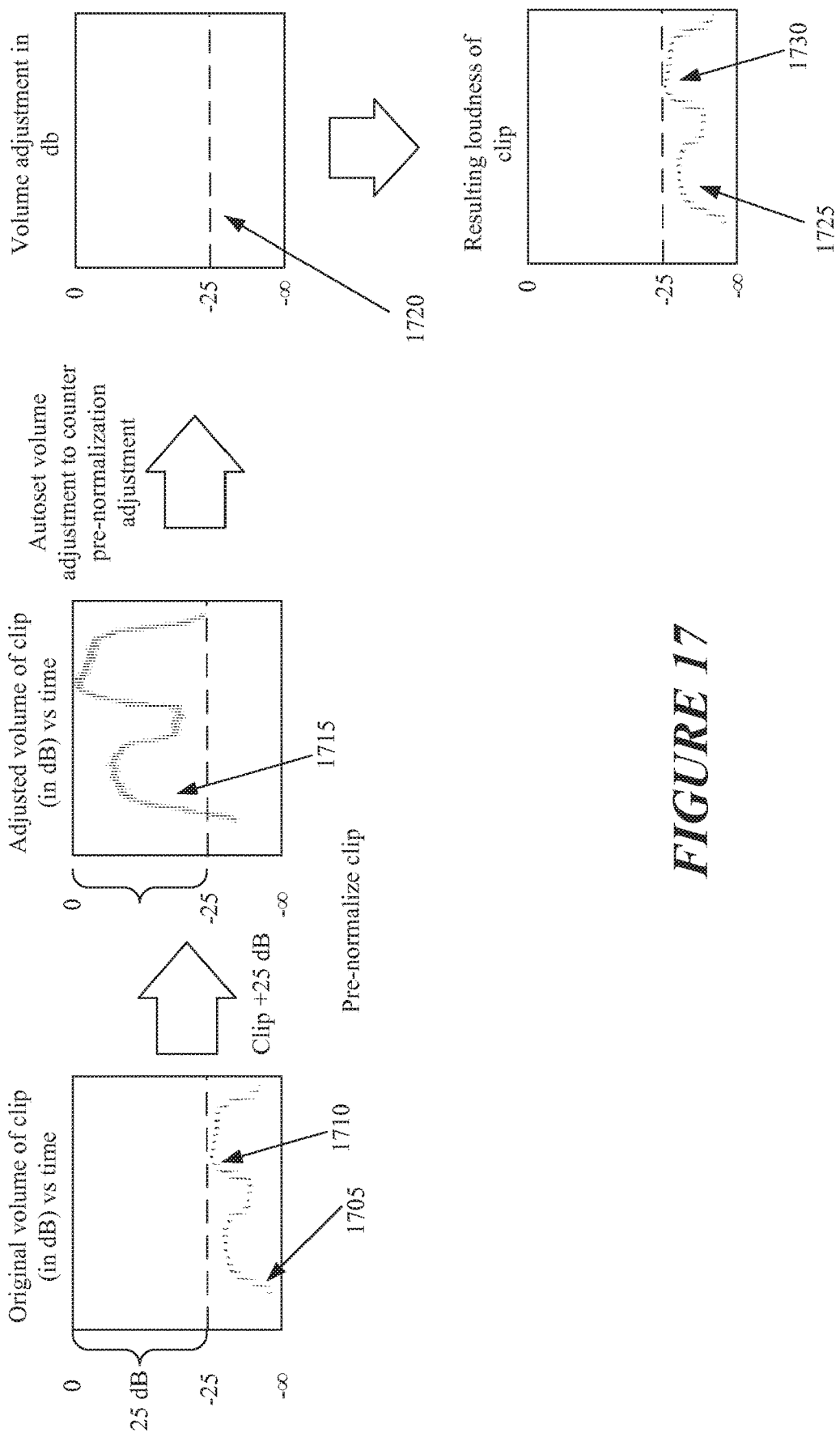
FIG. 17 conceptually illustrates different operations for pre-normalization in some embodiments.

Some embodiments perform a pre-normalization on a waveform in order to determine a level to set the volume adjuster graph for a clip. FIG. 16 conceptually illustrates a process 1600 for changing the audio volume of a multimedia clip in some embodiments of the invention. Process 1600 is described by reference to FIG. 17 which conceptually shows different operations for pre-normalization in some embodiments. As shown in FIG. 16, process 1600 identifies (at 1605) the value of a desired level (such as the peak or RMS) of the original sound clip for placing the volume adjuster graph. In the example of FIG. 17, the peak level 1710 of the waveform 1705 is determined to be at −25 dB.

Next, the process increases (i.e., pre-normalizes) (at 1610) sound levels of the clip by the difference between the identified level and the maximum allowed sound level (e.g., 0 dB). As shown in FIG. 17, the difference between the peak value (i.e., −25 dB) of waveform 1705 and the maximum allowed volume value (i.e., 0 dB) is 25 dB. The normalized waveform 1715 has volume levels that are 25 dB louder than waveform 1705.

Next, process 1600 compensates for pre-normalization by setting (at 1615) the volume adjuster for the clip below the maximum allowed value by an amount equal to the difference value. As shown in FIG. 17, the volume adjuster graph 1720 is set at −25 dB below the maximum allowed value of 0 dB. Next, process 1600 displays (at 1620) the visual representation of the clip with the adjusted volume by plotting volumes values as a function of time on absolute scale. As shown in FIG. 17, the resulting waveform 1725 is displayed at the adjusted volume with the volume adjuster graph placed at the peak 1730 of the waveform 1725.

One of ordinary skill in the art will recognize that process 1600 is a conceptual representation of the operations used for doing pre-normalization for setting the volume level adjuster. The specific operations of process 1600 may not be performed in the exact order shown and described. Furthermore, the specific operations of process 1600 may not be performed in one continuous series of operations and different specific operations may be performed in different embodiments. Also, the process could be implemented using several sub-processes, or as part of a larger macro process.

E. Changing Absolute Volume Levels without Using Volume Adjuster Graphs

Some embodiments change audio clip levels without the use of volume adjuster graphs. In some of these embodiments, the volume adjuster is set at a desired position such as the peak or RMS level without being displayed. When a user drags on any portion of a clip, the clip volume is adjusted as if the user has dragged the volume adjuster graph. Some embodiments provide a selection tool (e.g., a radio button) on GUI 500 to turn the display of the volume adjuster graph on or off. Other embodiments always display or always hide the volume adjuster graphs.

Figure 18:
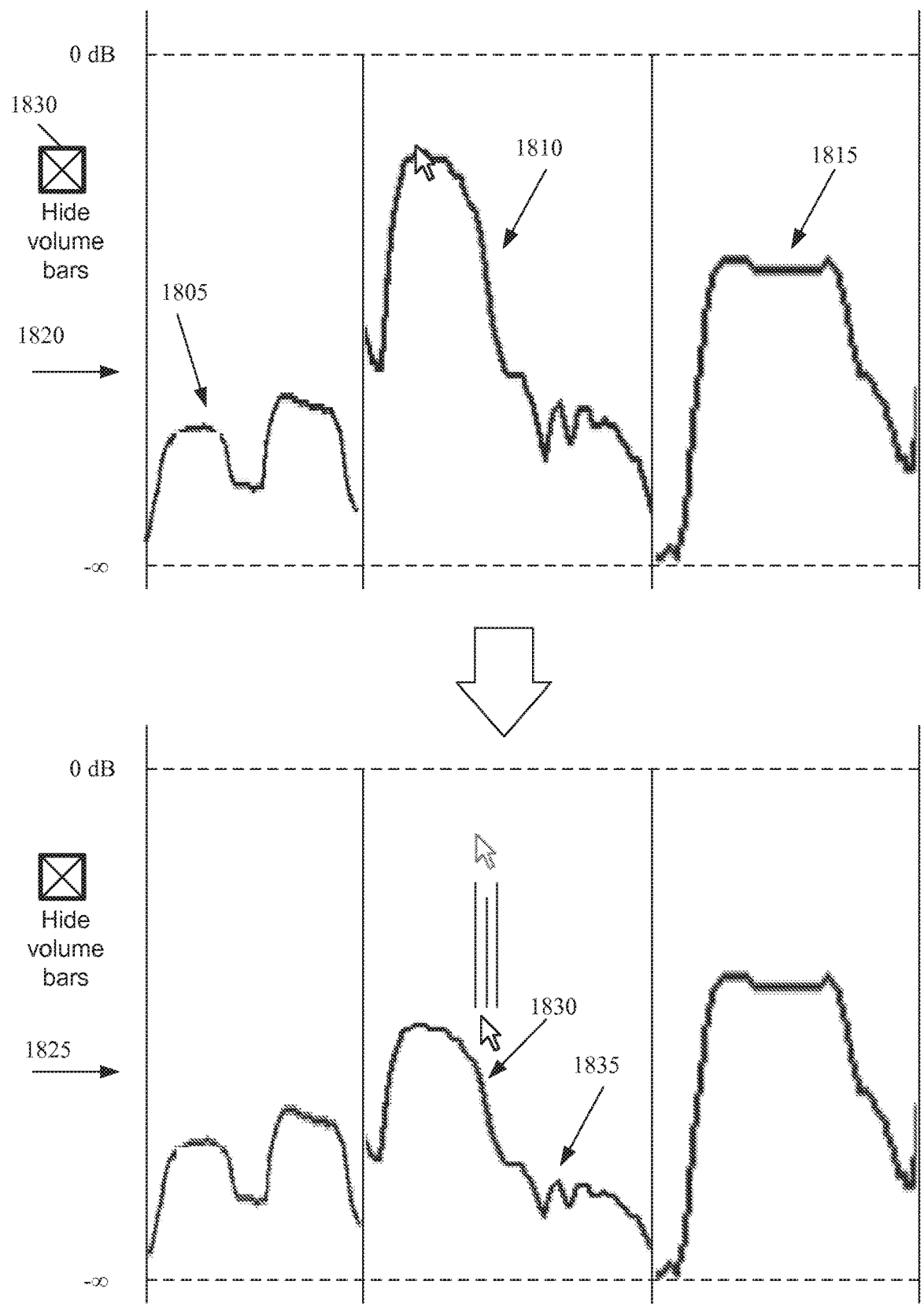
FIG. 18 conceptually illustrates three waveforms in two stages in some embodiments.

FIG. 18 illustrates three waveforms 1805-1815 in two stages 1820 and 1825 in some embodiments. The first stage 1820 illustrates the original volumes of the clips. FIG. 18 also conceptually shows that a GUI selection tool 1830 is set to hide the volume adjuster graphs. In stage two 1825, a user drags down on a point 1830 of the waveform. The volume of the resulting waveform 1835 is adjusted as if a volume adjuster graph was displayed and the user has dragged on the volume adjuster graph. For instance, if the volume adjuster graph is set at the peak and is hidden, dragging down point 1830 on the clip by a particular dB amount results in a waveform as if the user has dragged a volume adjuster graph placed at the peak by the particular dB amount. As a result, the peak of the waveform is set at the absolute value indicated by the hidden volume adjuster graph.

F. Resetting Volume Adjuster Graphs when an Audio Clip is Cropped

Figure 19:
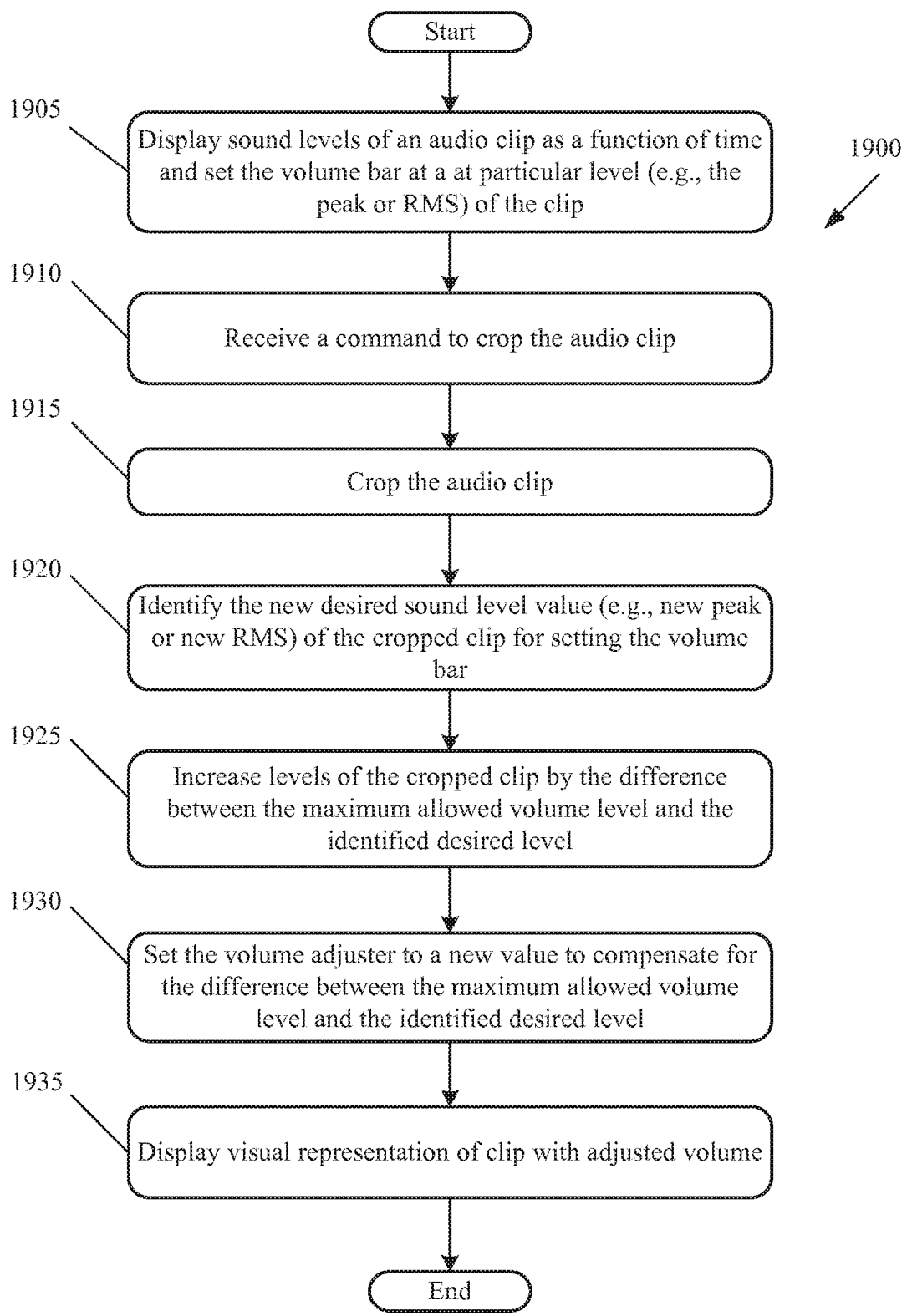
FIG. 19 conceptually illustrates a process for adjusting the volume adjuster line after trimming a portion of the clip in some embodiments.

In some embodiments, when a volume adjuster graph is set and subsequently a portion of the clip is trimmed, the volume adjuster graph for the clip is adjusted accordingly. FIG. 19 conceptually illustrates a process 1900 for adjusting the volume adjuster graph after trimming a portion of the clip in some embodiments of the invention. Process 1900 is described by reference to FIG. 20 which conceptually shows different operations for resetting volume adjuster graphs in some embodiments.

Figure 20:
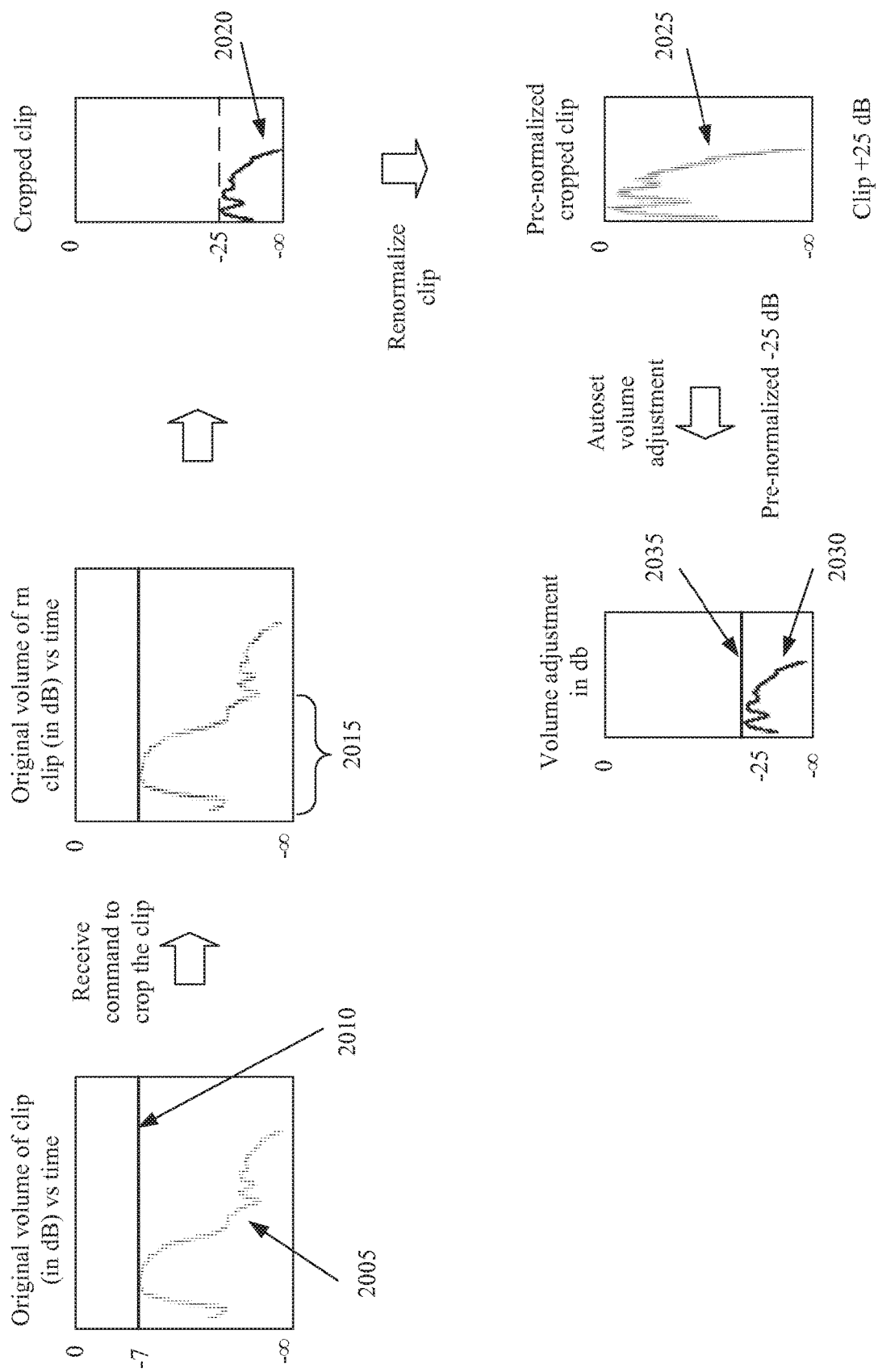
FIG. 20 conceptually illustrates a waveform with the volume adjuster line set at the peak volume in some embodiments.

As shown in FIG. 19, process 1900 displays (at 1905) sound levels of an audio clip as a function of time and sets the volume adjuster graph at a particular level (e.g., at the peak or at the RMS level). In the example of FIG. 20, the volume adjuster graph 2010 is set at the peak of the corresponding waveform 2005.

Next, process 1900 receives (at 1910) a command to crop the audio clip. For instance, some embodiments provide different cropping tools to crop and trip media clips. FIG. 20 shows that a portion 2015 of the waveform 2005 is identified to be cropped. Process 1900 then crops (at 1915) the clip. FIG. 20 shows the cropped portion 2020 of the waveform.

Process 1900 then identifies (at 1920) the new desired sound level value (e.g., new peak or new RMS) of the cropped clip to set the volume adjuster graph. In the example of FIG. 20, the new peak of the cropped waveform 2020 is at −25 dB. Process 1900 then pre-normalizes (at 1925) the cropped clip to the loudest possible level by increasing the sound levels of the cropped clip by the difference between the maximum allowed volume level and the identified desired level for the volume adjuster graph. FIG. 20 shows the resulting pre-normalized waveform 2025.

Process 1900 then sets the volume adjuster to a new value to compensate for the difference between the maximum allowed volume level and the identified desired level for the volume adjuster graph. The process then displays (at 1935) the clip and the adjusted volume adjuster graph. FIG. 20 shows the resulting waveform 2030 and the new volume adjuster graph 2035. As shown, the volume adjuster graph is changed from −7 dB to −25 dB after the audio clip is cropped.

One of ordinary skill in the art will recognize that process 1900 is a conceptual representation of the operations used for resetting the volume adjuster graph. The specific operations of process 1900 may not be performed in the exact order shown and described. For instance, in some embodiments pre-normalization is not done. Instead, when the new desired sound level value for the volume adjuster graph (e.g., the new peak or new RMS) is determined, the volume adjuster graph is set at the identified level. In these embodiments, process 1900 skips operations 1925 and 1930 and instead sets the volume adjuster graph at the new identified sound level. Furthermore, the specific operations of process 1900 may not be performed in one continuous series of operations and different specific operations may be performed in different embodiments. Also, the process could be implemented using several sub-processes, or as part of a larger macro process.

G. Deformable Volume Adjuster Graphs

Some embodiments allow volume adjuster graphs to be split for an audio clip based on one or more selected time ranges. In some of these embodiments, when a portion of an audio clip is selected, a new multi-segment volume adjuster graph (or volume adjuster curve) based on the properties of the selected portion (i.e., peak, RMS, etc.) is displayed. In other embodiments, a multi-segment volume adjuster graph is automatically displayed for an audio clip. Each segment of the volume adjuster graph can have a different geometric shape such as a straight line (e.g., horizontal, vertical, or diagonal lines) or a curved line. In some embodiments, the volume adjuster graph is a continuous graph that includes different curved and/or straight line segments.

Figure 21:
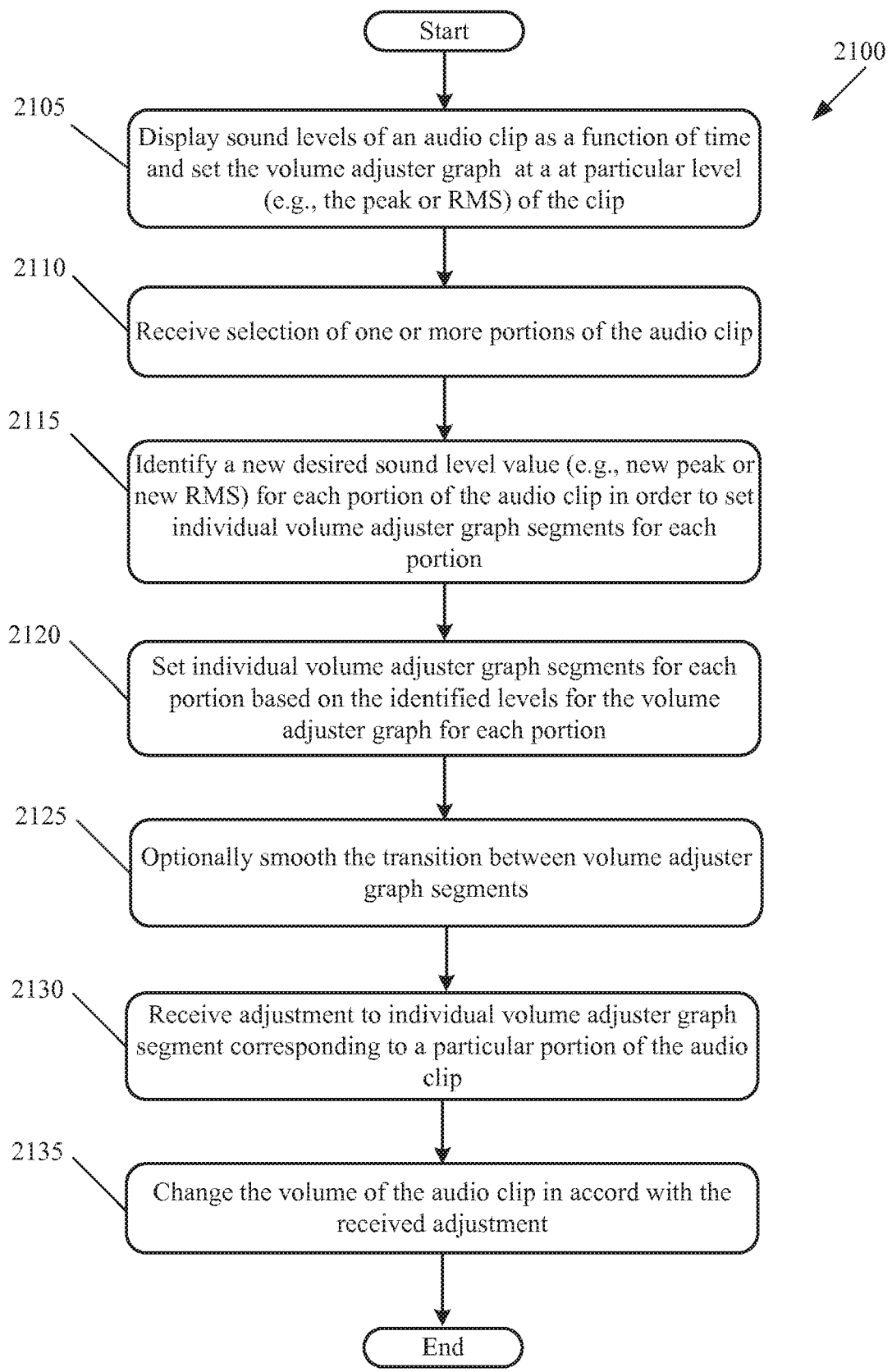
FIG. 21 conceptually illustrates a process for setting and displaying deformable volume adjuster lines in some embodiments of the invention.

FIG. 21 conceptually illustrates a process 2100 for setting and displaying deformable volume adjuster graphs in some embodiments of the invention. Different operations of process 2100 are described by reference to FIGS. 22-29. As shown in FIG. 21, process 2100 displays (at 2105) an audio clip by plotting the volume of the audio clip as a function of time and sets the volume adjuster graph at a particular level (e.g., the peak or RMS) of the clip. Some embodiments, utilize an absolute volume adjustment scale. In these embodiments, each audio waveform is displayed by plotting volumes of the original audio clips as a function of time on absolute scale and the deformable volume adjuster graphs are set based on the intrinsic or absolute volume values of the clip. Other embodiments use a relative volume adjustment scale for displaying deformable volume adjuster graphs. In these embodiments, each audio waveform is displayed by plotting volumes of the original audio clips as a function of time on a relative scale and the deformable volume adjuster graphs are set based on the relative volume values of the clip.

Figure 22:
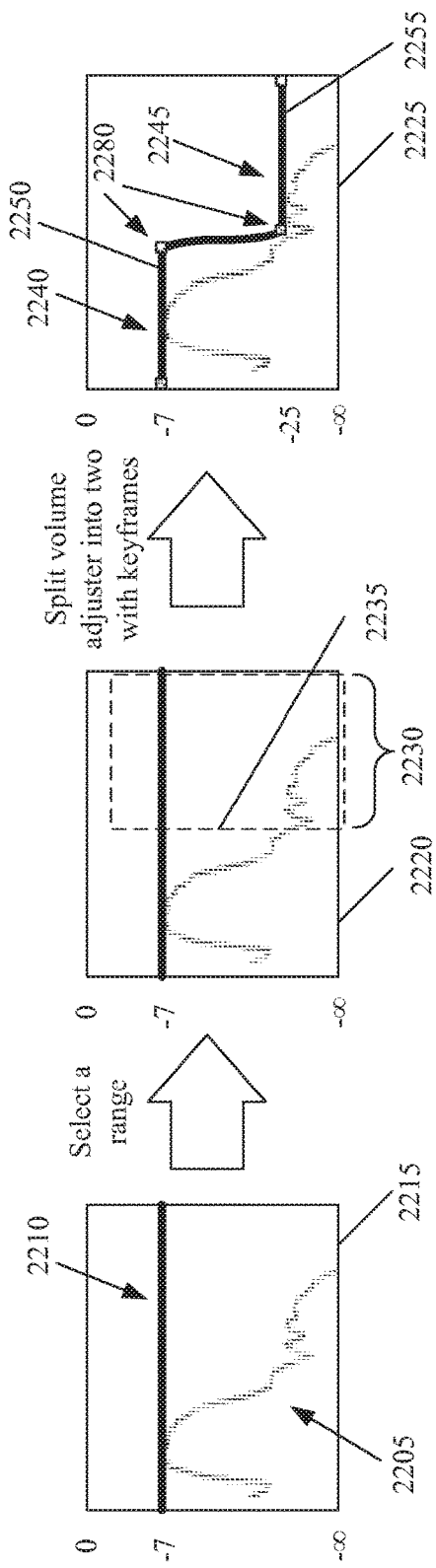
FIG. 22 illustrates a single audio clip with a deformable volume adjustment adjuster line in some embodiments.

FIG. 22 conceptually illustrates a single audio clip 2205 with a single volume adjustment adjuster graph segment 2210 in some embodiments. In this example, the volume adjuster graph is set at the peak of the audio clip. However, the following discussion also applies to other volume adjuster graphs such as volume adjuster graphs set at RMS or loudness levels. The audio clip is shown in three stages 2215-2225. As shown in the first stage 2215, the volume adjuster graph is set at −7 dB.

Next, process 2100 receives (at 2110) a selection of one or more portions of the audio clip. As shown in FIG. 20, in the second stage 2220, a particular range 2230 of the audio clip is selected. This is shown by the dashed rectangle 2235.

Process 2100 then analyzes (at 2115) the selected portion(s) as well as the portions that are not selected and determines the new desired sound level value (e.g., new peak or new RMS) of the each portion to set an individual volume adjuster graph segment for each portion. For instance, in the example of FIG. 22, the volume adjuster graph is placed at the peak of the original audio clip. After a portion of the audio clip is selected, the new peak of each portion is determined. In some embodiments, setting and displaying of deformable volume adjuster graphs is done automatically without requiring receiving of a selection of one or more portions of the audio clip. In these embodiments, operation 2110 is bypassed and operation 2115 is done automatically (e.g., as a part of operation 2105 when a volume adjuster graph is being displayed on an audio clip or after receiving a command to generate a deformable volume adjuster graph). In these embodiments, different portions of the audio clip are automatically identified based on criteria such as average volume level, maximum volume level, loudness, maximum or minimum length of different portions, etc.

Process 2100 then sets (at 2120) individual volume adjuster graph segments for each portion of the audio clip based on the identified level for the portion. In some embodiments, the individual volume adjuster graph segments are automatically set after one or more portions of an audio clip are selected. In other embodiments, process 2100 receives a command through the GUI to deform the volume adjuster graph. Yet in other embodiments, a deformable volume adjuster graph is automatically generated for each audio clip.

As shown in the third stage 2225 in FIG. 22, the volume adjuster graph is divided into two segments 2240 and 2245. Segment 2240 is set at the peak of the portion that was not selected (which in this example is the same as the peak of original clip 2205) and segment 2245 is set at the peak value of the selected portion 2230. In some embodiments, the splitting of the volume adjuster graph is performed by defining two keyframes. A first keyframe 2250 at the peak level of the first portion of the clip and a second keyframe 2255 at the peak level of the second portion of the clip. Using the keyframes allows smooth transition between the volume adjuster graph segments as described below by reference to FIG. 25. In some embodiments, when a portion of an audio graph is selected, the handles 2280 are automatically displayed to allow adjustment and smoothing of the volume adjuster graph segments. In other embodiments, the handles are displayed only after the user adjusts (e.g., by applying a directional input) a selected portion (such as 2235 and 2310 shown in FIGS. 22 and 23) of an audio waveform. Yet in other embodiments, when a user double clicks on any point on the volume adjuster graph, a single handle is displayed on that point.

Figure 23:
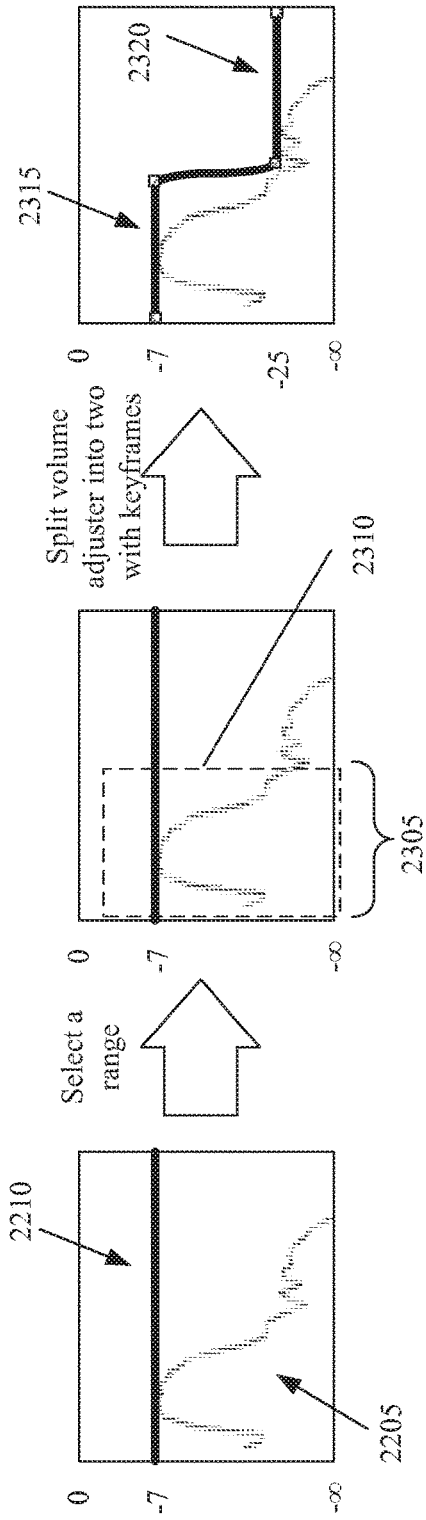
FIG. 23 conceptually illustrates a single audio clip with a deformable volume adjustment adjuster line in some embodiments.

The same volume adjuster graph segments would have been generated if the first portion of the audio (instead of the second portion) was selected. FIG. 23 conceptually illustrates a single audio clip 2205 with a single volume adjuster graph 2210 in some embodiments of the invention. In this figure, the first portion 2305 of the audio clip is selected as shown by the dashed rectangle 2310. As a result, two volume adjuster graph segments 2315 and 2320 are generated. Since the peaks of the two portions are the same as the peaks of the two portions shown in FIG. 22, the volume adjuster graph segments 2315 and 2320 are generated at the same positions as volume adjuster graph segments 2240 and 2245 shown in FIG. 22.

Figure 24:
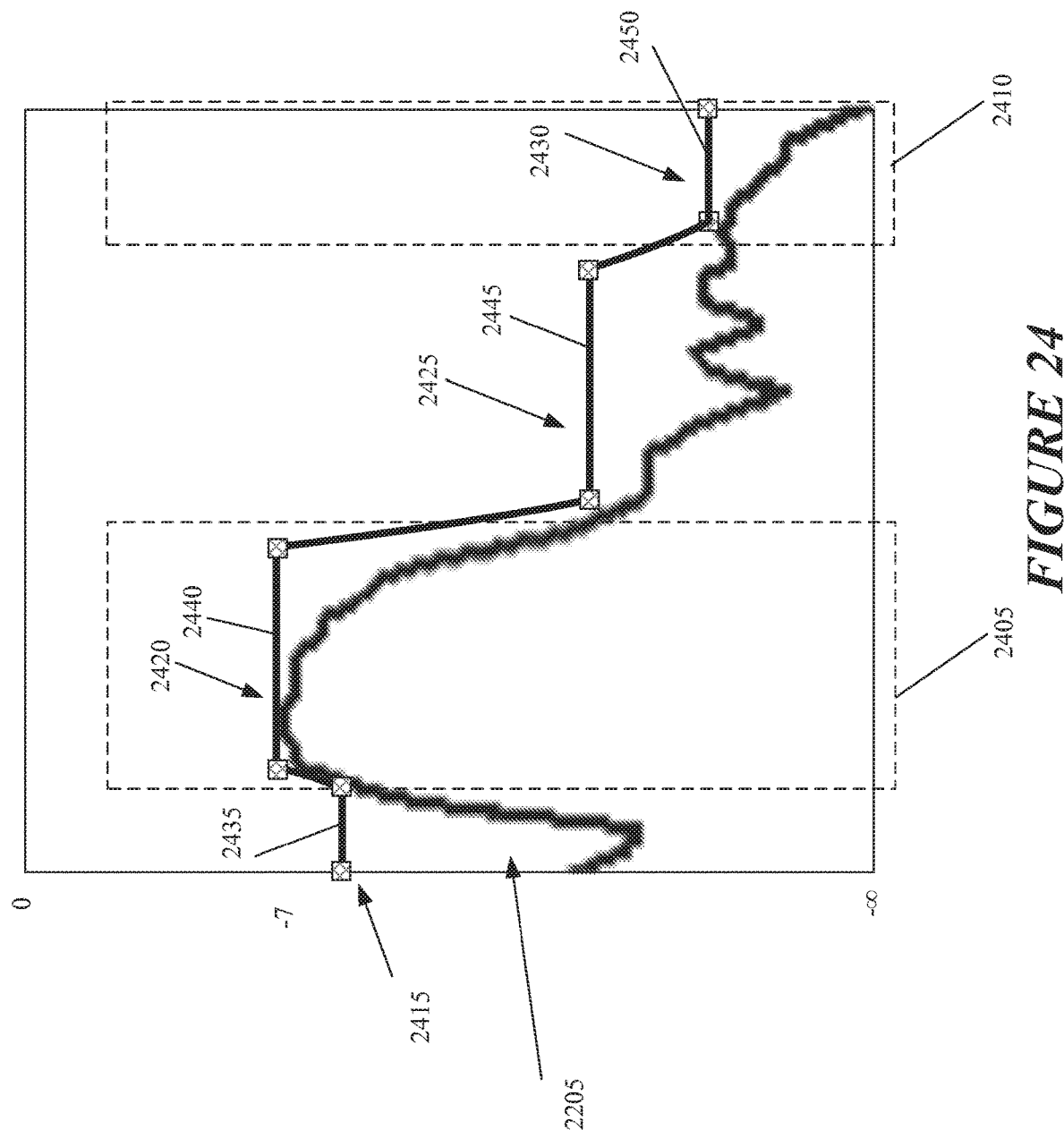
FIG. 24 conceptually illustrates the audio clip of FIG. 22 where two portions of the clip are selected.

Process 2100 is also used to generate more than two volume adjuster graph segments when multiple portions of a clip are selected. FIG. 24 conceptually illustrates the audio clip 2250 of FIG. 22 where two portions of the clip (as shown by dashed rectangles 2405 and 2410) are selected. In some embodiments, these portions can be selected simultaneously and individual volume adjuster graph segments are set for all selected portions simultaneously. In other embodiments, the portions have to be selected one at a time with each selection resulting in one additional individual volume adjuster graph segments to be added.

As shown in FIG. 24, four volume adjuster graph segments 2415-2430 are generated for the clip. In some embodiments, the volume adjuster graph segments are generated by adding four keyframes 2435-2450 at peak levels of different selected portions and remaining portions of the clip. As shown, one of the volume adjuster graph segment 2420 which corresponds to the portion of the clip with the highest peak is at the same level as the volume adjuster graph segment 2210 of the original clip.

Figure 25:
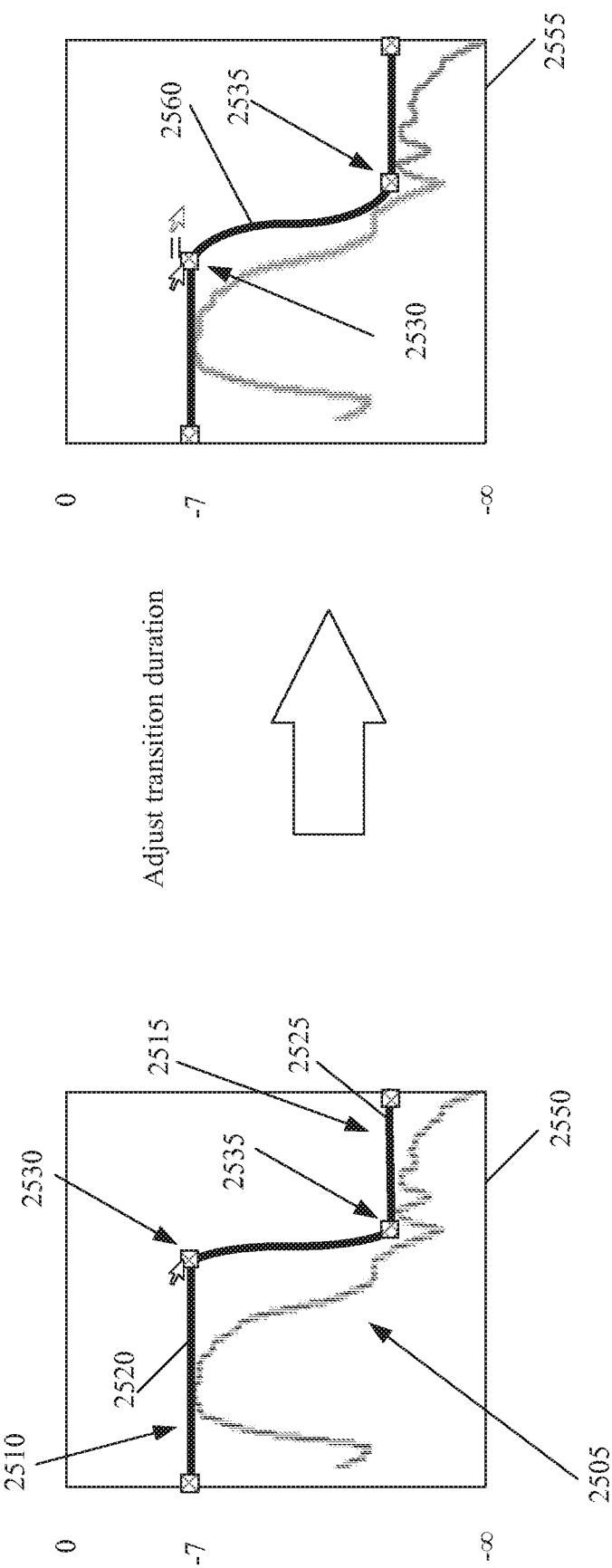
FIG. 25 conceptually illustrates adjusting the transitional portion between two volume adjuster lines in some embodiments.

Next, process 2100 optionally smoothes (at 2125) the transition between the individual volume adjuster graph segments. In some embodiments, the segments are smoothed automatically. Other embodiments provide tools to a user to smooth the segments. FIG. 25 conceptually illustrates adjusting the transition portion in two stages 2550 and 2555 in some embodiments of the invention. As shown in FIG. 25, audio clip 2505 has two volume adjuster graph segments 2510 and 2515. The volume adjuster graph segments are generated by adding two keyframes 2520 and 2525. The handles 2530 and 2535 are selectable and can be moved to left or right in order to create a smooth transitional segment 2560 between the two volume adjuster graph segments 2510 and 2515.

As shown in the first stage 2550, handle 2530 is selected and is moved to the left. Stage two 2555 shows that the transitional segment 2560 between the two volume adjuster graph segments is expanded. Each one of the handles 2530 and 2535 can be selected and moved to left or right in order to increase or decrease the transitional segment 2560 between the two volume adjuster graph segments. In some embodiments, instead of or in addition to the keyframes, a separate control is provided that allows the transitional segment 2540 between the volume adjuster graph segments to be adjusted.

Some embodiments treat the transitional segments such as 2560 as any other segments of the volume adjuster graph. Accordingly, when the segment is moved up or down, the corresponding section of the audio waveform is adjusted the same way as when other segments (e.g., 2510 or 2515) are moved up or down. In other embodiments, when a transitional segment such as segment 2560 is moved, the transitional segment shape stays the same and instead the two points on the two segments 2520 and 2525 that are adjacent to the transitional segment 2560 (i.e., points on the volume adjuster graph corresponding to handles 2530 and 2535) move.

Figure 26:
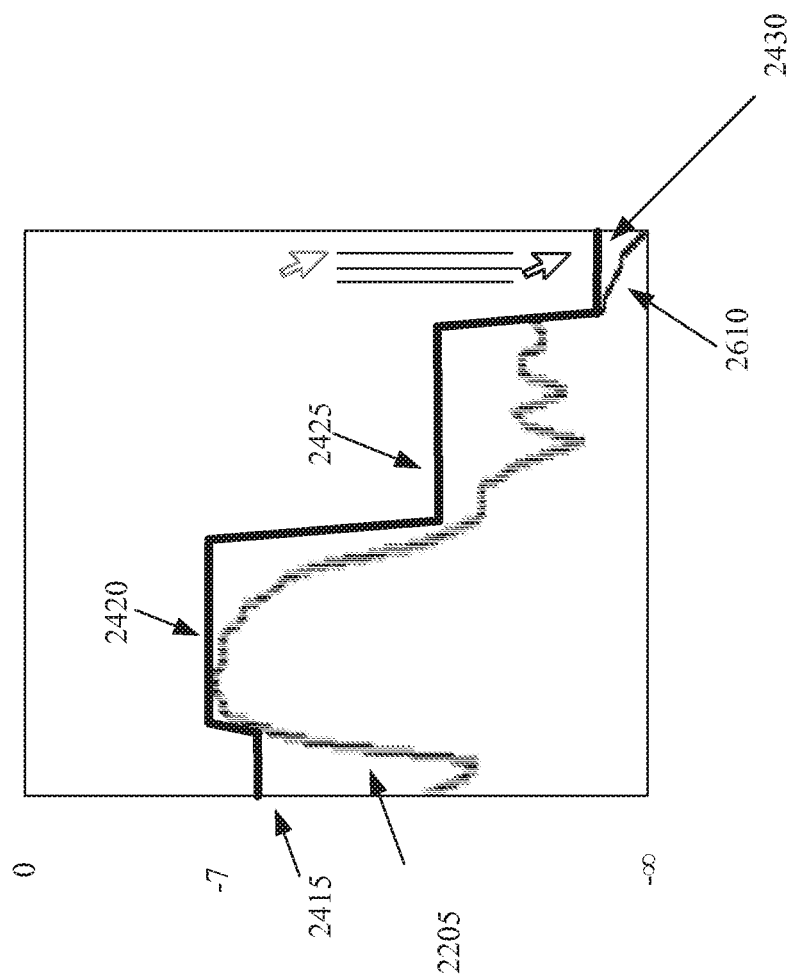
FIG. 26 conceptually illustrates a deformable volume adjuster line where adjusting a portion of the deformable adjuster line does not affect the other portions of the deformable volume adjuster line.

Process 2100 then receives (at 2130) adjustment to individual volume adjuster graph segment corresponding to a particular portion of the audio clip. The process then changes (at 2135) the volume of the audio clip in accord with the received adjustment. When a segment of a deformable volume adjuster graph is changed, different embodiments change the other segments of the deformable volume adjuster graph differently. FIG. 26 conceptually illustrates a deformable volume adjuster graph where adjusting a segment of the deformable adjuster graph does not affect the other segments of the deformable volume adjuster graph.

Specifically, FIG. 26 shows the deformable volume adjuster graph of FIG. 24, where the segment 2430 is moved down after receiving a directional input (such as dragging). As a result, only the segment 2430 of the deformable volume adjuster graph and only the portion 2610 of the audio waveform 2205 is moved down. The other segments 2315-2325 of the deformable volume adjuster graph as welt as the rest of the waveform 2205 are not affected by the movement of the segment 2430.

Figure 27:
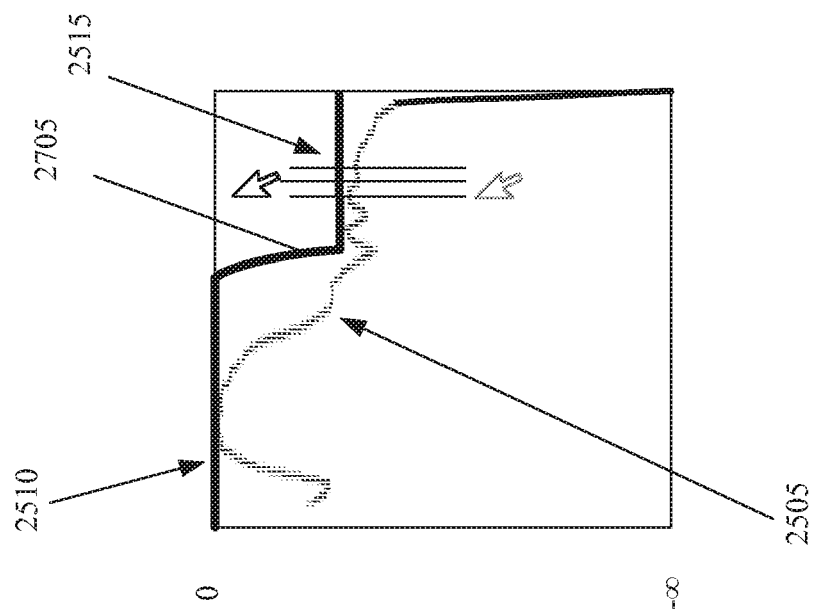
FIG. 27 conceptually illustrates a deformable volume adjuster line where adjusting a portion of the deformable adjuster line affect the other portions of the deformable volume adjuster line.

FIG. 27 conceptually illustrates a deformable volume adjuster graph where adjusting a segment (or a portion) of the deformable volume adjuster graph affects the other segments of the deformable volume adjuster graph. Specifically, FIG. 27 shows the deformable volume adjuster graph of FIG. 25 where the segment 2515 is moved up after receiving a directional input (such as dragging). As shown in FIG. 27, moving segment 2515 results in other segment 2510 of the deformable volume adjuster graph to also move up. However, after segment 2510 reaches a point that the audio waveform 2505 has to be clipped, segment 2510 does not move anymore to prevent the clipping. Any further adjustments to move segment 2515 up result only in segment 2515 (and not 2510) to move up. As a result, the distance between the two segments 2510 and 2515 is reduced and the slope #2705 between the two segments starts to flatten.

In the embodiment shown in FIG. 27 where adjusting one portion of the audio waveform adjusts the other portions, the volume adjuster graph might flatten as the user drags one section that has headroom but where another section approaches a point that causes clipping the audio waveform. In other embodiments, when the first portion of the waveform reaches 0 dB, the volume of no other section of the waveform can raised (similar to what was described by reference to FIG. 14, above). Yet in other embodiments, the volume of the waveform is raised by clipping the waveform at 0 dB until the lowest section of the deformable volume adjuster graph (e.g., 2430) reaches 0 dB (similar to what was described by reference to FIG. 15, above).

Figure 28:
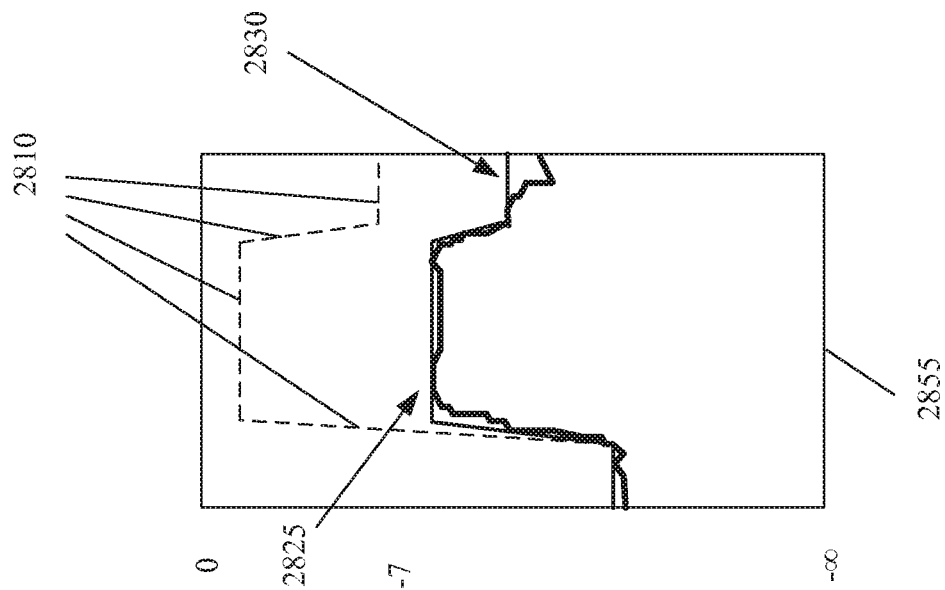
FIG. 28 conceptually illustrates displaying a reference graph that identifies the original volume adjuster graph in some embodiments of the invention after the original volume adjuster graph is modified.
Figure 28:
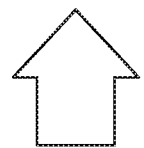
Figure 28:
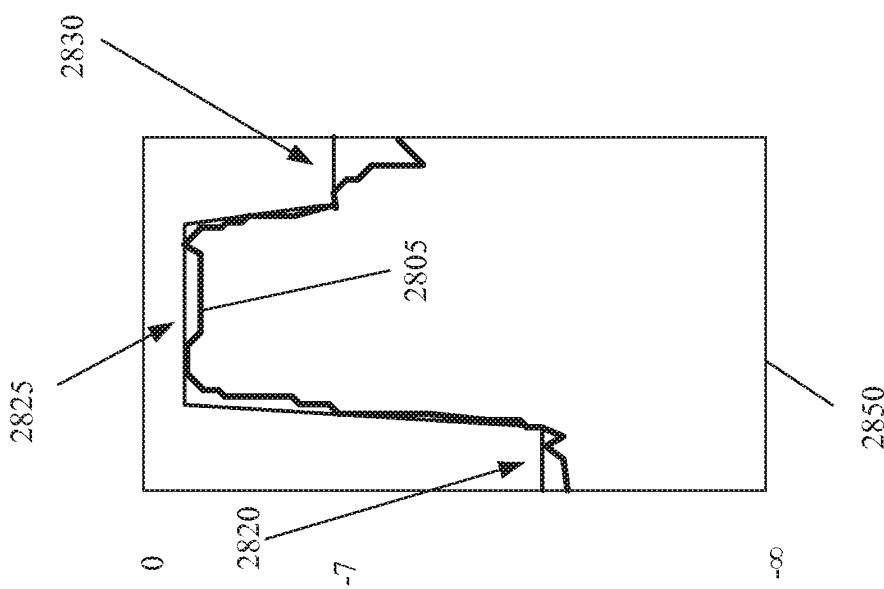

In some embodiments, process 2100 displays a reference graph (or reference curve) to show the original unmodified volume adjuster graph. FIG. 28 conceptually illustrates displaying a reference graph that identifies the original volume adjuster graph in some embodiments of the invention after the original volume adjuster graph is modified. FIG. 28 shows adjusting an audio waveform in two stages 2850 and 2855. As shown in the first stage 2850, an audio waveform 2805 and a deformable volume adjuster graph with three segments 2820-2830 are displayed.

As shown in the second stage 2855, the volume adjuster graph is adjusted by moving segments 2825 and 2830 down. The resulting volume adjuster graph has a different shape than the original volume adjuster graph. However, as shown in the second stage 2855, when the original volume adjuster graph is modified, a reference graph 2810 is displayed which identifies the original unmodified volume adjuster graph. In some embodiments, the reference graph 2810 that identifies the original volume adjuster graph, is displayed with different line pattering (e.g., solid, dashed, dotted, or stippled patterning), different line thickness, or different color as the current (i.e., the modified) volume adjuster graph.

One of ordinary skill in the art will recognize that process 2100 is a conceptual representation of the operations used for providing a deformable volume adjuster graph for an audio clip. The specific operations of process 2100 may not be performed in the exact order shown and described. For instance, operations 2130 and 2135 can be repeated many times to change the volume adjuster graph segments in response to different user inputs. In these embodiments, after performing operation 2135, process 2100 proceeds to 2130 and awaits the next user command. Furthermore, operations 2125 and 2130 can be used to adjust the volume adjuster graph segments for individual portions of a clip as well volume adjuster graphs of different audio clips.

Furthermore, the specific operations of process 2100 may not be performed in one continuous series of operations and different specific operations may be performed in different embodiments. Also, the process could be implemented using several sub-processes, or as part of a larger macro process.

Figure 29:
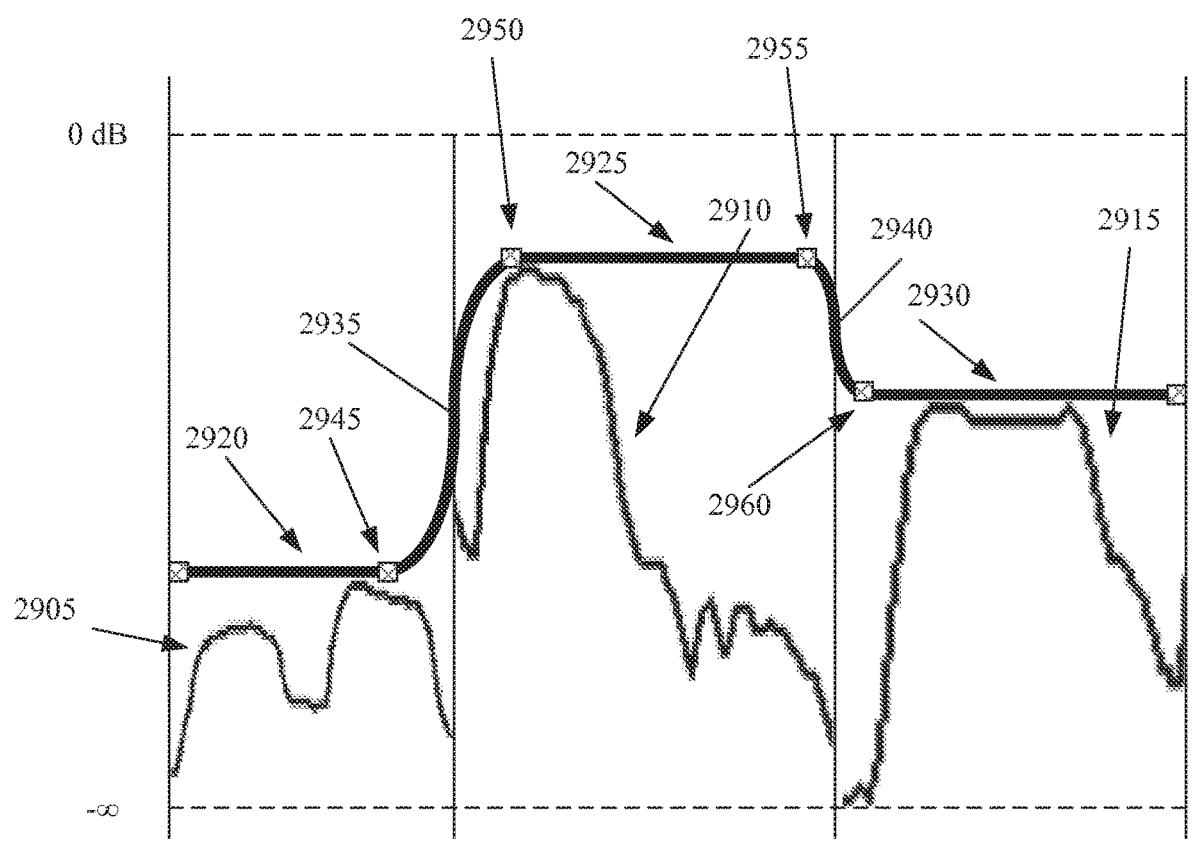
FIG. 29 conceptually illustrates three audio clips with the corresponding volume adjuster lines in some embodiments.

Some embodiments provide a similar smooth transition (as shown in FIG. 25) between separate audio clips. FIG. 29 illustrates three audio clips 2905-2915 with the corresponding volume adjuster graphs 2920-2930 in some embodiments. Using a similar technique for adding keyframes and handles as described by reference to FIG. 25 above, the transitional segments 2935 and 2940 are made smooth. Specifically, handles 2945-2960 are individually selectable. By moving the handles to right or left, the transitions between the volume adjuster graphs 2920-2930 are made smooth.

III. Reference Waveforms

A. Improved Visual Identification of Points on Audio Clips

Figure 30:
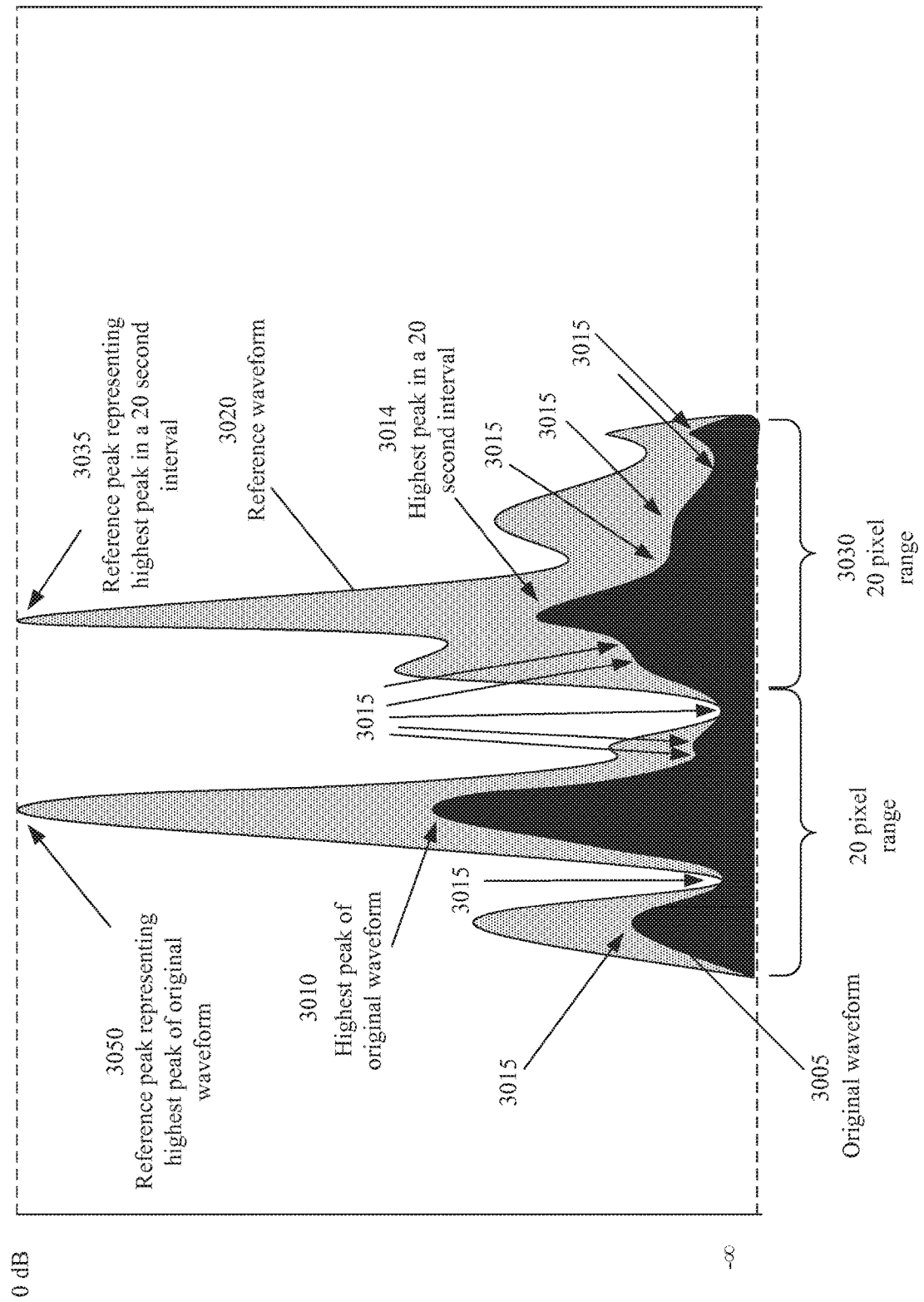
FIG. 30 conceptually illustrates an audio waveform and its corresponding reference waveform in some embodiments.

Some embodiments provide for easy identification of different points such as maximum points and minimum points (or peaks and valleys) of audio clips by displaying reference waveforms with accentuated points that correspond to the points on the audio clip. FIG. 30 conceptually illustrates an audio waveform and its corresponding reference waveform in some embodiments of the invention. As shown, the audio waveform 3005 has a maximum peak 3010 and several local maximum points and minimum points 3014 and 3015. It is often hard to identify the individual maximum points and minimum points of a clip, especially in a portion of the clip that has a lower volume. Each maximum or minimum point on the displayed audio clip corresponds to a point on the audio clip that is displayed with a zero slope.

As shown, a reference waveform 3020 is superimposed over the original waveform 3005 in some embodiments. The reference waveform in some embodiments has the same number of points as the original waveform, except that some of the points on the reference waveform (e.g., some or all or the maximum points and minimum points) are accentuated (i.e., displayed with a higher height or at a higher volume level) compared to the corresponding points on the audio waveform. For instance, in some embodiments the highest peak of the original waveform 3005 in a given period of time (e.g., in a 20 seconds interval) corresponds to a maximum peak on the reference waveform 3020. As shown in FIG. 30, local peak 3014 of the original waveform 3005 is the highest peak in a given interval 3030. The reference waveform 3020 has a maximum peak 3035 which corresponds to the local peak 3014. Some or all other local minimums and maximums of the reference waveform are also accentuated to values more than the corresponding local minimums and maximums of the original waveform but less than the maximum allowable volume level.

Furthermore, in some embodiments, the audio waveform and the corresponding reference waveform are displayed with different highlights to facilitate visual distinction between the two waveforms. For instance, the audio clip in FIG. 30 is highlighted in black and the reference waveform is highlighted in gray. In other embodiments, the waveforms for the audio clip and the reference waveform are displayed in different colors. Yet in other embodiments, the waveforms for the audio clip and the reference waveform are displayed with different line pattering (e.g., solid, dashed, dotted, or stippled patterning) or different line thickness. Although in the following examples the reference waveforms are displayed as being superposed on the original audio waveforms, some embodiments do not superimpose the reference waveform and the corresponding audio waveform. For instance, in some embodiment embodiments, the reference waveform is displayed in lieu of the original waveform or is displayed above or below the original audio waveform.

Figure 31:
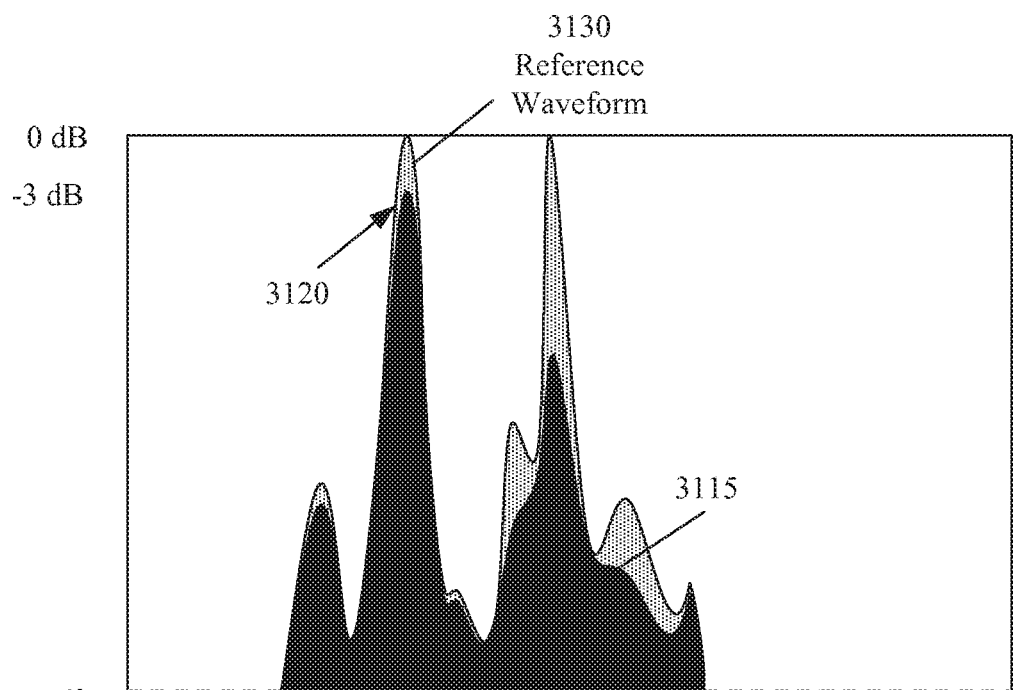
FIG. 31 conceptually illustrates a clip and its associated reference waveform in two stages in some embodiments.
Figure 31:
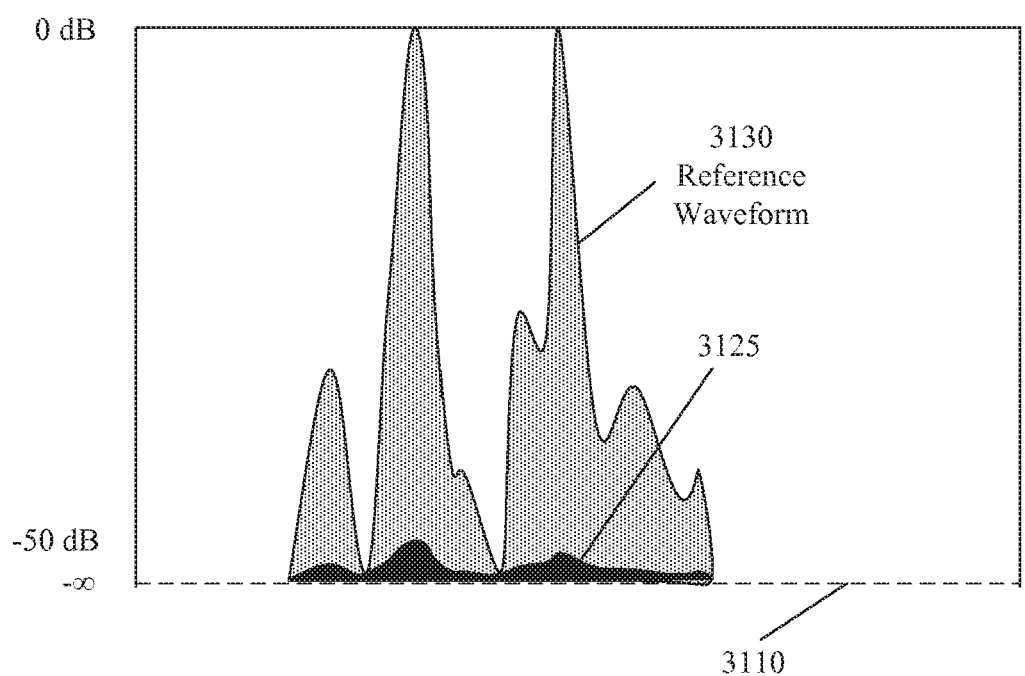

Displaying the reference waveform is particularly useful for portions of the clips that have lower volumes as well as when the whole audio clip has a low volume which makes visually identifying the maximum and minimum points of the waveform difficult. FIG. 31 conceptually illustrates a clip and its associated reference waveform in two stages in some embodiments of the invention. In the first stage 3105, the audio waveform 3115 has a high volume with a maximum peak 3120 of −3 dB. Since the waveform has a high volume, it is easy to identify its maximum and minimum points.

In stage two 3110, the volume of the clip is reduced to set the peak at −50 dB. As shown, although the resulting waveform 3125 has the same contour or outline as the original waveform 3115, it is hard to identify the local maximum and minimum points of the waveform 3125. Superimposing the reference waveform 3130 on the waveforms 3125 provides an easy way of identifying the maximum and minimum points of the waveform 3125. As shown, the reference waveform 3130 is identical for both waveform 3115 and the corresponding low volume waveform 3125 as the waveforms 3115 and 3125 have the same contour.

Figure 32:
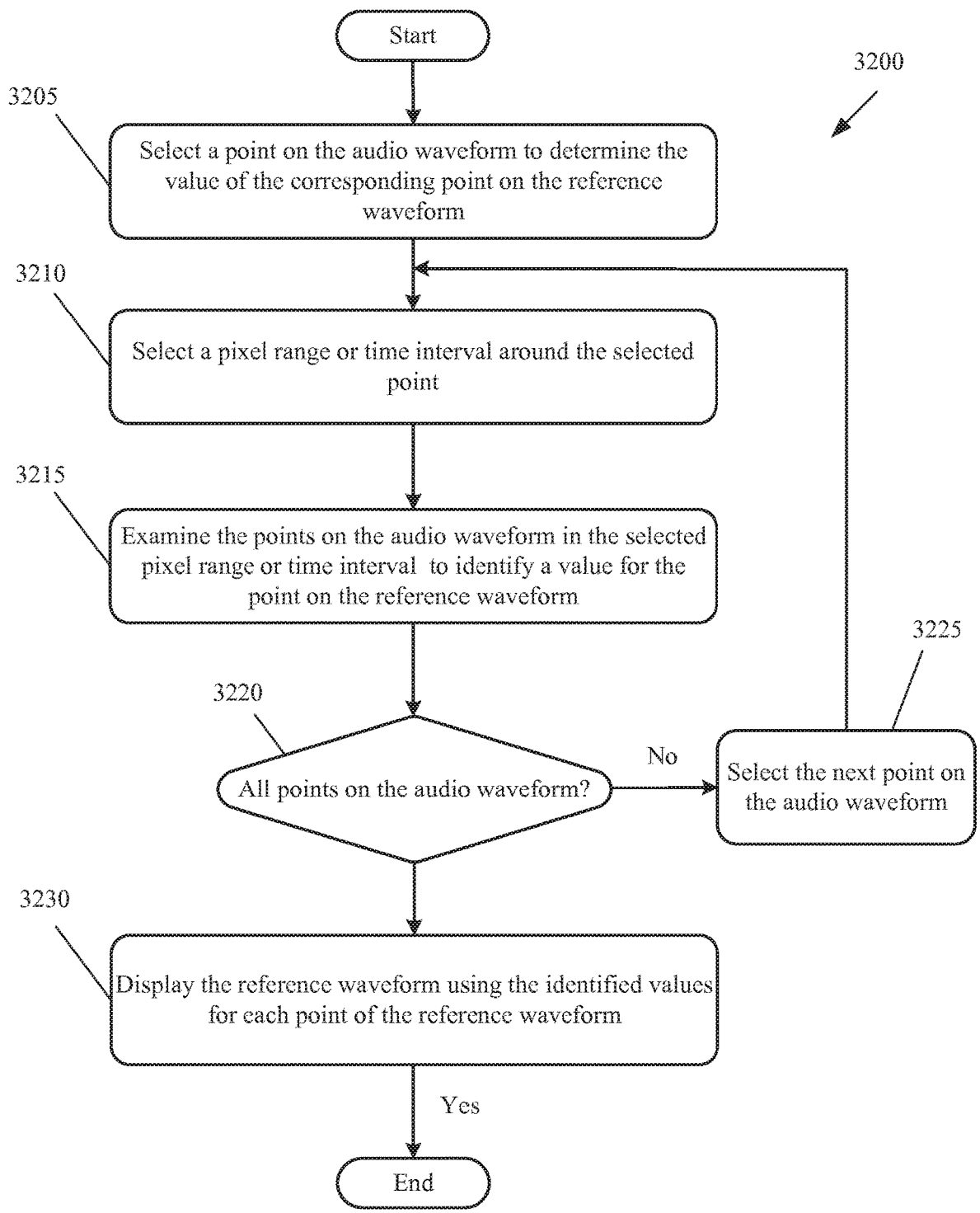
FIG. 32 conceptually illustrates a process for displaying reference waveforms in some embodiments.

FIG. 32 conceptually illustrates a process 3200 for displaying reference waveforms in some embodiments of the invention. As shown, process 3200 selects (at 3205) a point on the audio waveform to determine the value of the corresponding point on the reference waveform. The process then selects (at 3210) a pre-determined pixel range or a time interval around the selected point to examine the volume of the audio waveform. For instance, in FIG. 30 a 20 pixel range 3030 of the clip is selected.

The process then examines (at 3215) the values of the points on the audio waveform in the selected range (or interval) around the current point to identify a value for the corresponding point on the reference waveform. In some embodiments, determination of the values of the points in each interval is done based on the displayed original waveform. In some of these embodiments, the pixel coordinates of the displayed waveform are used to determine the values of the points of the waveform. In some embodiments, the value of the point on the reference waveform is determined based on mathematic formulas that take the maximum and minimum values of the audio waveform in the examined range as well as the value of the current point of the audio waveform being examined. Example formulas for determining the value of the points on the reference waveform are described by reference to FIG. 33, below.

In some embodiments, displaying the reference waveform includes identifying the maximum and minimum points of the audio clip, accentuating these points, and smoothly connecting the points together to display the reference waveform with a similar contour as the audio clip. In other embodiments, additional points on the audio clip (other than the maximum and minimum points) are identified and accentuated to generate their corresponding points on the reference waveform. Yet in other embodiments, not all maximum and minimum points on the audio clip are used to generate the reference waveform. This is especially useful when the audio clip has many local maximum and minimum points and it makes easier to show the reference waveform with fewer maximum and minimum points than the audio clip.

Figure 33:
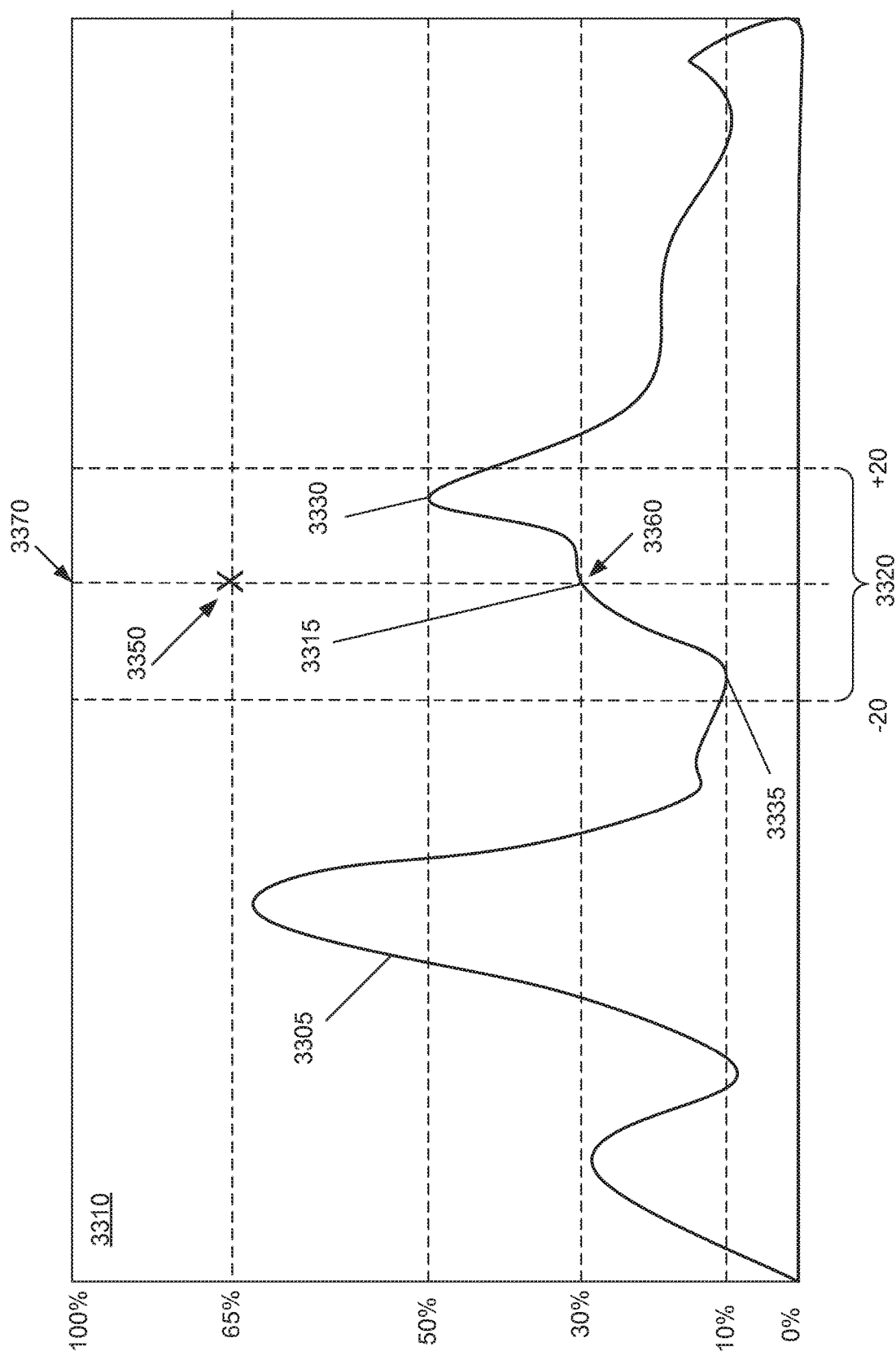
FIG. 33 conceptually illustrates determining the values of different points for reference waveforms in some embodiments of the invention.

Some embodiments determine the values of different points for reference waveforms by examining pre-determined intervals around each point on the audio waveform. FIG. 33 conceptually illustrates determining the values of different points for reference waveforms in some embodiments of the invention. As shown, an audio waveform 3305 is displayed on the display area 3310. An example for determining the value for displaying a point on the reference waveform that corresponds to the point 3315 of the audio waveform 3305 is described below.

The volume levels of the audio waveform 3305 for a pre-determined interval 3320 around the point 3315 are examined. In some embodiments, the interval is pixel range with a certain number of pixels (in this example 20 pixels) on each direction before and after the point 3315. In other embodiments, the interval is a time interval on each direction around the point 3315. In either embodiments (whether the interval is a pixel interval or time interval) different points (i.e., pixels or timeslices) corresponding to the audio waveform 3305 are examined to determine the value of their correspond point on the reference waveform.

For every pixel or timslice, a pre-determined number of the surrounding pixels (20 pixels in the example of FIG. 33) or timeslices are examined and the loudest and quietest volume values in that pixel range or time interval are determined. The current value of the point on the audio waveform is then fitted into that range and the reference level (or the value of the corresponding point on the reference waveform) is determined. Once the value of the corresponding point on the reference waveform is found, the next pixel or timeslice on the audio waveform is examined. This slides the window 3320 to the right by one pixel or one timeslice (i.e. 39 of the values are the same, one falls off the left, and one gets added to the right). The cycle repeats until all points or timeslices are examined and the values of the corresponding points on the reference waveform are determined.

In some embodiments, the following formula is used to determine the volume of the current point on the audio clip with respect to the loudest and quietest points in the range being examined.

Cur-Pt volume ratio=(Value−Min)/(Max−Min)

where "Cur-pt volume ratio" is the ratio (or percentage) of the volume level of the current point with respect to the volume levels of the quietest and loudest points in the range; "Value" is the volume level of the current point on the audio waveform being examined; "Min" is the volume of the quietest point in the range, and "Max" is the volume of the loudest point in the range.

The value of the point on the reference waveform that corresponds to the current point is then determined by the following formula.

Ref-level=((1−Value)*Cur-Pt volume ratio)+Value where "Ref-level" is the value at which the corresponding point on the reference waveform is displayed; "Cur-pt volume ratio" is the ratio (or percentage) of the volume level of the current point calculated above, and "Value" is the volume level of the current point being examined on the audio waveform.

As shown in FIG. 33, the audio waveform is assumed to be displayed between values of 0% to 100% of the maximum allowed value. In the example of FIG. 33, the loudest point 3330 in the range 3320 is at 50% (or 0.5) of the volume range, the quietest point 3335 in the range 3320 is at 10% (or 0.1) of the volume range and the current point 3315 is at 30% (or 0.3) of the volume range. Accordingly, "Cur-pt volume ratio" is calculated as follows using decimal values for percentages):

Cur-pt volume ratio=(0.3−0.1)/(0.5−0.1)=0.2/0.4=0.5

Using this value, the "Ref-level" is calculated as follows:

Ref-level=((1−0.3)*0.5)+0.3=0.65

Accordingly, the point 3350 (identified by an X mark in FIG. 33) on the reference waveform that corresponds to the current point 3315 on the audio waveform is displayed at 0.65 (or 65%) of the volume range. Using the above formulas for Ref-level, if a point is the lowest in its surrounding range, the level of the reference waveform at that point will be equal to the actual waveform value at that point. In this example, if the point 3315 was the lowest (i.e., the quietest) point in the range 3320, "Value" would have been 0.1, "Cur-pt volume ratio" would have been 0.0, and "Ref-level" would have been 0.1. Accordingly, the point on the reference waveform would have been displayed at the actual level 3360 of the current point 3315. Similarly, if a point is the highest in its surrounding range, the level of the reference waveform at that point will be equal to the full scale 1.0 (or 100%) at that point. In this example, if the point 3315 was the loudest point in the range 3320, "Value" would have been 0.5, "Cur-pt percentage" would have been 1.0, and "Ref-level" would have been 1.0. Accordingly, the point on the reference waveform would have been displayed at the maximum allowed value (or 100%) 3370.

Referring back to FIG. 32, process 3200 then determines (at 3220) whether all points on the displayed audio waveform are examined. When all points are not examined, the process selects (at 3225) the next point on the audio waveform in order to determine the value of the corresponding point on the reference waveform. The process then proceeds to 3210 which was described above.

Otherwise, when all point are examined, the process displays (at 3230) the reference waveform with a corresponding number of points as the identified points of the audio clip using the values identified for the points on the reference waveform. In some embodiments the highest peak of the reference waveform in the interval is displayed at the maximum allowed volume level. For instance, in FIG. 30, peaks 3010 and 3014 are the highest peaks in their corresponding intervals. As shown in FIG. 30, the corresponding peaks 3050 and 3035 of these peaks on the reference waveform 3020 are set to maximum allowed volume of 0 dB. Process 3200 also accentuates some or all of the other maximum and minimum points of the selected portion.

One of ordinary skill in the art will recognize that process 3200 is a conceptual representation of the operations used for displaying reference waveforms. The specific operations of process 3200 may not be performed in the exact order shown and described. For instance, instead of displaying (at 3205) the reference waveform for a portion of the original waveform and then performing operations 3225 and 3210 for the next portion of the original waveform, some embodiments save the portion of the reference waveform in a temporary storage until all portions of the reference waveform for the audio clip that is displayed on the GUI are determined. The process then displays all portions of the reference waveform at once. Furthermore, the specific operations of process 3200 may not be performed in one continuous series of operations and different specific operations may be performed in different embodiments. Also, the process could be implemented using several sub-processes, or as part of a larger macro process.

B. Aligning an Audio Clip to a Point on a Timeline

Figure 34:
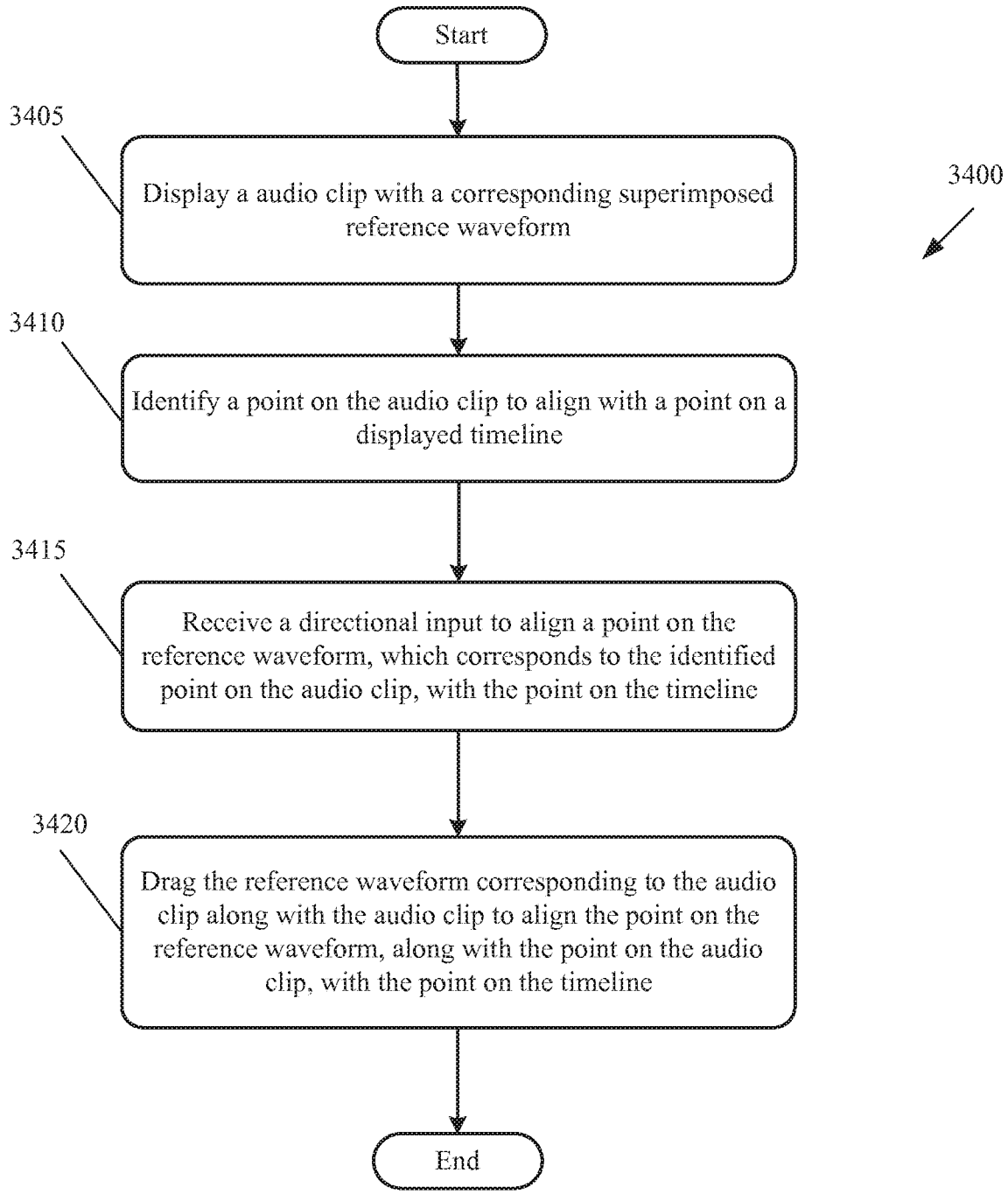
FIG. 34 conceptually illustrates a process for aligning an audio in with a desired point on a display area of some embodiments of the invention.

Using the reference waveforms facilitates aligning a particular point such as a maximum or minimum point of a waveform to a particular time shown on a display area. FIG. 34 conceptually illustrates a process 3400 for aligning a point on an audio clip in with a desired point on a display area of some embodiments of the invention. This process is described by reference to FIGS. 35 and 36 which conceptually illustrate aligning of a waveform to a particular time in some embodiments of the invention.

Figure 35:
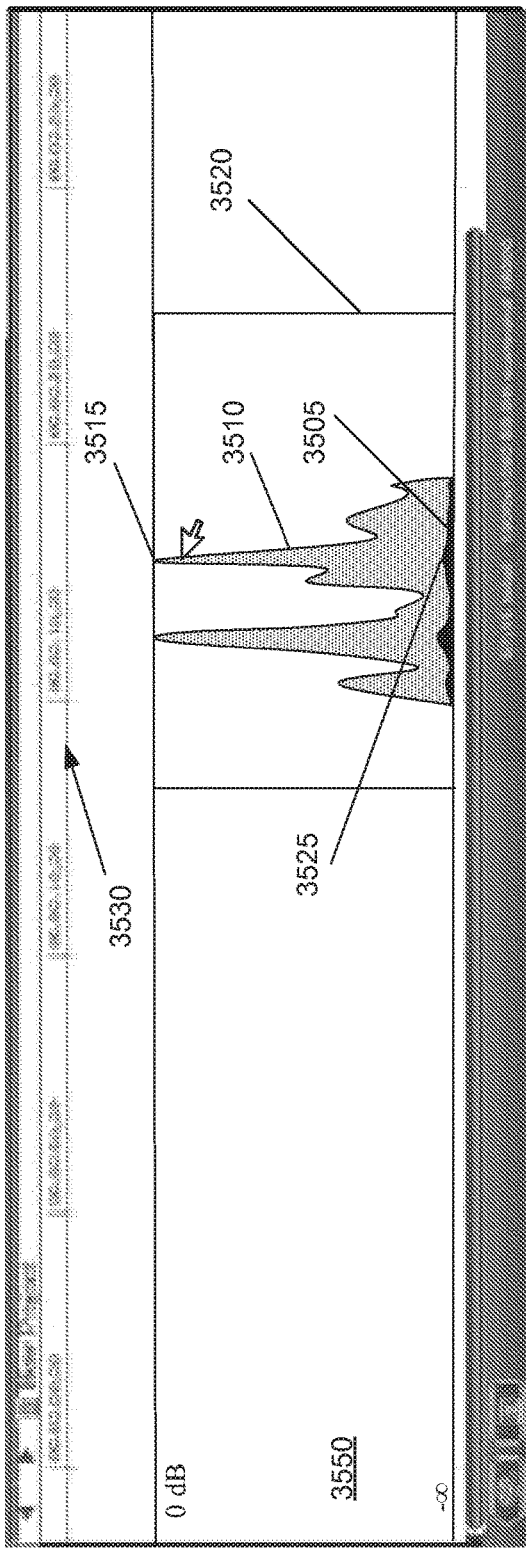
FIGS. 35 and 36 conceptually illustrate aligning of an audio clip to a particular point on a timeline in some embodiments.

As shown in FIG. 34, process 3400 displays (at 3405) an audio clip with a corresponding superimposed reference waveform. FIG. 35 illustrates an audio clip and a corresponding reference waveform. The audio clip in the example of FIG. 35 is a low volume clip and is displayed on the waveform display area 3550 of FIG. 35 as waveform 3505. As shown, it is difficult to visually identify individual maximum and minimum points of the waveform 3505. The corresponding reference waveform 3510, on the other hand, accentuates the maximum and minimum points of the original waveform 3505 and makes it easier to identify these peaks and valleys.

Process 3400 next identifies (at 3410) a point on the audio clip to align with a point on a displayed timeline. For instance, a desired point such as peak 3525 of the waveform 3505 is identified by selecting the corresponding peak 3515 on the reference waveform 3510.

Next, process 3400 receives a directional input to align a point on the reference waveform, which corresponds to the identified point on the audio clip, with the point on the timeline. Process 3420 next drags (at 3420) the reference waveform corresponding to the audio clip along with the audio clip to align the point on the reference waveform (along with the point on the audio clip) with the point on the timeline.

Figure 36:
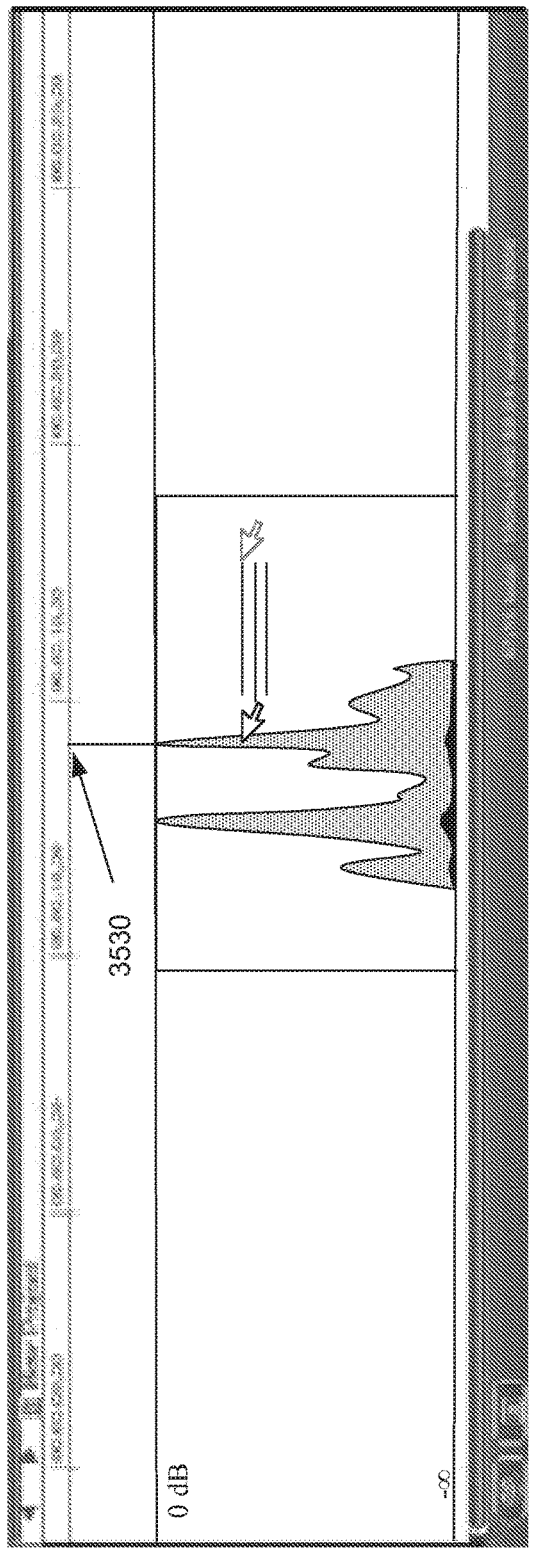

As shown in FIG. 36, the selected peak 3515 of the reference waveform is dragged (e.g., by receiving a directional input from the user) to align the point with a desired displayed time 3530. As shown, the original waveform 3505 is also dragged with the superimposed reference waveform 3510 to the desired position. In some embodiments, any point on the waveform 3510 or any point on or inside the geometric shape (in this example, the rectangle 3520) that represents the audio clip 3505 can be dragged in order to align an identified point on the reference waveform 3510 (and the corresponding point on the audio clip 3505) with a point on the timeline.

One of ordinary skill in the art will recognize that process 3400 is a conceptual representation of the operations used for aligning an audio clip to a point in a display area. The specific operations of process 3400 may not be performed in the exact order shown and described. For instance, instead of identifying a point on the audio clip (at 3410) may be done while any of the operations 3415 and 3420 are being performed. Also, instead of dragging a reference waveform and the associated audio clip on a display area, some embodiments update the display only when the directional input operation is completed (e.g., when a user drags and then releases a cursor or a touch point on the screen). Furthermore, the specific operations of process 3400 may not be performed in one continuous series of operations and different specific operations may be performed in different embodiments. Also, the process could be implemented using several sub-processes, or as part of a larger macro process.

C. Aligning Different Clips with an Audio Clip

Often the users of a media-editing application look for an audio event to line different items up. A user might be looking for the sound of an event to put a video clip at that event. For instance, a user might be looking for an interesting word mentioned in an interview in order to make a cutaway shot to a location on a video clip where the word is mentioned. Using the reference waveforms facilitates aligning different clips with an audio clip or vice versa. For instance, a user might want to align two audio clips by moving one of them, align a video clip and an audio clip by moving one of them, etc.

Figure 37:
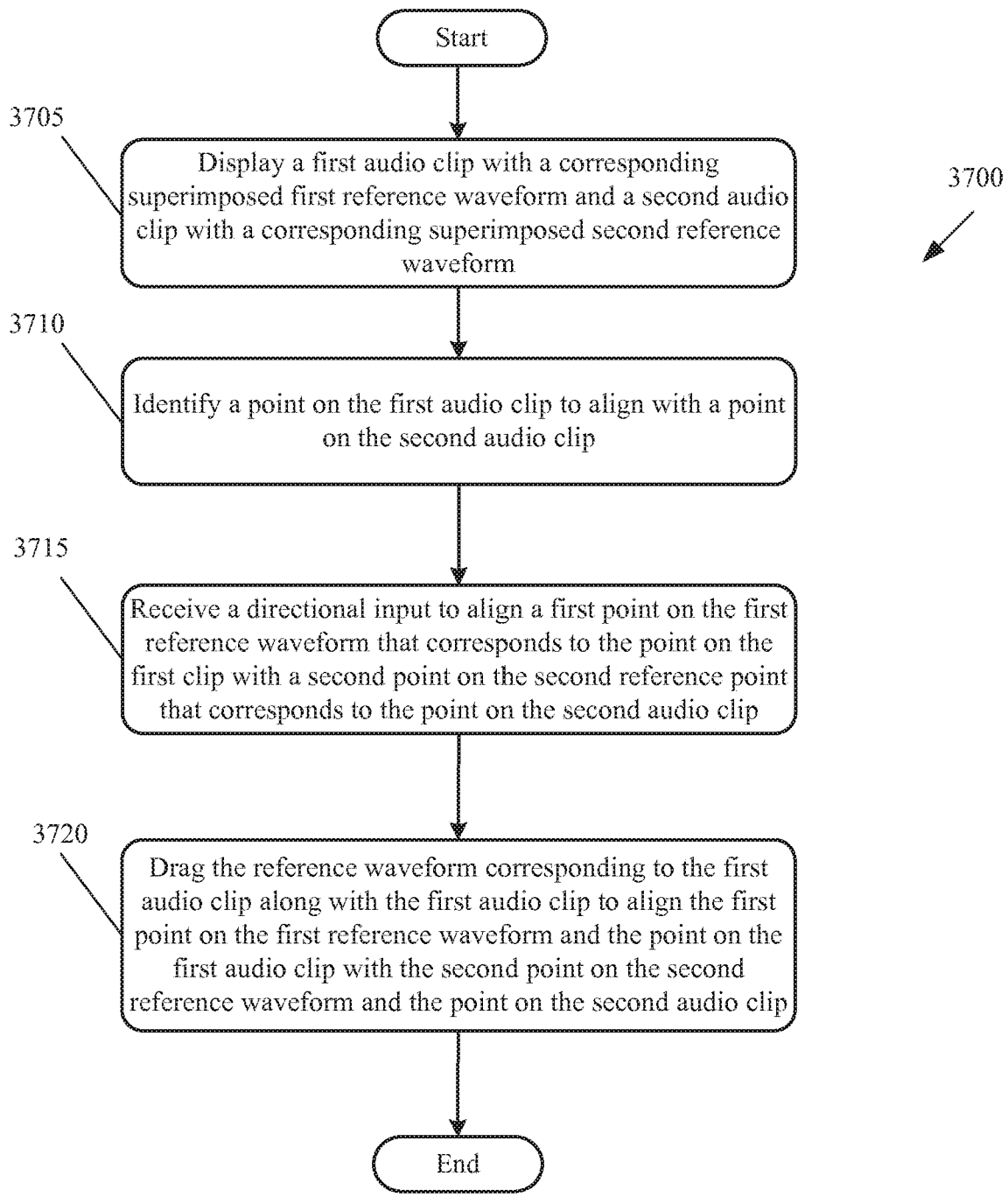
FIG. 37 conceptually illustrates a process for aligning several audio clips in some embodiments of the invention.

FIG. 37 conceptually illustrates a process 3400 for aligning several audio clips in some embodiments of the invention. This process is described by reference to FIGS. 38 and 39 that conceptually illustrate aligning of several waveforms in some embodiments of the invention. As shown in FIG. 37, process 3700 displays (at 3705) a first audio clip with a corresponding superimposed first reference waveform and a second audio clip with a corresponding superimposed second reference waveform. Although the process and the examples are described for aligning several audio clips, a similar process is used in some embodiments to align other displayed items (e.g., a video clip) with an audio clip.

Figure 38:
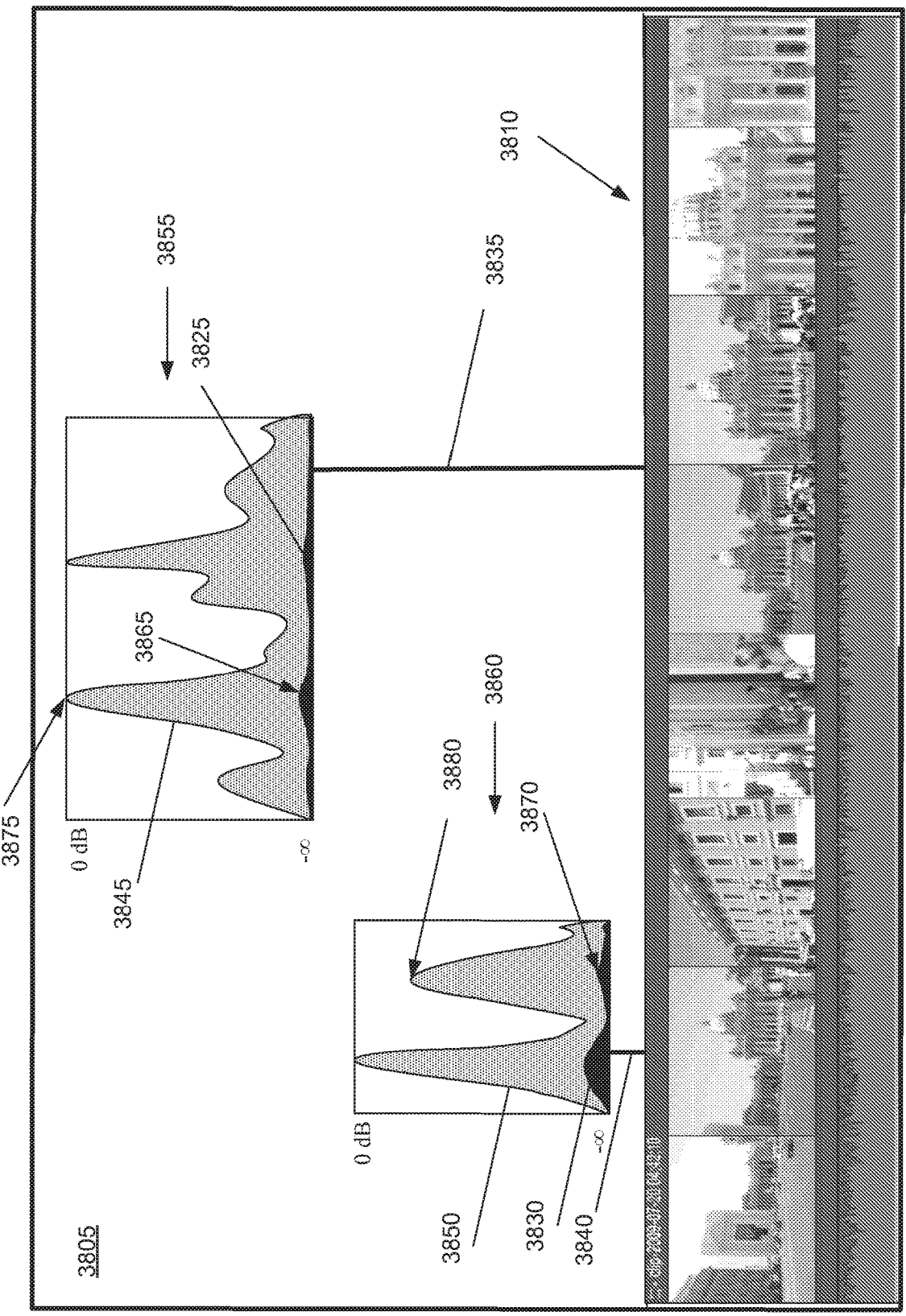
FIGS. 38 and 39 conceptually illustrate aligning of several audio clips in some embodiments of the invention.

FIG. 38 illustrates a waveform display area 3805 that includes a primary lane (also referred to as spine, primary compositing lane, central compositing lane) 3810 and several secondary lanes (also referred to as anchor lanes) 3855-3860. In the example of FIG. 38, the primary lane 3810 includes a primary sequence of media and the two secondary lanes 3855 and 3860 each includes an audio clip with an audio waveform 3825 and 3830 respectively. In some embodiments, the secondary lanes are anchored (as shown by anchors 3835 and 3840) to the primary lane. However, the teachings of the invention apply to embodiments where several lanes run in parallels to each other and are not anchored to each other.

Figure 39:
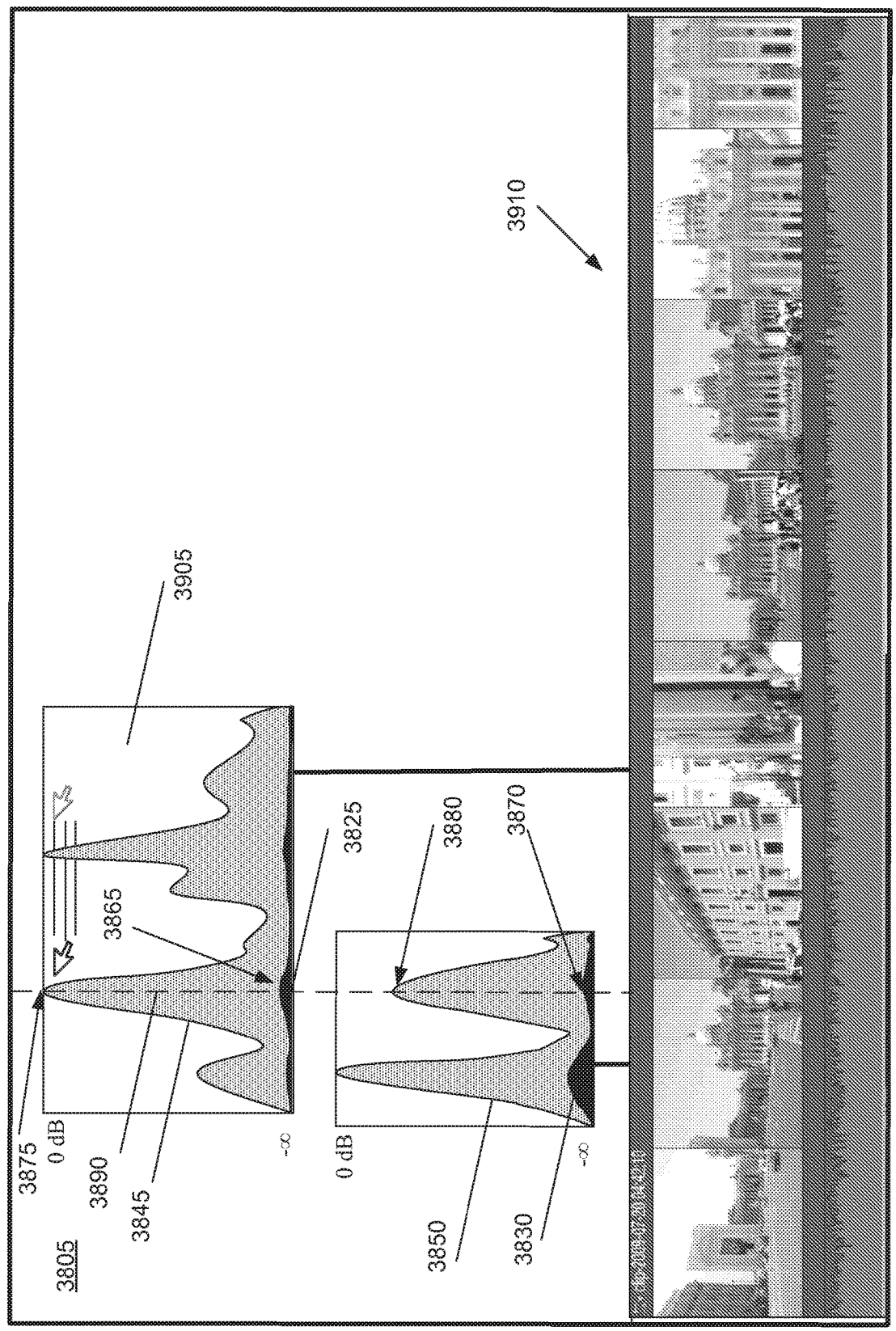

Next, process 3700 identifies (at 3710) a point on the first audio waveform to align with a point on the second audio clip. In the example of FIGS. 38 and 39, a user wants to align the highest peak 3865 of audio waveform 3825 to the second highest peak 3870 of audio waveform 3830. As shown, the audio waveform 3825-3830 do not cover the full range of $-\infty$ to 0 dB and it is hard to visually identify the maximum and minimum points or any particular points on these clips. On the other hand, the reference waveforms 3845 and 3850 that have the same number of maximum and minimum points as audio waveform. 3825 and 3830 respectively include accentuated maximum and minimum points which are easier to visually identify. For instance, the peak 3875 on reference waveform 3845 that corresponds to the highest peak 3865 of audio waveform 3825 is shown at 0 dB an is easy to visually identify. Similarly, the peak 3880 on reference waveform 3850 that corresponds to the second highest peak 3870 of audio waveform 3830 is accentuated and is shown at a much higher volume level and is easier to visually identify than the peak 3870.

Process 3700 then receives a directional input to align a first point on the first reference waveform that corresponds to the point on the first waveform with a second point on the second reference point that corresponds to the point on the second audio waveform. Next, process 3700 drags the reference waveform corresponding to the first audio waveform along with the first audio waveform to align the first point on the first reference waveform and the point on the first audio waveform with the second point on the second reference waveform and the point on the second audio waveform.

As shown in FIG. 39, a user can apply a directional input anywhere on or inside the geometric shape (in this example the rectangle 3905) that represents audio clip (e.g., by selecting and dragging the peak 3875) to move the reference waveform 3845 along with audio waveform 3825 until the highest peak 3875 on the reference waveform 3845 is aligned with the second highest peak 3880 on the reference waveform 3850. Since reference waveforms 3845 and 3850 have corresponding peaks and valleys with audio waveform 3825 and 3830 respectively, aligning the peaks 3875 and 3880 results in aligning the peaks 3865 and 3870 on the audio waveform.

Using this technique, any point on a reference waveform can be aligned with any point on another reference waveform which results in the similar points on the corresponding audio waveform to also be aligned. Similarly, any audio waveform (such as audio clips 3825 and 3830) can be aligned at any point on the primary lane 3810 by dragging the corresponding reference waveform of the audio waveform (which provides better visual identification of maximum and minimum points) to a desired point.

One of ordinary skill in the art will recognize that process 3700 is a conceptual representation of the operations used for aligning several audio clips in a display area. The specific operations of process 3700 may not be performed in the exact order shown and described. For instance, instead of identifying a point on the first audio clip (at 3710) may be done while any of the operations 3715 and 3720 are being performed. Also, instead of dragging a reference waveform and the associated audio clip on a display area, some embodiments update the display only when the directional input operation is completed (e.g., when a user drags and then releases a cursor or a touch point on the screen). Furthermore, the specific operations of process 3700 may not be performed in one continuous series of operations and different specific operations may be performed in different embodiments. Also, the process could be implemented using several sub-processes, or as part of a larger macro process.

IV. Software Architecture

Figure 40:
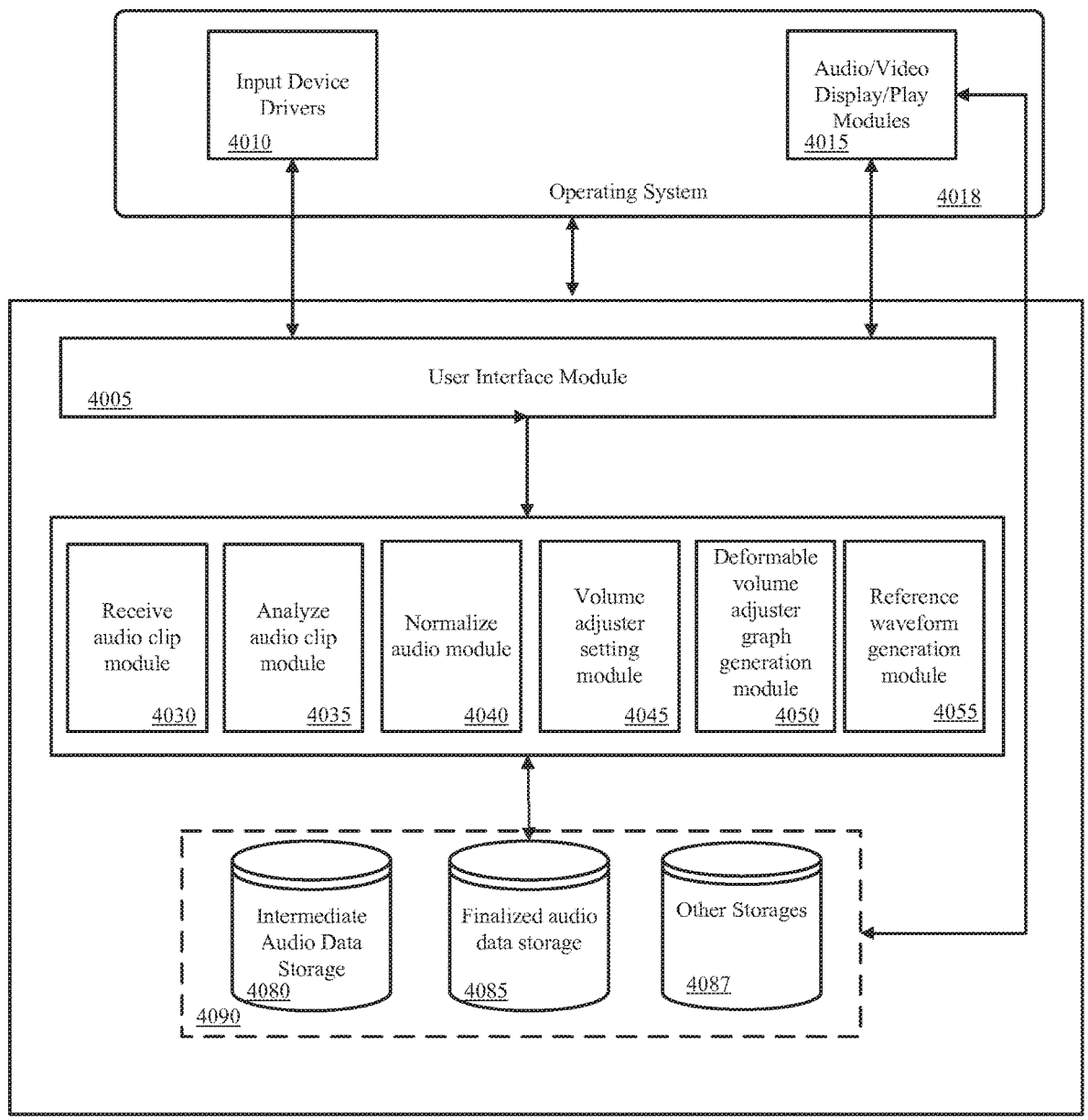
FIG. 40 conceptually illustrates the software architecture for adjusting media clip volumes in a media editing application in some embodiments.

FIG. 40 conceptually illustrates the software architecture 4000 for adjusting media clip volumes and displaying reference waveforms in a media editing application in some embodiments of the invention. As shown, the application includes a user interface module 4005 which interacts with a user through the input device driver(s) 4010 and the audio/video display/play module(s) 4015. The user interface module receives user inputs (e.g., through the GUI 500). The user interface module passes the user inputs to other modules and sends display information to audio/video display/play modules 4015.

FIG. 40 also illustrates an operating system 4018. As shown, in some embodiments the device drivers 4010 and audio/video display/play modules 4015 are part of the operating system 4018 even when the media editing application is an application separate from the operating system. The input device drivers 4010 may include drivers for translating signals from a keyboard, mouse, touchpad, drawing tablet, touchscreen, etc. A user interacts with one or more of these input devices, which send signals to their corresponding device driver. The device driver then translates the signals into user input data that is provided to the user interface module 4005.

The present application describes a graphical user interface that provides users with numerous ways to perform different sets of operations and functionalities. In some embodiments, these operations and functionalities are performed based on different commands that are received from users through different input devices (e.g., keyboard, trackpad, touchpad, mouse, etc.). For example, in some embodiments, the present application uses a cursor in the graphical user interface to control (e.g., select, move) objects in the graphical user interface. However, in some embodiments, objects in the graphical user interface can also be controlled or manipulated through other controls, such as touch control. In some embodiments, touch control is implemented through an input device that can detect the presence and location of touch on a display of the input device. An example of a device with such functionality is a touch screen device (e.g., as incorporated into a smart phone, a tablet computer, etc.). In some embodiments with touch control, a user directly manipulates objects by interacting with the graphical user interface that is displayed on the display of the touch screen device. For instance, a user can select a particular object in the graphical user interface by simply touching that particular object on the display of the touch screen device. As such, when touch control is utilized, a cursor may not even be provided for enabling selection of an object of a graphical user interface in some embodiments. However, when a cursor is provided in a graphical user interface, touch control can be used to control the cursor in some embodiments.

As shown in FIG. 40, the software architecture also includes a module 4030 to receive audio clips, a module 4035 to analyze audio clips, a normalize audio module 4040, a volume adjuster setting module 4045, a deformable volume adjuster graph generation module 4050, and a reference waveform display module 4055. These modules perform one or more of the operations discussed for the process and methods described in different embodiments above.

As shown, different modules of the software architecture utilize different storage 4090 to store project information. The storage includes intermediate audio data storage 4080, finalized audio data storage 4085, as well as other storage 4087.

V. Graphical User Interface

Figure 41:
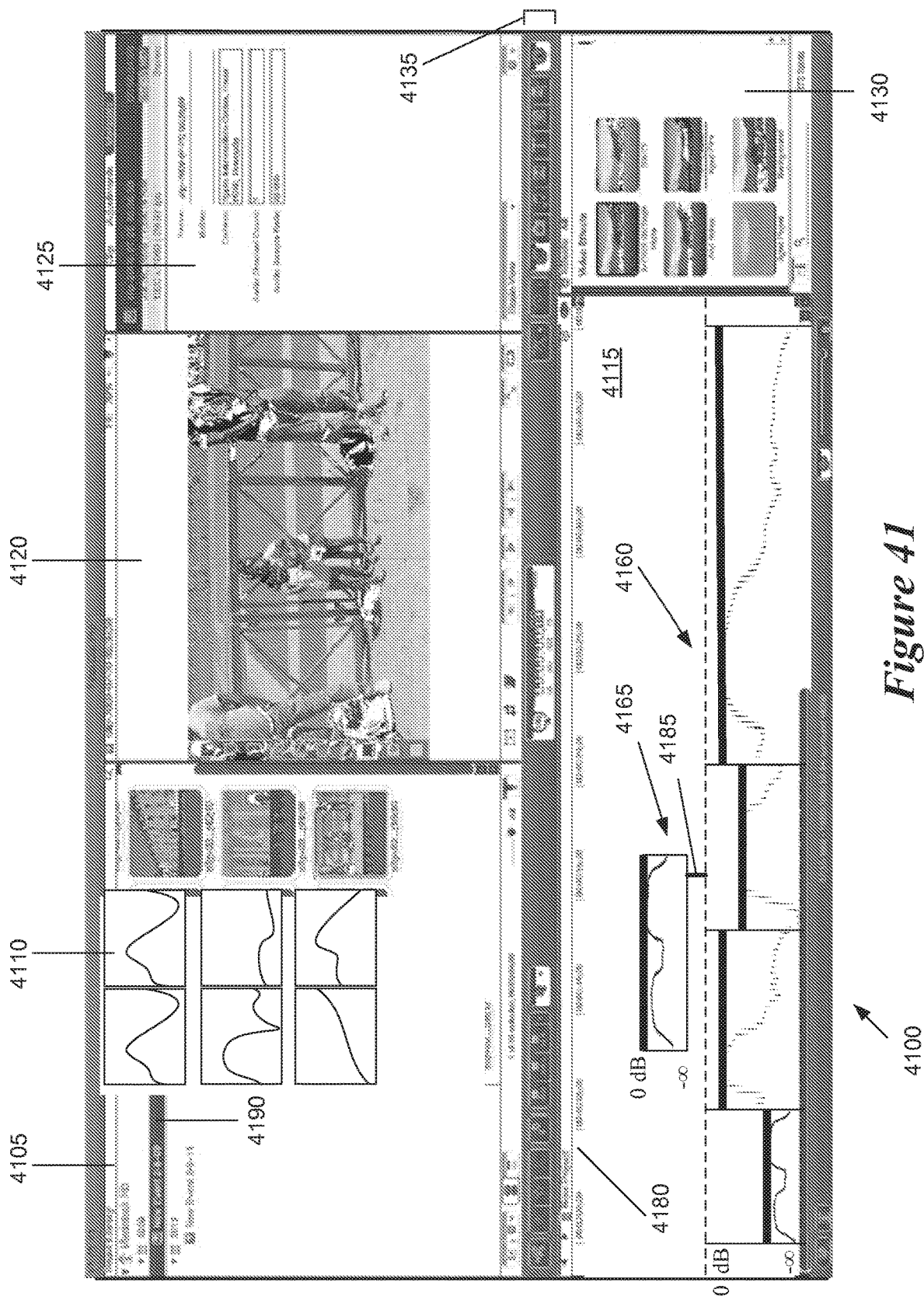
FIG. 41 conceptually illustrates a graphical user interface of a media-editing application of some embodiments.

FIG. 41 illustrates a graphical user interface ("GUI") 4100 of a media-editing application of some embodiments. One of ordinary skill will recognize that the graphical user interface 4100 is only one of many possible GUIs for such a media-editing application. In fact, the GUI 4100 includes several display areas which may be adjusted in size, opened or closed, replaced with other display areas, etc. The GUI 4100 includes a clip library 4105, a clip browser 4110, a composite display area (also referred to in this specification as the waveform display area) 4115, a preview display area 4120, an inspector display area 4125, an additional media display area 4130, and a toolbar 4135.

The clip library 4105 includes a set of folders through which a user accesses media clips (i.e. video clips, audio clips, etc.) that have been imported into the media-editing application. Some embodiments organize the media clips according to the device (e.g., physical storage device such as an internal or external hard drive, virtual storage device such as a hard drive partition, etc.) on which the media represented by the clips are stored. Some embodiments also enable the user to organize the media clips based on the date the media represented by the clips was created (e.g., recorded by a camera).

Within a storage device and/or date, users may group the media clips into "events", or organized folders of media clips. For instance, a user might give the events descriptive names that indicate what media is stored in the event (e.g., the "New Event 2-8-09" event shown in clip library 4105 might be renamed "European Vacation" as a descriptor of the content). In some embodiments, the media files corresponding to these clips are stored in a file storage structure that mirrors the folders shown in the clip library.

Within the clip library, some embodiments enable a user to perform various clip management actions. These clip management actions may include moving clips between events, creating new events, merging two events together, duplicating events (which, in some embodiments, creates a duplicate copy of the media to which the clips in the event correspond), deleting events, etc. In addition, some embodiments allow a user to create sub-folders of an event. These sub-folders may include media clips filtered based on tags (e.g., keyword tags). For instance, in the "New Event 2-8-09" event, all media clips showing children might be tagged by the user with a "kids" keyword, and then these particular media clips could be displayed in a sub-folder of the event that filters clips in this event to only display media clips tagged with the "kids" keyword.

The clip browser 4110 allows the user to view clips from a selected folder (e.g., an event, a sub-folder, etc.) of the clip library 4105. As shown in this example, the highlighted folder "New Event 2-8-09" 4190 is selected in the clip library 4105, and the clips belonging to that folder are displayed in the clip browser 4110. Some embodiments display the clips as thumbnail filmstrips, as shown in this example. By moving a cursor (or a finger on a touchscreen) over one of the thumbnails (e.g., with a mouse, a touchpad, a touchscreen, etc.), the user can skim through the clip. That is, when the user places the cursor at a particular horizontal location within the thumbnail filmstrip, the media-editing application associates that horizontal location with a time in the associated media file, and displays the image from the media file for that time. In addition, the user can command the application to play back the media file in the thumbnail filmstrip.

In addition, the thumbnails for the clips in the browser display an audio waveform underneath the clip that represents the audio of the media file. In some embodiments, as a user skims through or plays back the thumbnail filmstrip, the audio plays as well.

Many of the features of the clip browser are user-modifiable. For instance, in some embodiments, the user can modify one or more of the thumbnail size, the percentage of the thumbnail occupied by the audio waveform, whether audio plays back when the user skims through the media files, etc. In addition, some embodiments enable the user to view the clips in the clip browser in a list view. In this view, the clips are presented as a list (e.g., with clip name, duration, etc.). Some embodiments also display a selected clip from the list in a filmstrip view at the top of the browser so that the user can skim through or playback the selected clip.

The composite display area 4115 provides a visual representation of a composite presentation (or project) being created by the user of the media-editing application. Specifically, it displays one or more geometric shapes that represent one or more media clips that are part of the composite presentation. The composite display area 4115 of some embodiments includes a primary lane (also called a "spine", "primary compositing lane", or "central compositing lane") 4160 as well as one or more secondary lanes (also called "anchor lanes") 4165. The spine represents a primary sequence of media which, in some embodiments, does not have any gaps. The clips in the anchor lanes are anchored (as shown by anchor 4185) to a particular position along the spine (or along a different anchor lane). Anchor lanes may be used for compositing (e.g., removing portions of one video and showing a different video in those portions), B-roll cuts (i.e., cutting away from the primary video to a different video whose clip is in the anchor lane), audio clips, or other composite presentation techniques. In some embodiments, the audio clips displayed in the composite display area 4115 include superimposed reference waveforms as described by reference to FIGS. 30-39, above. In some embodiments, the composite display area 4115 spans a displayed timeline 4180 which displays time (e.g., the elapsed time of clips displayed on the composite display area).

The user can add media clips from the clip browser 4110 into the timeline 4115 in order to add the clip to a presentation represented in the timeline. Within the timeline, the user can perform further edits to the media clips (e.g., move the clips around, split the clips, trim the clips, apply effects to the clips, etc.). The length (i.e., horizontal expanse) of a clip in the timeline is a function of the length of media represented by the clip. As the timeline is broken into increments of time, a media clip occupies a particular length of time in the timeline. As shown, in some embodiments the clips within the timeline are shown as a series of images. The number of images displayed for a clip varies depending on the length of the clip in the timeline, as well as the size of the clips (as the aspect ratio of each image will stay constant).

As with the clips in the clip browser, the user can skim through the timeline or play back the timeline (either a portion of the timeline or the entire timeline). In some embodiments, the playback (or skimming) is not shown in the timeline clips, but rather in the preview display area 4120.

In some embodiments, the preview display area 4120 (also referred to as a "viewer") displays images from video clips that the user is skimming through, playing back, or editing. These images may be from a composite presentation in the timeline 4115 or from a media clip in the clip browser 4110, in this example, the user has been skimming through the beginning of video clip 4140, and therefore an image from the start of this media file is displayed in the preview display area 4120. As shown, some embodiments will display the images as large as possible within the display area while maintaining the aspect ratio of the image.

The inspector display area 4125 displays detailed properties about a selected item and allows a user to modify some or all of these properties. The additional media display area 4130 displays various types of additional media, such as video effects, transitions, still images, titles, audio effects, standard audio clips, etc. In some embodiments, the set of effects is represented by a set of selectable UI items, each selectable UI item representing a particular effect. In some embodiments, each selectable UI item also includes a thumbnail image with the particular effect applied. The display area. 4130 is currently displaying a set of effects for the user to apply to a clip. In this example, several video effects are shown in the display area 4130.

The toolbar 4135 includes various selectable items for editing, modifying, changing what is displayed in one or more display areas, etc. The right side of the toolbar includes various selectable items for modifying what type of media is displayed in the additional media display area 4130. The illustrated toolbar 4135 includes items far video effects, visual transitions between media clips, photos, titles, generators and backgrounds, etc. In addition, the toolbar 4135 includes an inspector selectable item that causes the display of the inspector display area 4125 as well as the display of items for applying a retiming operation to a portion of the timeline, adjusting color, and other functions.

The left side of the toolbar 4135 includes selectable items for media management and editing. Selectable items are provided for adding clips from the clip browser 4110 to the timeline 4115. In some embodiments, different selectable items may be used to add a clip to the end of the spine, add a clip at a selected point in the spine (e.g., at the location of a playhead), add an anchored clip at the selected point, perform various trim operations on the media clips in the timeline, etc. The media management tools of some embodiments allow a user to mark selected clips as favorites, among other options.

In some embodiments, the toolbar includes a selection tool (e.g., a selection or radio button) to show or hide volume adjuster graphs as described by reference to FIGS. 17 and 18, above. In some embodiments, the toolbar includes tools for cropping an audio clip as described by reference to FIGS. 19 and 20, above. The toolbar, in some embodiments, also includes tools for selecting portions of an audio clip as described by reference to FIGS. 21-29, above. In some of these embodiments, the toolbar also includes a selection tool (e.g., a selection button or a radio button) to generate a deformable volume adjuster graph after different portions of an audio clip are selected. In other embodiments, the deformable volume adjuster graph is automatically generated when one or more portions of an audio clip are selected. In some of these embodiments, the toolbar also includes a selection tool (e.g., a selection button or a radio button) to generate reference waveforms as described by reference to FIGS. 30-32, above.

One or ordinary skill will also recognize that the set of display areas shown in the GUI 4100 is one of many possible configurations for the GUI of some embodiments. For instance, in some embodiments, the presence or absence of many of the display areas can be toggled through the GUI (e.g., the inspector display area 4125, additional media display area 4130, and clip library 4105). In addition, some embodiments allow the user to modify the size of the various display areas within the UI. For instance, when the display area 4130 is removed, the timeline 4115 can increase in size to include that area. Similarly, the preview display area 4120 increases in size when the inspector display area 4125 is removed.

VI. Electronic System

Many of the above-described features and applications are implemented as software processes that are specified as a set of instructions recorded on a computer readable storage medium (also referred to as computer readable medium, machine readable medium, machine readable storage). When these instructions are executed by one or more computational or processing unit(s) (e.g., one or more processors, cores of processors, or other processing units), they cause the processing unit(s) to perform the actions indicated in the instructions. Examples of computer readable media include, but are not limited to, CD-ROMs, flash drives, random access memory (RAM) chips, hard drives, erasable programmable read only memories (EPROMs), electrically erasable programmable read-only memories (EEPROMs), etc. The computer readable media does not include carrier waves and electronic signals passing wirelessly or over wired connections.

In this specification, the term "software" is meant to include firmware residing in read-only memory or applications stored in magnetic storage which can be read into memory for processing by a processor. Also, in some embodiments, multiple software inventions can be implemented as sub-parts of a larger program while remaining distinct software inventions. In some embodiments, multiple software inventions can also be implemented as separate programs. Finally, any combination of separate programs that together implement a software invention described here is within the scope of the invention. In some embodiments, the software programs, when installed to operate on one or more electronic systems, define one or more specific machine implementations that execute and perform the operations of the software programs.

Figure 42:
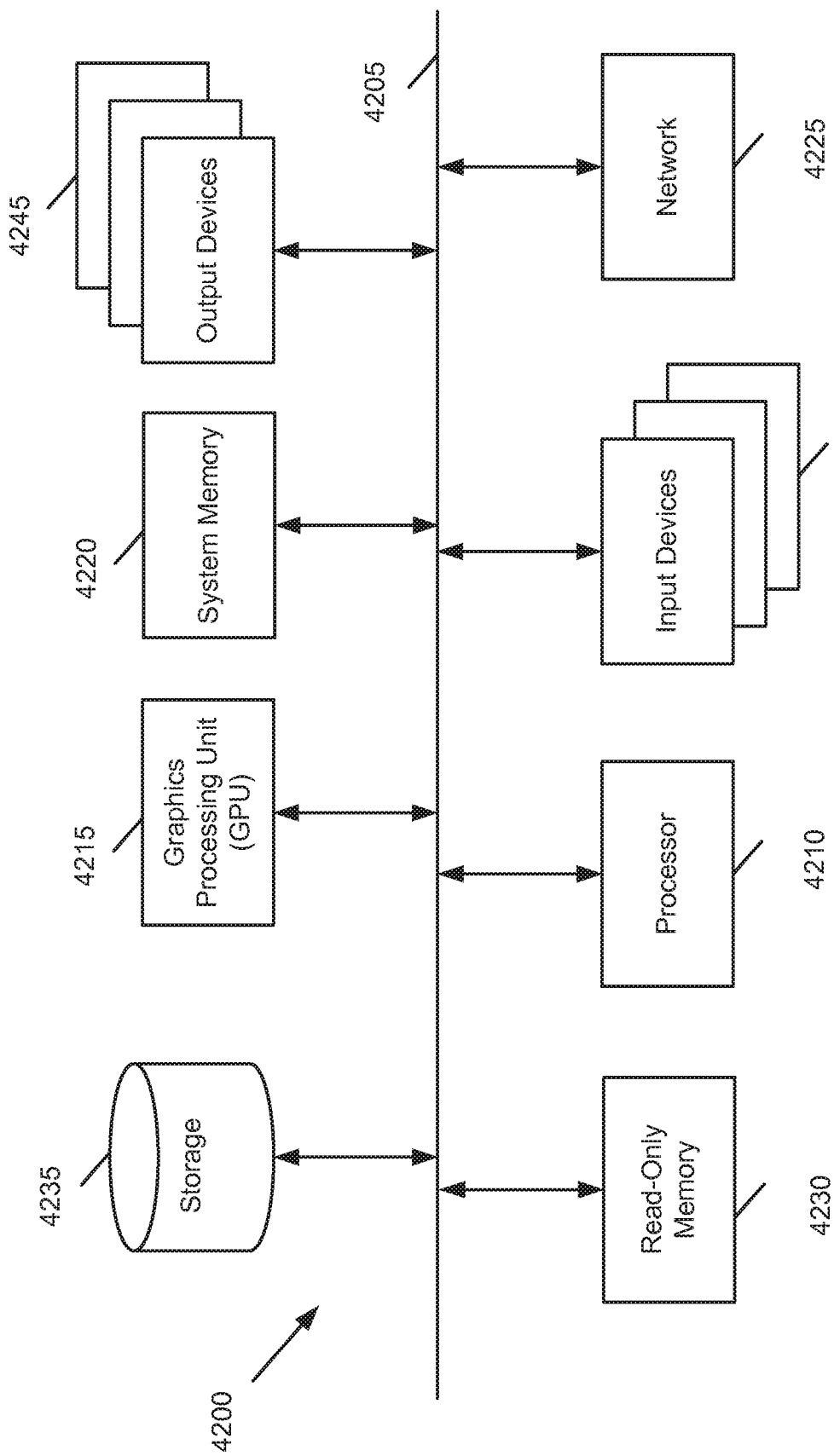
FIG. 42 conceptually illustrates an electronic system with which some embodiments of the invention are implemented.

FIG. 42 conceptually illustrates an electronic system 4200 with which some embodiments of the invention are implemented. The electronic system 4200 may be a computer (e.g., a desktop computer, personal computer, tablet computer, etc.), phone, PDA, or any other sort of electronic or computing device. Such an electronic system includes various types of computer readable media and interfaces for various other types of computer readable media. Electronic system 4200 includes a bus 4205, processing unit(s) 4210, a graphics processing unit (GPU) 4215, a system memory 4220, a network 4225, a read-only memory 4230, a permanent storage device 4235, input devices 4240, and output devices 4245.

The bus 4205 collectively represents all system, peripheral, and chipset buses that communicatively connect the numerous internal devices of the electronic system 4200. For instance, the bus 4205 communicatively connects the processing unit(s) 4210 with the read-only memory 4230, the GPU 4215, the system memory 4220, and the permanent storage device 4235.

From these various memory units, the processing unit(s) 4210 retrieves instructions to execute and data to process in order to execute the processes of the invention. The processing unit(s) may be a single processor or a multi-core processor in different embodiments. Some instructions are passed to and executed by the GPU 4215. The GPU 4215 can offload various computations or complement the image processing provided by the processing unit(s) 4210. In some embodiments, such functionality can be provided using CoreImage's kernel shading language.

The read-only-memory (ROM) 4230 stores static data and instructions that are needed by the processing unit(s) 4210 and other modules of the electronic system. The permanent storage device 4235, on the other hand, is a read-and-write memory device. This device is a non-volatile memory unit that stores instructions and data even when the electronic system 4200 is off. Some embodiments of the invention use a mass-storage device (such as a magnetic or optical disk and its corresponding disk drive) as the permanent storage device 4235.

Other embodiments use a removable storage device (such as a floppy disk, flash memory device, etc., and its corresponding disk drive) as the permanent storage device. Like the permanent storage device 4235, the system memory 4220 is a read-and-write memory device. However, unlike storage device 4235, the system memory 4220 is a volatile read-and-write memory, such a random access memory. The system memory 4220 stores some of the instructions and data that the processor needs at runtime. In some embodiments, the invention's processes are stored in the system memory 4220, the permanent storage device 4235, and/or the read-only memory 4230. For example, the various memory units include instructions for processing multimedia clips in accordance with some embodiments. From these various memory units, the processing unit(s) 4210 retrieves instructions to execute and data to process in order to execute processes of some embodiments.

The bus 4205 also connects to the input and output devices 4240 and 4245. The input devices 4240 enable the user to communicate information and select commands to the electronic system. The input devices 4240 include alphanumeric keyboards and pointing devices (also called "cursor control devices"), cameras (e.g., webcams), microphones or similar devices for receiving voice commands, etc. The output devices 4245 display images generated by the electronic system or otherwise output data. The output devices 4245 include printers and display devices, such as cathode ray tubes (CRT) or liquid crystal displays (LCD), as well as speakers or similar audio output devices. Some embodiments include devices such as a touchscreen that function as both input and output devices.

Finally, as shown in FIG. 42, bus 4205 also couples electronic system 4200 to a network 4225 through a network adapter this manner, the computer can be a part of a network of computers (such as a local area network ("LAN"), a wide area network ("WAN"), or an Intranet, or a network of networks, such as the Internet. Any or all components of electronic system 4200 may be used in conjunction with the invention.

Some embodiments include electronic components, such as microprocessors, storage and memory that store computer program instructions in a machine-readable or computer-readable medium (alternatively referred to as computer-readable storage media, machine-readable media, or machine-readable storage media). Some examples of such computer-readable media include RAM, ROM, read-only compact discs (CD-ROM), recordable compact discs (CD-R), rewritable compact discs (CD-RW), read-only digital versatile discs (e.g., DVD-ROM, dual-layer DVD-ROM), a variety of recordable/rewritable DVDs (e.g., DVD-RAM, DVD-RW, DVD+RW, etc.), flash memory (e.g., SD cards, mini-SD cards, micro-SD cards, magnetic and/or solid state hard drives, read-only and recordable Blu-Ray discs, ultra density optical discs, any other optical or magnetic media, and floppy disks. The computer-readable media may store a computer program that is executable by at least one processing unit and includes sets of instructions for performing various operations. Examples of computer programs or computer code include machine code, such as is produced by a compiler, and files including higher-level code that are executed by a computer, an electronic component, or a microprocessor using an interpreter.

While the above discussion primarily refers to microprocessor or multi-core processors that execute software, some embodiments are performed by one or more integrated circuits, such as application specific integrated circuits (ASICs) or field programmable gate arrays (FPGAs). In some embodiments, such integrated circuits execute instructions that are stored on the circuit itself. In addition, some embodiments execute software stored in programmable logic devices (PLDs), ROM, or RAM devices.

As used in this specification and any claims of this application, the terms "computer", "server", "processor", and "memory" all refer to electronic or other technological devices. These terms exclude people or groups of people. For the purposes of the specification, the terms display or displaying means displaying on an electronic device. As used in this specification and any claims of this application, the terms "computer readable medium," "computer readable media," and "machine readable medium" are entirely restricted to tangible, physical objects that store information in a form that is readable by a computer. These terms exclude any wireless signals, wired download signals, clad any other ephemeral signals.

While the invention has been described with reference to numerous specific details, one of ordinary skill in the art will recognize that the invention can be embodied in other specific forms without departing from the spirit of the invention. In addition, a number of the figures (including FIGS. 8, 12, 16, 19, 21, 32, 34, and 37) conceptually illustrate processes. The specific operations of these processes may not be performed in the exact order shown and described. The specific operations may not be performed in one continuous series of operations, and different specific operations may be performed in different embodiments. Furthermore, the process could be implemented using several sub-processes, or as part of a larger macro process. Thus, one of ordinary skill in the art would understand that the invention is not to be limited by the foregoing illustrative details, but rather is to be defined by the appended claims.

While the invention has been described with reference to numerous specific details, one of ordinary skill in the art will recognize that the invention can be embodied in other specific forms without departing from the spirit of the invention. Thus, one of ordinary skill in the art would understand that the invention is not to be limited by the foregoing illustrative details, but rather is to be defined by the appended claims.

What is claimed is:

1. A method comprising:
displaying, on an electronic display, sound levels of an audio clip as a function of time in a graphical user interface (GUI);
displaying a volume adjuster graph having at least a first adjustable segment for adjusting an audio property of the audio clip, the first adjustable segment being displayed at a particular sound level;
receiving a command to crop the audio clip;
cropping the audio clip according to the command to create a cropped audio clip;
identifying a desired sound level of audio content of the cropped audio clip; and
setting, on the electronic display, the first adjustable segment of the volume adjuster graph to a second sound level based on the desired sound level.

2. The method as recited in claim 1, wherein the particular sound level is based on a first intrinsic sound level of the audio clip.

3. The method as recited in claim 2, wherein the first intrinsic sound level of the audio clip is based on a root mean square (RMS) value of sound levels of the audio clip.

4. The method as recited in claim 2, wherein the first intrinsic sound level the audio clip is based on a calculated loudness of the audio clip.

5. The method as recited in claim 1, further comprising, prior to setting the first adjustable segment of the volume adjuster graph to the second sound level:
pre-normalizing the cropped audio clip to a loudest possible sound level by increasing sound levels of portions of the cropped audio clip by a difference between a maximum allowed sound level and the desired sound level of the audio content of the cropped audio clip.

6. The method as recited in claim 1, further comprising:
receiving a selection of one or more sections of the cropped audio clip, the one or more selections identifying particular ranges of the cropped audio clip;
identifying one or more desired sound levels for audio content of each of the particular ranges of the cropped audio clip; and
setting, on the electronic display, one or more adjustable segments of the volume adjuster graph to corresponding sound levels based on the one or more desired sound levels.

7. The method as recited in claim 6, wherein the one or more adjustable segments of the volume adjuster graph are automatically displayed after the selection of the one or more sections of the cropped audio clip is received.

8. The method as recited in claim 6, wherein the one or more adjustable segments of the volume adjuster graph are automatically displayed after a command for displaying the one or more sections of the cropped audio clip is received through the GUI.

9. A system comprising:
one or more processors; and
a non-transitory computer-readable medium comprising a set of instructions that, when executed by the one or more processors, causes:
displaying, on an electronic display, sound levels of an audio clip as a function of time in a graphical user interface (GUI);
displaying a volume adjuster graph having at least a first adjustable segment for adjusting an audio property of the audio clip, the first adjustable segment being displayed at a particular sound level;
receiving a command to crop the audio clip;
cropping the audio clip according to the command to create a cropped audio clip;
identifying a desired sound level of audio content of the cropped audio clip; and
setting, on the electronic display, the first adjustable segment of the volume adjuster graph to a second sound level based on the desired sound level.

10. The system as recited in claim 9, wherein the particular sound level is based on a first intrinsic sound level of the audio clip.

11. The system as recited in claim 10, wherein the first intrinsic sound level of the audio clip is based on a root mean square (RMS) value of sound levels of the audio clip.

12. The system as recited in claim 10, wherein the first intrinsic sound level the audio clip is based on a calculated loudness of the audio clip.

13. The system as recited in claim 9, wherein the set of instructions further causes, prior to setting the first adjustable segment of the volume adjuster graph to the second sound level:
pre-normalizing the cropped audio clip to a loudest possible sound level by increasing sound levels of portions of the cropped audio clip by a difference between a maximum allowed sound level and the desired sound level of the audio content of the cropped audio clip.

14. The system as recited in claim 9, wherein the set of instructions further causes:
receiving a selection of one or more sections of the cropped audio clip, the one or more selections identifying particular ranges of the cropped audio clip;
identifying one or more desired sound levels for audio content of each of the particular ranges of the cropped audio clip; and
setting, on the electronic display, one or more adjustable segments of the volume adjuster graph to corresponding sound levels based on the one or more desired sound levels.

15. The system as recited in claim 14, wherein the one or more adjustable segments of the volume adjuster graph are automatically displayed after the selection of the one or more sections of the cropped audio clip is received.

16. The system as recited in claim 14, wherein the one or more adjustable segments of the volume adjuster graph are automatically displayed after a command for displaying the one or more sections of the cropped audio clip is received through the GUI.

17. A non-transitory computer-readable medium comprising a set of instructions that, when executed by one or more processors, causes:
displaying, on an electronic display, sound levels of an audio clip as a function of time in a graphical user interface (GUI);
displaying a volume adjuster graph having at least a first adjustable segment for adjusting an audio property of the audio clip, the first adjustable segment being displayed at a particular sound level;
receiving a command to crop the audio clip;
cropping the audio clip according to the command to create a cropped audio clip;
identifying a desired sound level of audio content of the cropped audio clip; and
setting, on the electronic display, the first adjustable segment of the volume adjuster graph to a second sound level based on the desired sound level.

18. The non-transitory computer-readable medium as recited in claim 17, wherein the set of instructions further causes:

receiving a selection of one or more sections of the cropped audio clip, the one or more selections identifying particular ranges of the cropped audio clip;

identifying one or more desired sound levels for audio content of each of the particular ranges of the cropped audio clip; and setting, on the electronic display, one or more adjustable segments of the volume adjuster graph to corresponding sound levels based on the one or more desired sound levels.

19. The non-transitory computer-readable medium as recited in claim 17, wherein the set of instructions further causes, prior to setting the first adjustable segment of the volume adjuster graph to the second sound level:

pre-normalizing the cropped audio clip to a loudest possible sound level by increasing sound levels of portions of the cropped audio clip by a difference between a maximum allowed sound level and the desired sound level of the audio content of the cropped audio clip.

20. The non-transitory computer-readable medium as recited in claim 17, wherein the particular sound level is based on a first intrinsic sound level of the audio clip.

\* \* \* \* \*